(12) United States Patent
Kariyazaki et al.

(10) Patent No.: US 10,159,144 B2
(45) Date of Patent: Dec. 18, 2018

(54) SEMICONDUCTOR DEVICE

(71) Applicant: Renesas Electronics Corporation, Tokyo (JP)

(72) Inventors: Shuuichi Kariyazaki, Tokyo (JP); Wataru Shiroi, Tokyo (JP); Kenichi Kuboyama, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/549,107

(22) PCT Filed: Aug. 20, 2015

(86) PCT No.: PCT/JP2015/073444
§ 371 (c)(1),
(2) Date: Aug. 4, 2017

(87) PCT Pub. No.: WO2017/029767
PCT Pub. Date: Feb. 23, 2017

(65) Prior Publication Data
US 2018/0098420 A1 Apr. 5, 2018

(51) Int. Cl.
*H05K 7/00* (2006.01)
*H05K 1/02* (2006.01)
(Continued)

(52) U.S. Cl.
CPC ........... *H05K 1/0248* (2013.01); *H01L 23/32* (2013.01); *H01L 25/04* (2013.01); *H01L 25/18* (2013.01);
(Continued)

(58) Field of Classification Search
CPC ... H05K 1/11; H05K 1/16; H05K 1/18; H05K 1/181; H05K 1/182; H05K 1/183; H05K 1/186; H05K 7/02; H05K 2201/09218
(Continued)

(56) References Cited

U.S. PATENT DOCUMENTS 9,099,999 B1 *  8/2015  Wang .................... H03K 17/00
2004/0090757 A1  5/2004  Murata
2015/0060127 A1  3/2015  Terui et al.

FOREIGN PATENT DOCUMENTS

JP   2004-165200 A   6/2004
JP   2010-212296 A   9/2010
JP   2015-050314 A   3/2015

OTHER PUBLICATIONS

International Search Report (ISR) (PCT Form PCT/ISA/210), in PCT/JP2015/073444, dated Nov. 10, 2015.
(Continued)

*Primary Examiner* — Binh Tran
(74) *Attorney, Agent, or Firm* — McGinn IP Law Group, PLLC.

(57) ABSTRACT

A semiconductor device according to an embodiment has a first semiconductor component and a second semiconductor component which are electrically connected with each other via an interposer. The interposer has a plurality of first signal wiring paths, and a plurality of second signal wiring paths each having a path distance smaller than each of the plurality of first signal wiring paths. Furthermore, the first semiconductor component includes a first electrode, a second electrode, and a third electrode arranged in order in a first direction. Furthermore, the second semiconductor component includes a fourth electrode, a fifth electrode, and a sixth electrode arranged in order in the first direction. Furthermore, the first electrode is connected with the fourth electrode via the first signal wiring path, the second electrode is connected with the fifth electrode via the first signal wiring path, and the third electrode is connected with the sixth electrode via the first signal wiring path.

18 Claims, 25 Drawing Sheets

(51) Int. Cl.
  *H01L 23/32* (2006.01)
  *H01L 25/04* (2014.01)
  *H01L 25/18* (2006.01)
  *H05K 1/14* (2006.01)
  *H05K 3/40* (2006.01)
  *H05K 1/18* (2006.01)
  *H05K 1/11* (2006.01)
  *H05K 1/16* (2006.01)
  *H05K 7/02* (2006.01)

(52) U.S. Cl.
  CPC ........... *H05K 1/0298* (2013.01); *H05K 1/113* (2013.01); *H05K 1/119* (2013.01); *H05K 1/141* (2013.01); *H05K 3/4046* (2013.01); *H01L 2224/16225* (2013.01); *H05K 1/11* (2013.01); *H05K 1/16* (2013.01); *H05K 1/18* (2013.01); *H05K 1/181* (2013.01); *H05K 1/182* (2013.01); *H05K 7/02* (2013.01); *H05K 2201/09218* (2013.01)

(58) Field of Classification Search
  USPC ........ 361/760–764, 767–770, 777, 780–783, 361/803
  See application file for complete search history.

(56) References Cited

OTHER PUBLICATIONS

Taiji Sakai, et al., "Design and Demonstration of Large 2.5D Glass Interposer for high Bandwidth Applications", Proceeding of the IEEE CPMT Symposium Japan 2014, p. 138-141.

* cited by examiner

SEMICONDUCTOR DEVICE

TECHNICAL FIELD

The present invention relates to a semiconductor device, for example, relates to a technique effectively applied to a semiconductor device having a plurality of semiconductor components such as a semiconductor chip, which are electrically connected with each other via an interposer.

BACKGROUND ART

In Japanese Patent Application Laid-Open Publication No. 2015-50314 (Patent Document 1), an embodiment is described in which a wiring substrate has a chip mounting surface, a wiring film is applied to the chip mounting surface, and a plurality of semiconductor chips are arranged to face each other on the wiring film.

Furthermore, FIG. 1 of the following Non-Patent Document 1 illustrates a semiconductor device in which a first semiconductor component and a second semiconductor component are electrically connected with each other, via a wiring substrate having a plurality of through-hole wirings.

RELATED ART DOCUMENTS

Patent Document

Patent Document 1: Japanese Patent Application Laid-Open Publication No. 2015-50314

Non-Patent Document

Non-Patent Document 1: Taiji Sakai, and nine others, "Design and Demonstration of Large 2.5D Glass Interposer for High Bandwidth Applications," Proceeding of the IEEE CPMT Symposium Japan 2014, P. 138 to P. 141.

SUMMARY OF THE INVENTION

Problems to be Solved by the Invention

There is a technique to perform signal transmission between a plurality of semiconductor components electrically connected with each other via an interposer. Furthermore, when a plurality of wiring layers are provided in the interposer, wires are readily routed to connect the plurality of semiconductor components, and the number of wiring paths can be increased. However, it was found that, when an arrangement density of the plurality of wires provided in the interposer is increased in order to increase the number of the wiring paths described above, problems arise from the viewpoint of reliability of signal transmission.

Other objects and novel characteristics of the present invention will be apparent from the description of the present specification and the accompanying drawings.

Means for Solving the Problems

A semiconductor device according to an embodiment has a first semiconductor component and a second semiconductor component which are electrically connected with each other via an interposer. The interposer has a plurality of first signal wiring paths, and a plurality of second signal wiring paths each having a path distance smaller than each of the plurality of first signal wiring paths. Furthermore, the first semiconductor component includes a first electrode, a second electrode, and a third electrode arranged in order in a first direction. Furthermore, the second semiconductor component includes a fourth electrode, a fifth electrode, and a sixth electrode arranged in order in the first direction. Furthermore, the first electrode is connected with the fourth electrode via the first signal wiring path, the second electrode is connected with the fifth electrode via the first signal wiring path, and the third electrode is connected with the sixth electrode via the first signal wiring path.

Effects of the Invention

According to the embodiment described above, reliability of a semiconductor device can be improved.

BRIEF DESCRIPTIONS OF THE DRAWINGS

DETAILED DESCRIPTION OF PREFERRED EMBODIMENTS

Figure 1:
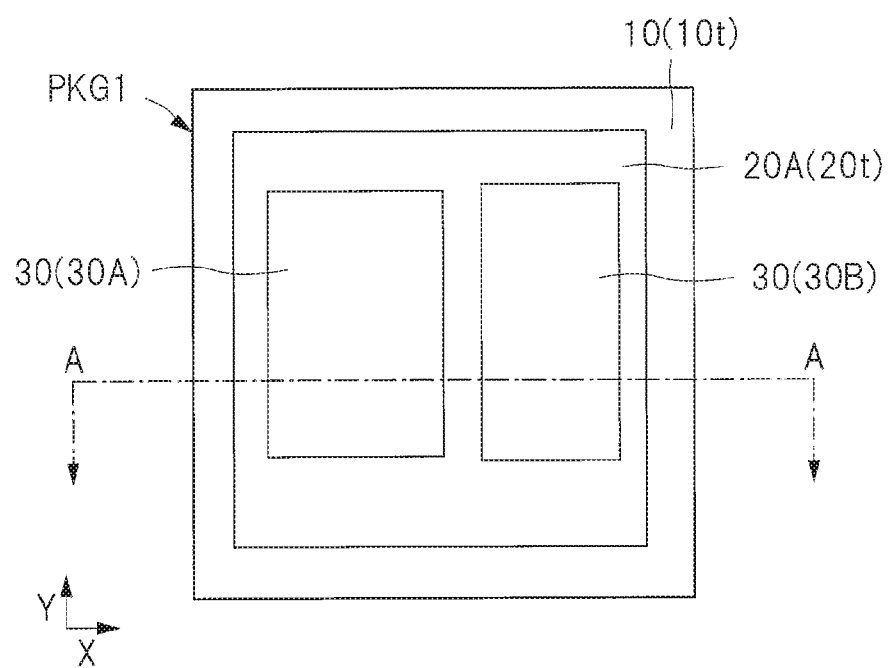
FIG. 1 is a top view of a semiconductor device according to an embodiment.

Explanation of Description Form, Basic Terms, and Method in Present Application

In this application, the embodiment will be described in a plurality of sections or the like when required as a matter of convenience. However, these sections are not independent or distinct from each other unless particularly explicitly described otherwise, and they are individual parts of a single example, one of them is a partial detail of the other, or one of them is a modification example or the like of part or the whole of the other, irrespective of the order of descriptions. Also, the description of the same portions is not repeated in principle. Further, each component in the embodiment is not indispensable unless particularly explicitly described otherwise, unless the component is logically limited to a specific number, and unless it is obvious from the context that the component is indispensable.

Similarly, in the description of an embodiment and others, even when "X made up of A" or the like is referred to with respect to a material, a composition, and the like, X containing elements other than A is not excluded unless particularly explicitly described otherwise and unless it is obvious from the context that X does not contain elements other than A. For example, when referring to an ingredient, it means "X containing A as a main ingredient" or the like. For example, even when "silicon member" or the like is mentioned, the meaning is not limited to pure silicon, and it is needless to say that a member containing a SiGe alloy, another multi-element alloy containing silicon as a main ingredient, another additive, or the like is also included. In addition, even when a gold plating, a Cu layer, a nickel plating, and others are mentioned, not only a pure one but also a member containing each of gold, Cu, and nickel as a main ingredient is included unless particularly explicitly described otherwise.

Further, even when a specific value or amount is mentioned, a value larger than a specific value or smaller than the specific value is also applicable unless particularly explicitly described otherwise, unless it is logically limited to the specific value, and unless it is obvious from the context that a value is not larger than the specific value or smaller than the specific value.

Also, the same or similar portions are denoted by the same or similar reference signs or characters throughout the drawings for describing the embodiment, and the repetitive description thereof is omitted.

In addition, in the accompanying drawings, hatching or the like may be omitted even in a cross section in the case where the drawings become rather complicated or distinction from a clearance is apparent. In association with this, when it is obvious from the description or the like, a contour line in a background may be omitted even in a case of a planarly closed hole. In addition, in order to specify the fact that a portion is not a clearance or specify a boundary of regions, hatching or dot pattern may be given even in the case other than the cross section.

<About Interposer>

One mode of a semiconductor package provides a semiconductor device in which a semiconductor component such as a semiconductor chip or a stacked semiconductor chip having a plurality of semiconductor chips stacked is mounted over a wiring substrate. Furthermore, in recent years, electrodes of semiconductor components have been increased in density, corresponding to requests for reduced size or high performance of the semiconductor components. When a semiconductor component having a large number of electrodes arranged at high density are mounted over a wiring substrate, so-called flip-chip bonding is often employed in which a plurality of electrodes of the semiconductor component and a plurality of terminals of the wiring substrate are arranged to face each other and electrically connected with each other via a conductive member such as solder.

However, in flip-chip bonding, an arrangement density of a plurality of electrodes of a semiconductor component needs to coincide with an arrangement density of a plurality of terminals of a wiring substrate, but it is sometimes difficult to arrange the plurality of electrodes and the plurality of terminals to face each other. In order to overcome this problem, a method is effectively employed to provide an interposer (relay substrate) between the semiconductor component and the wiring substrate to route wires in the interposer, for electrical connection between the semiconductor component and the wiring substrate via the interposer.

Furthermore, there is a technique to mount a plurality of semiconductor components in one semiconductor package, for signal transmission between the plurality of semiconductor components. For example, a semiconductor device exemplified and described below includes a memory chip (second semiconductor component) in which a memory circuit is formed, and a logic chip (first semiconductor component) in which a calculation circuit, and a control circuit controlling operation of the memory circuit of the memory chip are formed. A semiconductor device having a system formed in one package, as described above, is called system in package (SiP). Furthermore, a semiconductor device having a plurality of semiconductor chips mounted in one package is called a multi chip module (MCM).

The present inventors have examined a technique for mounting a plurality of semiconductor components over an interposer in a SiP semiconductor device. A memory chip and a logic chip of a semiconductor device described below are electrically connected with each other via an interposer, and a system is formed in one package.

In the SiP semiconductor device, signal transmission is performed between the plurality of semiconductor components mounted in one package, in some cases. A plurality of signal transmission paths connecting the plurality of semiconductor components include a number of signal transmission paths which do not need to be connected with the outside of the semiconductor package when the semiconductor components are connected with each other.

In this case, if the plurality of signal transmission paths connecting the plurality of semiconductor components can be provided in the interposer, an arrangement density of wires in a wiring substrate can be reduced. Thus, the wiring substrate can have a simplified structure. Alternatively, from the viewpoint of reliability of signal transmission, each of the signal transmission paths preferably has a reduced length. Specifically, in order to increase a signal transmission rate, the signal transmission path is effectively reduced to improve the reliability of signal transmission.

However, when the number of signal transmission paths provided in the interposer is increased with increase in number of terminals of each semiconductor component, routing of each wiring path in the interposer is complicated. Thus, it was found that the reliability of signal transmission is reduced for example, due to increased influence of crosstalk noise between the plurality of signal transmission paths formed in the interposer. Therefore, the present inventors examined a technique for improving transmission reliability in the plurality of wiring paths formed in the interposer.

A technique against the above problems found by the present inventors will be described in detail below with reference to the drawings.

<Outline of Semiconductor Device>

Figure 2:
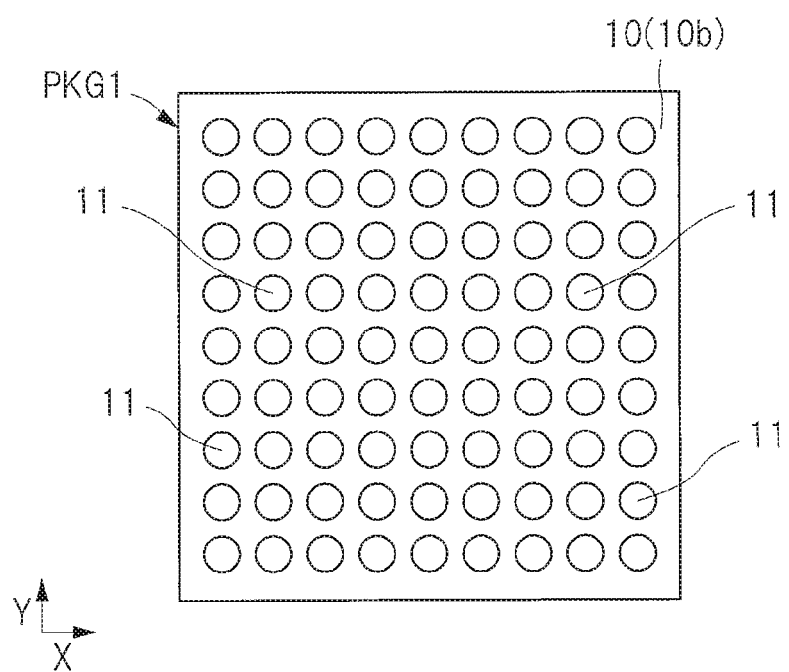
FIG. 2 is a bottom view of the semiconductor device illustrated in FIG. 1.
Figure 3:
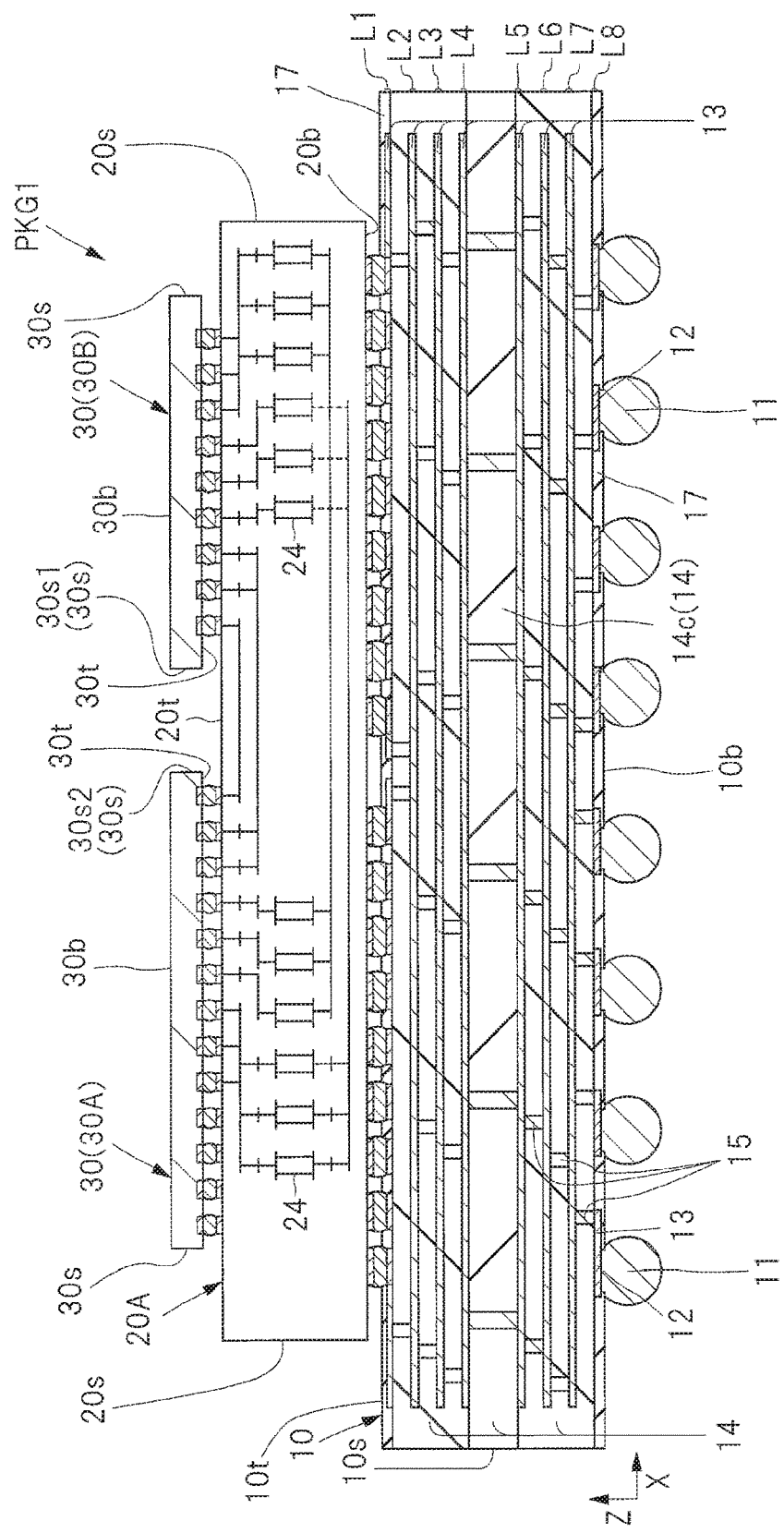
FIG. 3 is a cross-sectional view taken along a line A-A of FIG. 1.
Figure 4:
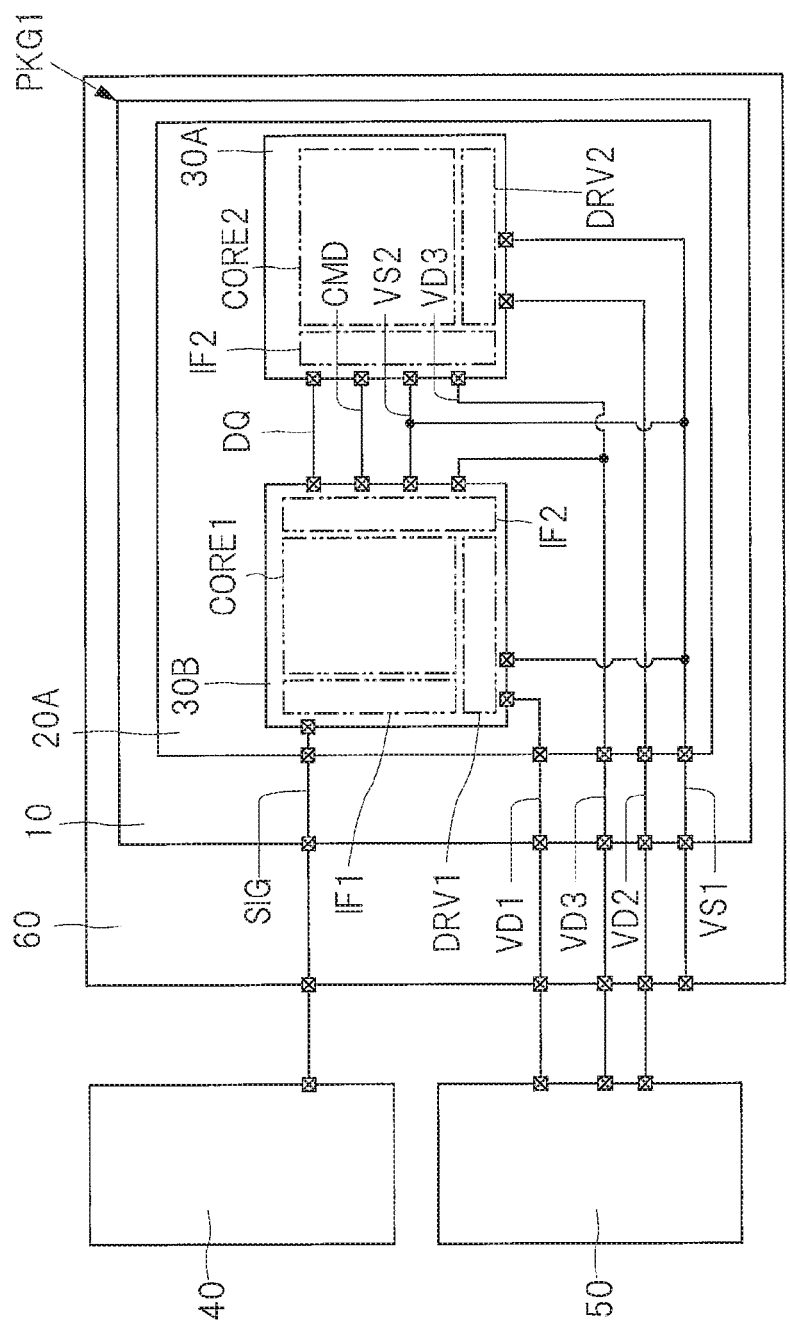
FIG. 4 is an explanatory diagram illustrating an exemplary circuit configuration of the semiconductor device illustrated in FIGS. 1 to 3, where the semiconductor device is mounted over a mounting board.

First, an outline of a structure of a semiconductor device of the present embodiment will be described with reference to FIGS. 1 to 4. FIG. 1 is a top view of the semiconductor device according to the present embodiment. FIG. 2 is a bottom view of the semiconductor device illustrated in FIG. 1. Also, FIG. 3 is a cross-sectional view taken along a line A-A of FIG. 1. Also, FIG. 4 is an explanatory diagram illustrating an exemplary circuit configuration of the semiconductor device illustrated in FIGS. 1 to 3, where the semiconductor device is mounted over a mounting board.

Note that, FIGS. 2 and 3 illustrate a reduced number of terminals for viewability. However, there are various modification examples of the number of terminals, in addition to the embodiment illustrated in FIGS. 2 and 3. For example, the number of solder balls 11 illustrated in FIG. 2 may be larger than the number illustrated in FIG. 2. In particular, in the present application, a technique for solving the problems arising upon increase in number of wiring paths electrically connecting a plurality of semiconductor chips 30 will be described. Accordingly, the number of terminals of each of the plurality of semiconductor chips 30 illustrated in FIG. 3 exceeds, for example, 1,000.

Furthermore, in the present embodiment, each of a wiring substrate 10 and an interposer 20A illustrated in FIG. 3 has a plurality of wiring layers. However, in FIG. 3, part of the plurality of wires formed in each wiring layer is schematically illustrated for viewability. Furthermore, in an example illustrated in FIG. 4, representative transmission paths of a large number of transmission paths of a semiconductor device PKG1 are exemplarily illustrated.

As illustrated in FIGS. 1 and 3, the semiconductor device PKG1 according to the present embodiment includes the wiring substrate (package substrate) 10, the interposer (relay substrate) 20A mounted over the wiring substrate 10, and the plurality of semiconductor chips (semiconductor components) 30 mounted over the interposer 20A. The plurality of semiconductor chips 30 are mounted to be aligned over the interposer 20A.

Note that, in the present embodiment, the plurality of semiconductor chips 30 mounted to be aligned over the interposer 20A will be exemplified and described. However, the semiconductor components mounted over the interposer 20A are not limited to the semiconductor chips 30, and various modification examples may be provided. For example, a stacked semiconductor chip (semiconductor component) having a plurality of semiconductor chips stacked, or a semiconductor package (semiconductor component) in which a semiconductor chip is mounted over a wiring member such as a wiring substrate may be employed instead of each of the plurality of semiconductor chips 30 mounted over the interposer 20A or part of the plurality of semiconductor chips 30.

Specifically, in the present embodiment, as an example of the plurality of semiconductor components mounted over the interposer 20A, a memory chip 30A including a memory circuit, as one of the plurality of semiconductor components, and a logic chip 30B including a control circuit controlling the memory circuit, as the other one, will be exemplified and described. However, for example, instead of the memory chip 30A illustrated in FIG. 3, a stacked body having a plurality of memory chips stacked may be mounted over the interposer 20A. Furthermore, for example, instead of the memory chip 30A illustrated in FIG. 3, a stacked body in which a plurality of memory chips and a controller chip including a control circuit controlling operation of the plurality of memory chips are stacked may be mounted over the interposer 20A. Furthermore, when a plurality of kinds of semiconductor chips are stacked, a stacking order thereof is not particularly limited. Furthermore, instead of the memory chip 30A illustrated in FIG. 3, a semiconductor package in which one or more memory chips (and controller chips) are electrically connected with a wiring substrate (package substrate) not illustrated and a plurality of external terminals are formed on the wiring substrate may be mounted over the interposer 20A.

Furthermore, as illustrated in FIG. 2, a plurality of solder balls (external terminals) 11 as external terminals of the semiconductor device PKG1 are arranged in rows and columns (in an array or a matrix), on a lower surface 10b of the wiring substrate 10 as a mounted surface of the semiconductor device PKG1. Each of the plurality of solder balls 11 is connected to a land (external terminal) 12 (see FIG. 3).

A semiconductor device in which a plurality of external terminals (solder balls 11 and lands 12) are arranged in rows and columns on a mounted surface side, like the semiconductor device PKG1, is called area array semiconductor device. The area array semiconductor device PKG1 can effectively use the mounted surface (lower surface 10b) of the wiring substrate 10, for an arrangement space of the external terminals, and even when the number of external terminals increases, increase of a mounting area of the semiconductor device PKG1 can be preferably prevented. That is, even when the number of external terminals increases with higher performance and higher integration, the semiconductor device PKG1 can be mounted in a saved space.

Furthermore, as illustrated in FIG. 3, the wiring substrate 10 includes an upper surface (surface, or chip mounting surface) 10t over which the plurality of semiconductor chips 30 are mounted via the interposer 20A, the lower surface (surface, or mounted surface) 10b positioned on an opposite side of the upper surface 10t, and a side surface 10s positioned between the upper surface 10t and the lower surface 10b. Furthermore, the wiring substrate 10 has a quadrangular outer shape in plan view, as illustrated in FIG. 1.

Furthermore, as illustrated in FIG. 3, the interposer 20A includes an upper surface (surface, or chip mounting surface) 20t over which a plurality of semiconductor chips (semiconductor components) 30 are mounted, a lower surface (surface, or mounted surface) 20b positioned on an opposite side of the upper surface 20t, and a side surface 20s positioned between the upper surface 20t and the lower surface 20b. Furthermore, the interposer 20A has a quadrangular outer shape in plan view, as illustrated in FIG. 1.

Furthermore, as illustrated in FIG. 3, each of the plurality of semiconductor chips 30 includes a front surface (main surface, or upper surface) 30t, a back surface (main surface, or lower surface) 30b positioned on an opposite side of the front surface 30t, and a side surface 30s positioned between the front surface 30t and the back surface 30b. Furthermore, each of the plurality of semiconductor chips 30 has a quadrangular outer shape in plan view, as illustrated in FIG. 1.

According to an example of the present embodiment, one of the plurality of semiconductor chips 30 is the memory chip 30A including the memory circuit, and the other one is the logic chip 30B including the control circuit controlling the memory circuit. Furthermore, according to an example of the present embodiment, the memory chip 30A and the logic chip 30B are each directly connected with the interposer 20A. In other words, a substrate or another chip component is not inserted between the memory chip 30A and the interposer 20A, and between the logic chip 30B and the interposer 20A.

Furthermore, as illustrated in FIG. 4, the semiconductor device PKG1 according to the present embodiment includes a system operated by signal transmission between the logic chip 30B and the memory chip 30A. The memory chip 30A includes a main memory circuit (memory circuit) storing data communicated with the logic chip 30B. Furthermore, the logic chip 30B includes a control circuit controlling operation of the main memory circuit of the memory chip 30A. Furthermore, the logic chip 30B includes a calculation processing circuit performing calculation processing for an input data signal. By way of example, FIG. 4 illustrates main circuits such as the calculation processing circuit and the control circuit as a core circuit (main circuit) CORE1. However, the core circuit CORE1 may include a circuit other than the circuits described above. For example, the logic chip 30B may have an auxiliary memory circuit (memory circuit) such as a cache memory temporarily storing data. The auxiliary memory circuit is formed to have a storage capacity smaller than that of the main memory circuit of the memory chip 30A.

Furthermore, in the logic chip 30B, an external interface circuit (input/output circuit, or external input/output circuit) IF1 is formed to perform signal input/output with an external device 40. With the external interface circuit IF1, a signal line SIG is coupled to transmit a signal between the logic chip 30B and the external device 40. Furthermore, the external interface circuit IF1 is also coupled with the core circuit CORE1, and the core circuit CORE1 can transmit a signal with the external device 40 via the external interface circuit IF1.

Furthermore, in the logic chip 30B, an internal interface circuit (input/output circuit, internal input/output circuit) IF2 is formed to perform signal input/output with an internal device (e.g., memory chip 30A). With the internal interface circuit IF2, a data line (signal line) DQ and a control signal line (signal line) CMD are coupled. The data line DQ transmits a data signal, and the control signal line CMD transmits a control data signal such as an address signal or a command signal. The data line DQ and the control signal line CMD are each coupled with the internal interface circuit IF2 of the memory chip 30A.

Furthermore, the logic chip 30B includes a power circuit DRV1 supplying potential for driving the core circuit CORE1 and the input/output circuits. In the example illustrated in FIG. 4, with the power circuit DRV1, a power supply line VD1 and a reference potential line VS1 are coupled. The power supply line VD1 supplies power supply potential, and the reference potential line VS1 supplies reference potential. In the example illustrated in FIG. 4, potential for driving the core circuit CORE1 and the input/output circuits is supplied to respective circuits, from a power supply 50 provided outside the semiconductor device PKG1 through the power circuit DRV1.

Note that FIG. 4 illustrates an example of a pair of the power supply line VD1 and the reference potential line VS1 connected to the logic chip 30B, but potential supplied to the logic chip 30B is not limited to the two types described above. For example, the power circuit DRV1 may include a power circuit for the external interface to which voltage for driving the external interface circuit IF1 of the logic chip 30B is supplied, and a power circuit for the core to which voltage for driving the core circuit CORE1 of the logic chip 30B is supplied. Furthermore, the power circuit DRV1 may include a power circuit for an internal interface to which voltage for driving the internal interface circuit IF2 of the logic chip 30B is supplied. In this case, a plurality of power supply lines VD1 supplying a plurality of different power supply potentials are connected to the logic chip 30B.

Furthermore, potential supplied to the reference potential line VS1 illustrated in FIG. 4 is, for example, ground potential. However, drive voltage is defined by a difference between a first potential and a second potential which are different from each other, so that potential supplied to the reference potential line VS1 may be potential other than the ground potential.

Circuits required for operation of a device or a system are collectively formed in one semiconductor chip 30, like the logic chip 30B, which is called system on a chip (SoC). Incidentally, when the main memory circuit illustrated in FIG. 4 is formed in the logic chip 30B, the logic chip 30B can singularly constitute a system. However, in the main memory circuit, a necessary capacity differs according to a device or a system to be operated. Therefore, the main memory circuit is formed in a semiconductor chip 30 (i.e., memory chip 30A) different from the logic chip 30B to improve versatility of the logic chip 30B. Furthermore, when a plurality of memory chips 30A are connected according to a required storage capacity of the main memory circuit, a degree of design freedom is improved in capacity of a memory circuit of a system.

Furthermore, in the example illustrated in FIG. 4, the memory chip 30A includes the main memory circuit. FIG. 4 illustrates the main memory circuit as a core circuit (main circuit) CORE2 of the memory chip 30A. However, the core circuit CORE2 may include a circuit other than the main memory circuit.

Furthermore, in the memory chip 30A, an internal interface circuit (internal input/output circuit) IF2 is formed to perform signal input/output with an internal device (e.g., logic chip 30B).

Furthermore, the memory chip 30A includes a power circuit DRV2 to which potential for driving the core circuit CORE2 is supplied. In the example illustrated in FIG. 4, to the power circuit DRV2, a power supply line VD2 and the reference potential line VS1 are connected. The power supply line VD2 supplies power supply potential, and the reference potential line VS1 supplies reference potential. In the example illustrated in FIG. 4, power supply potential supplied to the power supply line VD1, power supply potential supplied to the power supply line VD2, and power supply potential supplied to a power supply line VD3 are supplied from the power supply 50 provided outside the semiconductor device PKG1.

Note that FIG. 4 illustrates an example of a pair of the power supply line VD2 and the reference potential line VS1 connected to the memory chip 30A. Furthermore, in the example illustrated in FIG. 4, the logic chip 30B and the memory chip 30A are electrically connected with each other via the power supply line VD3 to which power supply potential driving the internal interface circuit IF2 is supplied, and the reference potential line VS2. However, a method of supplying potential to the memory chip 30A includes various modification examples in addition to the above description. For example, power supply potential driving the internal interface circuit IF2 of the logic chip 30B, and power supply potential driving the internal interface circuit IF2 of the memory chip 30A may be each independently supplied.

Furthermore, in the example illustrated in FIG. 4, a plurality of transmission paths electrically connecting the logic chip 30B and the memory chip 30A include the reference potential line VS2, in addition to the data line DQ and the control signal line CMD. This reference potential line VS2 serves as a path transmitting a reference signal of a data signal transmitted through the data line DQ, for example. To the reference potential line VS2 for reference, for example, ground potential is supplied as the reference potential. When ground potential is supplied to each of the reference potential line VS2 and the reference potential line VS1, it is better to connect the reference potential line VS2 and the reference potential line VS1 to each other for stable potential. Accordingly, as indicated by a solid line in FIG. 4, it is preferable that the reference potential line VS2 and the reference potential line VS1 are connected in the interposer 20A. However, when variation in potential in a transmission path can be reduced, potential other than the ground potential may be supplied to the reference potential line VS2 for reference. For example, power supply potential of an input/output power circuit may be used for reference potential for reference.

Furthermore, in the example illustrated in FIG. 4, the power supply line VD2 supplying power supply potential to the memory chip 30A, and the reference potential line VS1 supplying reference potential to the memory chip 30A are each connected to the memory chip 30A, without passing the logic chip 30B. However, in a modification example of FIG. 4, the power supply line VD1 and the reference potential line VS1 may be connected to the memory chip 30A through the logic chip 30B.

<Configuration of Each Component>

Figure 5:
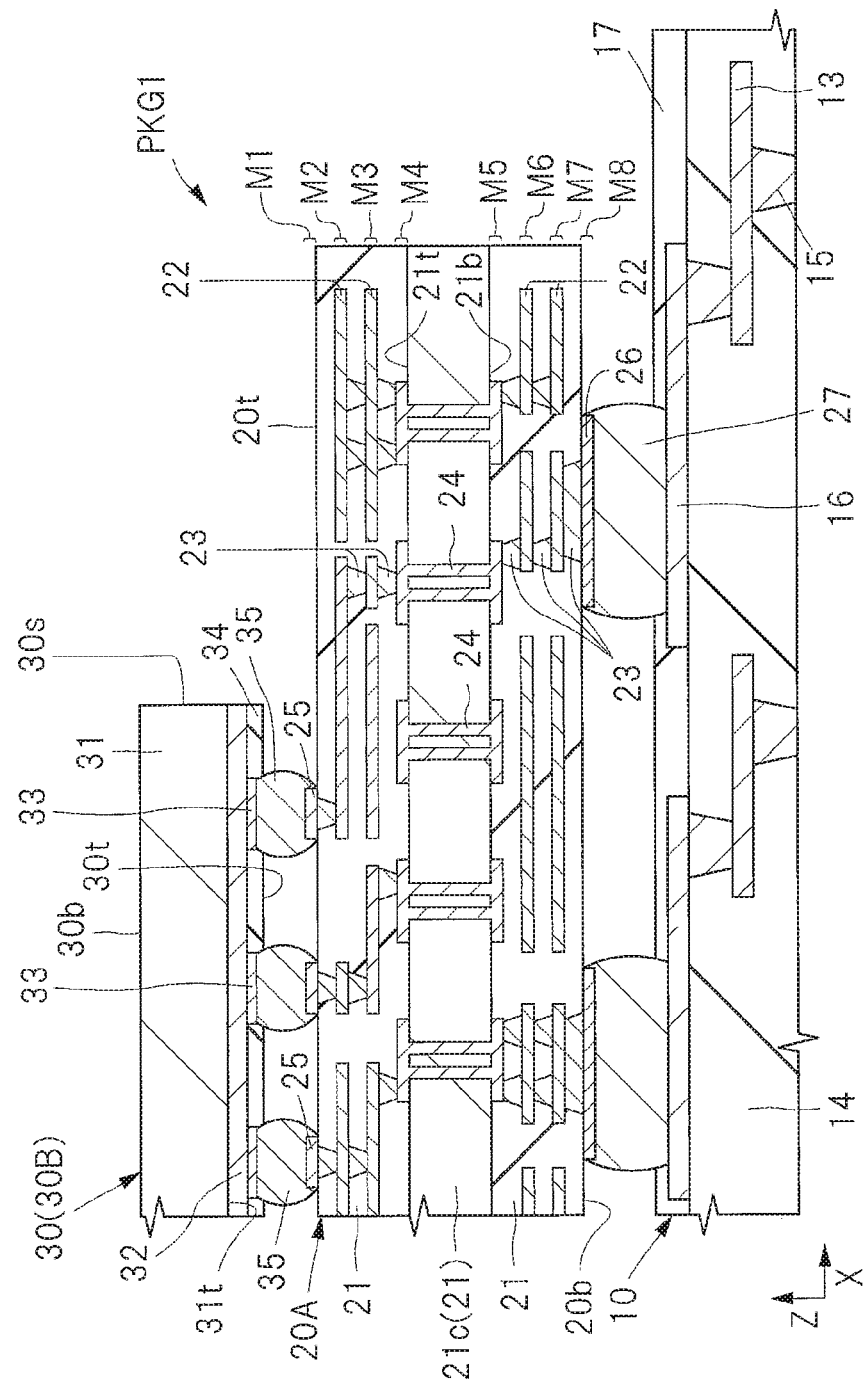
FIG. 5 is an enlarged cross-sectional view of a peripheral edge portion of an interposer illustrated in FIG. 3.

Next, main components constituting the semiconductor device PKG1 illustrated in FIGS. 1 to 4 will be described in order. FIG. 5 is an enlarged cross-sectional view of a peripheral edge portion of the interposer illustrated in FIG. 3.

The wiring substrate 10 illustrated in FIGS. 1 to 5 is a substrate including transmission paths supplying an electrical signal or potential between the semiconductor device PKG1 and a mounting board 60 (see FIG. 4). The wiring substrate 10 has a plurality of wiring layers (eight layers in the example illustrated in FIG. 3) electrically connecting the upper surface 10t and the lower surface 10b. A plurality of wires 13 provided in respective wiring layers are covered by insulation layers 14 insulating between the plurality of wires 13 and adjacent wiring layers.

The wiring substrate 10 illustrated in FIG. 3 is a so-called multilayer wiring substrate including a plurality of stacked wiring layers. In the example illustrated in FIG. 3, the wiring substrate 10 includes a total of eight wiring layers, that is, wiring layers L1, L2, L3, L4, L5, L6, L7, and L8, in order from the upper surface 10t. Each of the plurality of wiring layers has a conductor pattern such as the wire 13, and the adjacent conductor patterns are covered by an insulation layer 14. However, the number of wiring layers of the wiring substrate 10 is not limited to the example illustrated in FIG. 3, and for example, may be smaller than eight layers or larger than eight layers.

Furthermore, in the example illustrated in FIG. 3, the wiring substrate 10 has a structure in which a core layer (core material, core insulation layer, or insulation layer) 14c is used as a base material and a plurality of wiring layers are stacked over an upper surface and a lower surface of the core layer 14c. The core layer 14c is an insulation layer as a base material of the wiring substrate 10 and for example, includes an insulating material formed by causing a fiber material such as glass fiber to be impregnated with a resin material such as epoxy resin. Furthermore, the insulation layer 14 stacked over each of the upper surface and the lower surface of the core layer 14c includes an organic insulating material such as thermosetting resin. Furthermore, the plurality of wiring layers stacked over the upper surface and the lower surface of the core layer 14c are formed, for example, through the buildup process. However, in a modification example of FIG. 3, a so-called coreless substrate without the core layer 14c may be used.

Furthermore, the wiring substrate 10 has via wirings 15 serving as an interlayer conductive path provided between the wiring layers to connect stacked wiring layers in a thickness direction. Furthermore, a plurality of bonding pads (terminals, terminals on an interposer mounting surface side, or electrodes) 16 (see FIG. 5) are formed in the upper surface 10t of the wiring substrate 10. Note that the wire 13 provided in an uppermost wiring layer (the wiring layer L1 closest to the upper surface 10t) of the plurality of wiring layers of the wiring substrate 10 is formed integrally with the bonding pad 16. In other words, the bonding pad 16 can be considered to be part of the wire 13. Furthermore, when the bonding pad 16 is distinguished from the wire 13, a portion exposed from an insulation film 17 can be defined as the bonding pad 16, and a portion covered by the insulation film 17 can be defined as the wire 13, in the upper surface 10t of the wiring substrate 10.

Meanwhile, the plurality of lands (external terminals, or solder connection pads) 12 are formed in the lower surface 10b of the wiring substrate 10. The solder ball 11 is connected to each of the plurality of lands 12, and the mounting board 60 and the semiconductor device PKG1 illustrated in FIG. 4 are electrically connected with each other via the solder balls 11 illustrated in FIG. 3. That is, each of the plurality of solder balls 11 functions as external connection terminals of the semiconductor device PKG1.

The plurality of solder balls 11 and the plurality of lands 12 are electrically connected with the plurality of bonding pads 16 in the upper surface 10t, via the plurality of wires 13 of the wiring substrate 10. Note that the wire 13 provided in a lowermost wiring layer (the wiring layer closest to the lower surface 10b) of the plurality of wiring layers of the wiring substrate 10 is formed integrally with the land 12. In other words, the land 12 can be considered to be part of the wire 13. Furthermore, when the land 12 is distinguished from the wire 13, a portion exposed from the insulation film 17 can be defined as the land 12, and a portion covered by the insulation film 17 can be defined as the wire 13, in the lower surface 10b of the wiring substrate 10.

Furthermore, in a modification example of FIG. 3, the land 12 may function as the external connection terminal. In this case, the solder ball 11 is not connected to the land 12, and each of the plurality of lands 12 is exposed from the insulation film 17, in the lower surface 10b of the wiring substrate 10. Furthermore, as another modification example of FIG. 3, instead of the solder ball 11 having a ball shape, a thin solder film may be connected to function as the external connection terminal. Alternatively, a gold (Au) film formed, for example, by plating may be formed on the exposed surface to serve as the external connection terminal. Furthermore, the external connection terminal may be formed in a pin shape (rod shape).

Furthermore, the upper surface 10t and the lower surface 10b of the wiring substrate 10 are each covered by the insulation film (solder resist film) 17. The wire 13 formed in the upper surface 10t of the wiring substrate 10 is covered by the insulation film 17. Opening portions are formed in the insulation film 17, and at least part of the plurality of bonding pads 16 (bonding areas) are exposed from the insulation film 17, in the opening portions. Furthermore, the wire 13 formed in the lower surface 10b of the wiring substrate 10 is covered by the insulation film 17. Opening portions are formed in the insulation film 17, and at least part of the plurality of lands 12 (bonding portions with the solder balls 11) are exposed from the insulation film 17, in the opening portions.

Furthermore, as illustrated in FIG. 3, the semiconductor device PKG1 has the interposer 20A mounted over the wiring substrate 10. The interposer 20A is mounted over the upper surface 10t of the wiring substrate 10 in such a way that the lower surface 20b of the interposer 20A faces the upper surface 10t of the wiring substrate 10. The interposer 20A is a relay substrate interposed between the wiring substrate 10 and the plurality of semiconductor chips 30. Furthermore, the interposer 20A according to the present embodiment is a relay substrate including wiring paths electrically connecting the plurality of semiconductor chips 30 to each other. In other words, the interposer 20A according to the present embodiment has a function of electrically connecting the semiconductor chips 30 and the wiring substrate 10, and a function of electrically connecting the plurality of semiconductor chips 30, mounted over the interposer 20A, to each other.

Furthermore, as illustrated in FIG. 5, the interposer 20A is a so-called multilayer wiring substrate including a plurality of stacked wiring layers. In an example illustrated in FIG. 5, the interposer 20A includes a total of eight wiring layers, that is, wiring layers M1, M2, M3, M4, M5, M6, M7, and M8, in order from the upper surface 20t. Each of the plurality of wiring layers has a conductor pattern such as a wire 22, and the adjacent conductor patterns are covered by an insulation layer 21. However, the number of wiring layers of the interposer 20A is not limited to the example illustrated in FIG. 3 and for example, may be smaller than eight layers or larger than eight layers.

Furthermore, in the example illustrated in FIG. 5, the interposer 20A has a structure in which a core layer (core material, core insulation layer, or insulation layer) 21c is used as a base material and a plurality of wiring layers are stacked over an upper surface and a lower surface of the core layer 21c. The core layer 21c is an insulation layer as a base material of the interposer 20A and for example, includes an insulating material formed by causing a fiber material such as glass fiber to be impregnated with a resin material such as epoxy resin.

Furthermore, the insulation layer 21 stacked over each of the upper surface and the lower surface of the core layer 21c includes an organic insulating material such as thermosetting resin. Alternatively, the insulation layer 21 may be formed of, for example, a glass material (inorganic insulating material) such as silicon dioxide ($SiO_2$). When the insulation layer 21 is formed of an inorganic insulating material, the insulation layer 21 constituting a base of each wiring layer can have improved flatness, and thus, each wiring width of the plurality of wires 22 can be reduced, or an arrangement density of the plurality of wires 22 can be increased relative to an arrangement density of the wires 13 in the wiring substrate 10. Furthermore, the plurality of wiring layers stacked over the upper surface and the lower surface of the core layer 21c are formed, for example, through the buildup process.

Furthermore, the plurality of wiring layers of the interposer 20A are electrically connected with each other via wirings 23 or through-hole wirings 24 serving as an interlayer conductive path. Specifically, the core layer 21c includes an upper surface 21t, and a lower surface 21b positioned on an opposite side of the upper surface 21t. Furthermore, the core layer 21c includes a plurality of through-holes penetrating from one of the upper surface 21t and the lower surface 21b to the other thereof, and the plurality of through-hole wirings 24 formed by plugging the plurality of through-holes with conductors. Each of the plurality of through-hole wirings 24 is formed as the interlayer conductive path electrically connecting the wiring layer M4 provided over the upper surface 21t of the core layer 21c, and the wiring layer M5 provided over the lower surface 21b of the core layer 21c.

Furthermore, the wiring layers M4, M3, M2, and M1 stacked over the upper surface 21t of the core layer 21c are electrically connected with each other via the plurality of via wirings 23. Furthermore, the wiring layers M5, M6, M7, and M8 stacked over the lower surface 21b of the core layer 21c are electrically connected with each other via the plurality of via wirings 23. Note that, as long as the shape of the interposer 20A can be maintained, in a modification example of arrangement of the wiring layers of the interposer 20A, the number of wiring layers stacked over the upper surface 21t of the core layer 21c, and the number of wiring layers stacked over the lower surface 21b of the core layer 21c may be different. For example, when the number of wiring layers stacked over the upper surface 21t of the core layer 21c is larger than the number of wiring layers stacked over the lower surface 21b of the core layer 21c, the number of wiring layers having wiring paths bypassing the through-hole wirings 24 can be increased, and further, a thickness of the interposer 20A can be reduced.

The via wiring 23 is formed, for example, as described below. First, the insulation layer 21 is provided to cover a base wiring layer, and then, an opening portion is provided in part of the insulation layer 21 to partially expose the base wiring layer. Then, the opening portion is plugged with a conductor, and the via wiring 23 is formed. Furthermore, after the via wiring 23 is formed, another wiring layer is stacked over the via wiring 23, and an upper wiring layer and a lower wiring layer are electrically connected.

Furthermore, a plurality of upper surface terminals (bonding pads, terminals, terminals on a semiconductor component mounting surface side, or component connection terminals) 25 (see FIG. 5) are formed in the upper surface 20t of the interposer 20A. Then, each of the plurality of upper surface terminals 25 is electrically connected with an electrode (surface electrode, component electrode, or pad) 33 of the semiconductor chip 30, for example, via a bump electrode 35 made of solder. Note that, in the example illustrated in FIG. 5, the via wiring 23 connected to the upper surface terminal 25 is formed immediately under the upper surface terminal 25 (at a position overlapping in a thickness direction). In this case, a space for connecting the via wiring 23 and the upper surface terminal 25 is not required, and thus, the arrangement density of the plurality of upper surface terminals 25 can be increased. However, although illustration is omitted, in a modification example of FIG. 5, in order to connect the upper surface terminal 25 and the via wiring 23, a lead out wire (not illustrated) connected to the upper surface terminal 25 may be formed in the wiring layer M1, so that the via wiring 23 and the upper surface terminal 25 are connected with each other via the lead-out wire. In this case, in comparison with the example illustrated in FIG. 5, the arrangement density of the plurality of upper surface terminals 25 is reduced, but processability of the upper surface terminal 25 can be improved, and thus, processing accuracy of the upper surface terminal 25 can be improved.

Note that, in the present embodiment, a ball-shaped electrode made of solder is employed as the bump electrode 35 illustrated in FIG. 5. However, the bump electrode 35 has various modification examples in structure. For example, a pillar bump (columnar electrode) in which a solder film is formed on a tip end surface of a conductor post made of copper (Cu) or nickel (Ni) may be employed as the bump electrode 35.

Furthermore, a plurality of lower surface terminals (terminals, solder connection pads, lands, or wiring substrate connection terminals) 26 are formed in the lower surface 20b of the interposer 20A. The plurality of lower surface terminals 26 are electrically connected with the plurality of bonding pads 16 of the wiring substrate 10, respectively, for example, via a bump electrode 27 made of solder or the like.

Furthermore, in the example illustrated in FIG. 5, a via wiring 23 connected to a lower surface terminal 26 is formed immediately on the lower surface terminal 26 (at a position overlapping in a thickness direction). In this case, a space for connecting the via wiring 23 and the lower surface terminal 26 is not required, and thus, the arrangement density of the plurality of lower surface terminals 26 can be increased. For example, in the example illustrated in FIG. 5, the lower surface terminal 26 has a surface area larger than the surface area of the upper surface terminal 25. However, in a modification example of FIG. 5, in the same manner as in the modification of the wiring layer M1 described above, in order to connect a lower surface terminal 26 and a via wiring 23, a lead-out wire (not illustrated) connected to the lower surface terminal 26 may be formed in the wiring layer M8, so that the via wiring 23 and the lower surface terminal 26 are connected with each other via the lead-out wire. In this case, in comparison with the example illustrated in FIG. 5, the arrangement density of the plurality of lower surface terminals 26 is reduced, but processability of the lower surface terminal 26 can be improved.

Furthermore, in the example illustrated in FIG. 5, each of the plurality of upper surface terminals 25 and the plurality of lower surface terminals 26 is not covered by an insulation film but exposed from the insulation layer 21. However, in a modification example of FIG. 5, an insulation film (solder resist film) covering the plurality of upper surface terminals 25 and an insulation film (solder resist film) covering the plurality of lower surface terminals 26 may be provided. In this case, when opening portions are formed in the insulation films and each of the plurality of upper surface terminals 25 and the plurality of lower surface terminals 26 is partially exposed from the corresponding insulation film, through the opening portions, a bump electrode 35 can be connected to each of the upper surface terminals 25, and a bump electrode 27 can be connected to each of the lower surface terminals 26.

Note that the interposer 20A has various modification examples, in addition to a modification example of the number of wiring layers described above. For example, in a modification example of FIG. 5, a so-called coreless substrate without the core layer 21c may be used. Furthermore, in another modification example of FIG. 5, a so-called silicon interposer may be employed, in which a semiconductor substrate made of silicon (Si) or the like is used as a base material and a plurality of wiring layers are stacked over a main surface of the semiconductor substrate.

However, when a wiring substrate including a plurality of wiring layers is formed, in order to reduce a wiring width of each of the plurality of wires, and an arrangement interval between the plurality of wires, each wiring layer needs to have an improved flatness. In general, when wiring layers are stacked through the buildup process, it becomes more difficult to secure flatness of an upper wiring layer as the number of wiring layers to be stacked increases. Therefore, as in the present embodiment, a method of providing the core layer 21c and stacking the wiring layers over each of the upper surface 21t and the lower surface 21b of the core layer 21c is preferably employed for increase in the number of wiring layers, and improvement of flatness of each wiring layer.

Furthermore, as illustrated in FIG. 3, the semiconductor device PKG1 includes the plurality of semiconductor chips 30 mounted over the upper surface 20t of the interposer 20A. As illustrated in FIG. 5, each of the plurality of semiconductor chips 30 includes a silicon substrate (base material) 31 having a main surface 31t, and a wiring layer 32 arranged over the main surface 31t. Note that, for viewability, one wiring layer 32 is illustrated in FIG. 5, but for example, a plurality of wiring layers having a thickness smaller than those of the wiring layers M1, M2, and M3 of the interposer 20A are stacked in the wiring layer 32 illustrated in FIG. 5. Furthermore, although illustration is omitted for viewability, a plurality of wires are formed in each of the plurality of wiring layers 32. Furthermore, the plurality of wires are covered by an insulation layer insulating between the plurality of wires and the adjacent wiring layers. The insulation layer is an inorganic insulation layer made of an oxidized semiconductor material such as silicon oxide (SiO).

Furthermore, a plurality of semiconductor elements such as a transistor element or a diode element are formed in the main surface 31t of the silicon substrate 31 of each of the plurality of semiconductor chips 30. The plurality of semiconductor elements are electrically connected with the plurality of electrodes 33 formed on the side of the front surface 30t, via the plurality of wires in the wiring layer 32.

Furthermore, in the present embodiment, each of the plurality of semiconductor chips 30 is mounted over the upper surface 20t of the interposer 20A, with the front surface 30t and the upper surface 20t of the interposer 20A facing each other. Such mounting method is called facedown mounting or flip-chip bonding. In the flip-chip bonding, the semiconductor chip 30 and the interposer 20A are electrically connected as described below.

The plurality of electrodes (surface electrodes, component electrodes, pads) 33 are formed in the wiring layer 32 of the semiconductor chip 30. Each of the plurality of electrodes 33 is partially exposed from a passivation film 34 as a protective insulation film, in the front surface 30t of the semiconductor chip 30. Then, the electrodes 33 are each electrically connected with an upper surface terminal 25 of the interposer 20A via a bump electrode 35 connected to an exposed portion of the electrode 33.

Furthermore, in the present embodiment, as illustrated in FIG. 4, part of the plurality of transmission paths connected to the memory chip 30A is not connected to the wiring substrate 10, but connected with the logic chip 30B via the interposer 20A. In the example illustrated in FIG. 4, the data line DQ and the control signal line CMD are electrically isolated from the wiring substrate 10. Meanwhile, of the plurality of transmission paths connected to the memory chip 30A, the power supply line VD2 and the reference potential line VS1 which supply power supply potential for driving a circuit of the memory chip 30A are electrically connected to the wiring substrate 10. Note that the reference potential line VS2 used for a reference to a signal line of the transmission paths electrically connecting the logic chip 30B and the memory chip 30A may be separated from the wiring substrate 10.

<Details of Transmission Paths Electrically Connecting Semiconductor Chips>

Figure 6:
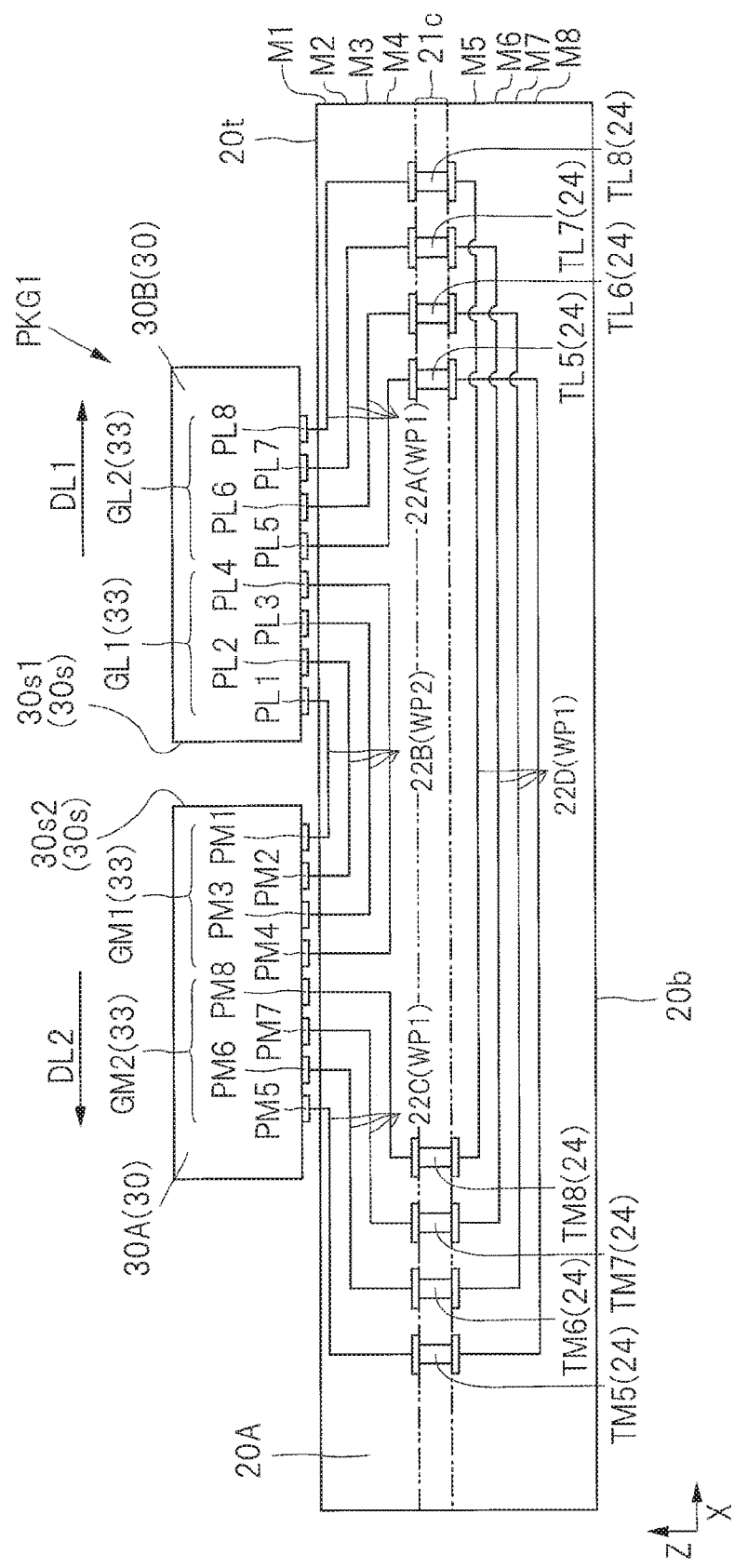
FIG. 6 is an explanatory diagram schematically illustrating an exemplary layout of signal transmission paths connecting a logic chip and a memory chip, illustrated in FIG. 4.
Figure 7:
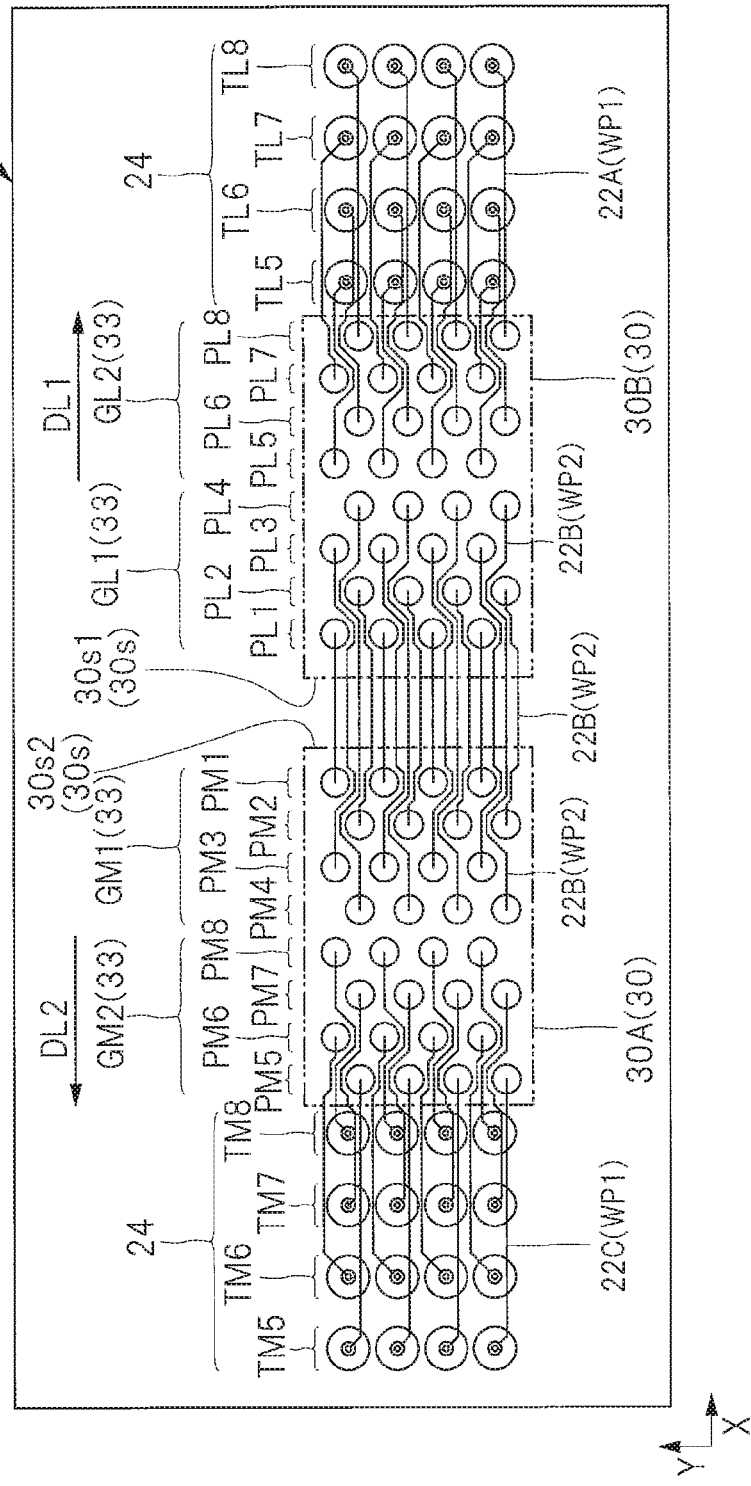
FIG. 7 is an explanatory diagram schematically illustrating an exemplary layout in plan view of a plurality of electrodes, a plurality of through-hole wirings, and wires electrically connecting the plurality of electrodes, illustrated in FIG. 6.

Next, a detailed description will be made of signal transmission paths electrically connecting the logic chip 30B and the memory chip 30A as illustrated in FIG. 4. FIG. 6 is an explanatory diagram schematically illustrating an exemplary layout of the signal transmission paths connecting the logic chip and the memory chip, illustrated in FIG. 4. Also, FIG. 7 is an explanatory diagram schematically illustrating an exemplary layout in plan view of a plurality of electrodes, a plurality of through-hole wirings, and wires electrically connecting the plurality of electrodes, illustrated in FIG. 6. Also, FIG. 8 is an explanatory diagram schematically illustrating an exemplary layout of the wires making an electrical connection between the plurality of through-hole wirings illustrated in FIG. 7.

Figure 8:
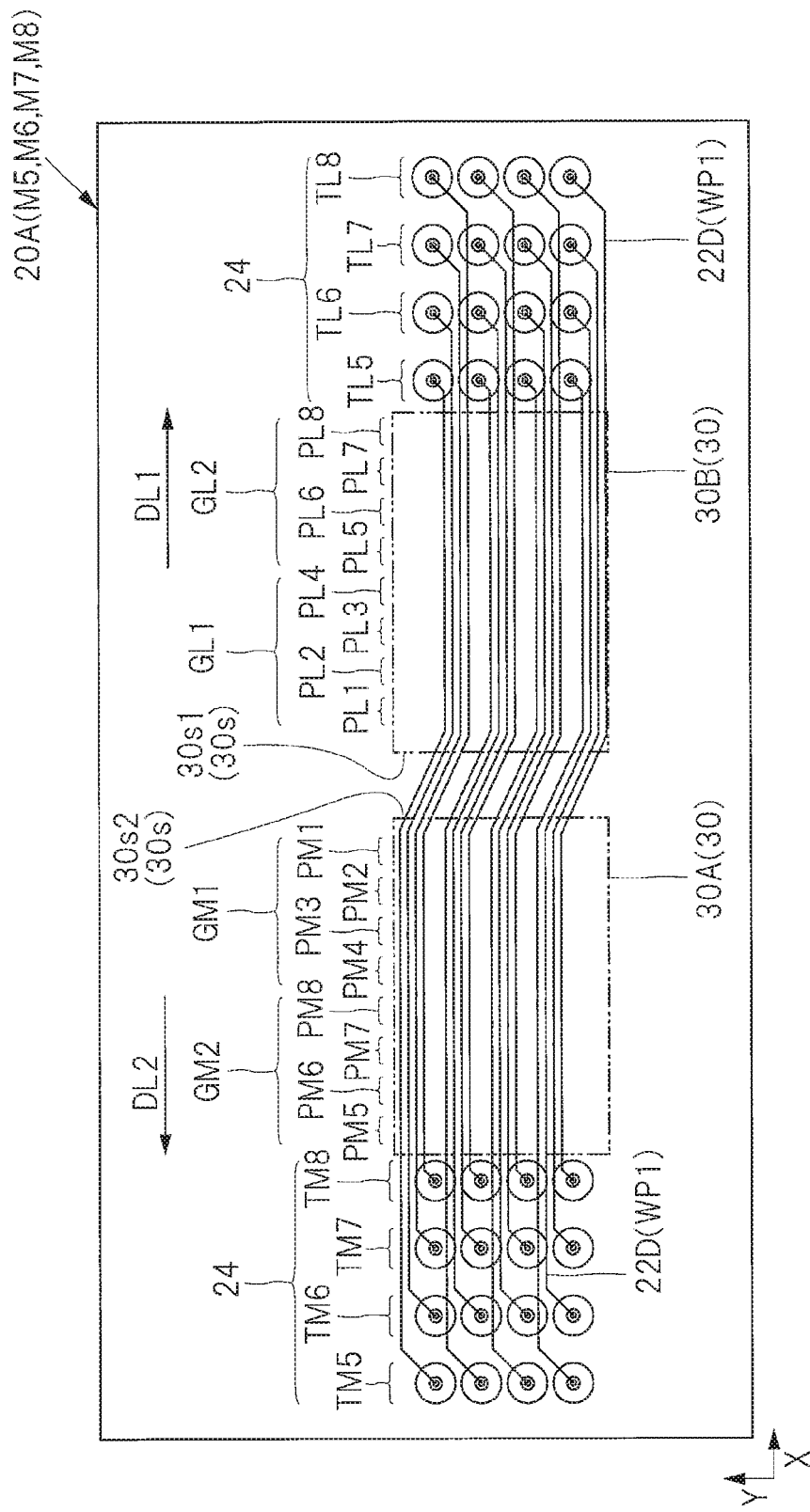
FIG. 8 is an explanatory diagram schematically illustrating an exemplary layout of the wires making an electrical connection between the plurality of through-hole wirings illustrated in FIG. 7.

Note that FIGS. 6 to 8 are schematic diagrams illustrating difference in connecting method (relation between wiring direction and electrode arrangement), between a wiring path (signal wiring path) WP1 and a wiring path (signal wiring path) WP2. Thus, FIGS. 6 to 8 schematically illustrate part of a large number of electrodes of the logic chip 30B and the memory chip 30A, and wiring paths connected to the electrodes. Thus, the number of wiring paths of the interposer 20A is not limited to examples illustrated in FIGS. 6 to 8 and may be larger than the examples illustrated in FIGS. 6 to 8.

Furthermore, FIG. 6 is a cross-sectional view illustrating routing of a plurality of the wiring paths WP2 and a plurality of the wiring paths WP1, respectively, in different wiring layers. However, the plurality of the wiring paths WP2 or the plurality of the wiring paths WP1 may be routed in one wiring layer. Furthermore, FIGS. 7 and 8 are plan views illustrating positional relations between the wiring paths WP1 or the wiring paths WP2 (see FIG. 7) in plan view. FIG. 7 illustrates a layout of four wiring layers above the core layer 21c (see FIG. 5) in which the plurality of through-hole wirings 24 are provided, and FIG. 8 illustrates a layout of four wiring layers below the core layer 21c in which the plurality of through-hole wirings 24 are provided. Furthermore, in FIGS. 7 and 8, the positions of the semiconductor chips 30 are indicated by a two-dot chain line.

Furthermore, as illustrated in FIG. 5, a plurality of upper surface terminals 25 are formed in the first wiring layer of the interposer 20A, and the plurality of electrodes 33 of the semiconductor chip 30 are arranged to face the plurality of upper surface terminals 25, respectively. However, in FIG. 7, the plurality of electrodes 33 are indicated by a solid line to show a positional relation between the plurality of electrodes 33 and the plurality of wiring paths in plan view. Accordingly, in the upper surface 20t of the interposer 20A (see FIG. 5), the plurality of upper surface terminals 25 (see FIG. 5) are provided at positions overlapping with the plurality of electrodes 33 illustrated in FIG. 7.

Furthermore, in the following description, terms such as a plurality of first group electrodes (inside electrodes, signal electrodes, or short distance connection electrodes) GL1 and GM1, and a plurality of second group electrodes (outside electrodes, signal electrodes, or bypass connection electrodes) GL2 and GM2, are used for description. The "first group electrode" and the "second group electrode" are distinguished as described below. That is, the first group electrodes GL1 and GM1 illustrated in FIG. 6 are electrically connected with each other via the wiring paths WP2. Of the plurality of electrodes 33 of the memory chip 30A illustrated in FIGS. 6 and 7, each of the plurality of first group electrodes GM1 connected with each of the plurality of wiring paths WP2 is arranged in a region inside (on a cetral side of the upper surface 20t) relative to the plurality of second group electrodes GM2, in the upper surface 20t of the interposer 20A (see FIG. 6). Similarly, of the plurality of electrodes 33 of the logic chip 30B illustrated in FIGS. 6 and 7, each of the plurality of first group electrodes GL1 connected with each of the plurality of wiring paths WP2 is arranged in a region inside (on a cetral side of the upper surface 20t) relative to the plurality of second group electrodes GL2, in the upper surface 20t of the interposer 20A. Thus, the first group electrodes GL1 and GM1 can be also referred to as "inside" electrodes. Meanwhile, the second group electrodes GL2 and GM2 can be also referred to as "outside" electrodes.

Furthermore, the second group electrodes GL2 and GM2 illustrated in FIG. 6 are electrically connected with each other via the wiring path WP1 as a wiring bypass, which is described later. Of the plurality of electrodes 33 of the memory chip 30A illustrated in FIGS. 6 and 7, each of the plurality of second group electrodes GM2 connected with each of the plurality of wiring paths WP1 is arranged in a region outside (on a peripheral edge portion side of the upper surface 20t) relative to the plurality of first group electrodes GM1, in the upper surface 20t of the interposer 20A (see FIG. 6). Also, of the plurality of electrodes 33 of the logic chip 30B illustrated in FIGS. 6 and 7, each of the plurality of second group electrodes GL2 connected with each of the plurality of wiring paths WP1 is arranged in a region outside (on a peripheral edge portion side of the upper surface 20t)

relative to the plurality of first group electrodes GL1, in the upper surface 20t of the interposer 20A. Thus, the second group electrodes GL2 and GM2 are referred to as the "outside" electrodes.

However, all of the first group electrodes GM1 and GL1 and all of the second group electrodes GM2 and GL2 are not necessarily distinguished clearly. For example, on the boundary between the region in which the plurality of first group electrodes GM1 and GL1 are arranged and the region in which the plurality of second group electrodes GM2 and GL2 are arranged, some of the first group electrodes GM1 and GL1 may be arranged outside some of the second group electrodes GM2 and GL2.

As described above, an example of the SiP semiconductor device includes a configuration in which the logic chip 30B and the memory chip 30A are mounted in one package, as in the present embodiment. In order to improve the performance of the SiP semiconductor device having such a configuration, a technique is demanded for improving a transmission rate of a signal transmission path connecting the logic chip 30B and the memory chip 30A with each other. For example, each of a plurality of data lines DQ of the signal transmission paths illustrated in FIG. 4 is designed to transmit a data signal at a transmission rate of not less than 1 Gbps (1 gigabit per second). In order to increase a transmission rate of each of the plurality of signal transmission paths, the number of transmissions per unit time needs to be increased (hereinafter, referred to as increased clock frequency).

Furthermore, as another method of improving the signal transmission rate between the logic chip 30B and the memory chip 30A, there is a method of increasing a data bus width of an internal interface to increase an amount of data transmitted at a time (hereinafter, referred to as increased bus width). Still furthermore, there is a method of application of a combination of the increased bus width and the increased clock frequency described above. This method requires a large number of high speed signal transmission paths.

For example, when a memory called high bandwidth memory (HBM) is used for the memory chip 30A illustrated in FIG. 4, the memory chip 30A has a data bus width of 1024 bits or more. Furthermore, the number of transmissions per unit time of each terminal is increased in clock frequency, and the transmission rate per terminal is, for example, 1 Gbps or more.

As described above, when there are a large number of signal transmission paths electrically connecting semiconductor chips 30, routing of all the signal transmission paths by only using a wiring substrate 10 having no interposer 20A thereon causes complication of a wiring structure of the wiring substrate 10. For example, it may be considered that more than 30 wiring layers are included in the wiring substrate 10. Then, when there are a large number of signal transmission paths electrically connecting the semiconductor chips 30, a method is effectively employed to connect these signal paths by using a wiring layer of a relay substrate (interposer) separately provided from the wiring substrate. Specifically, as in the present embodiment, a method of electrically connecting the logic chip 30B and the memory chip 30A via the interposer 20A is effective. In this case, the number of signal transmission paths provided in the wiring substrate 10 can be reduced, whereby the wiring substrate 10 can have a simplified structure. Thus, the semiconductor device PKG1 can have a reduced number of wiring layers (a total of the number of wiring layers of the wiring substrate 10 and the number of wiring layers of the interposer 20A), as a whole.

However, when the number of signal transmission paths increases, a large number of signal transmission paths needs to be arranged in the interposer 20A at high density. Then, it was found that the problem occurs in reliability of signal transmission. For example, when a signal transmission path has a larger path distance, a signal waveform tends to be attenuated. Furthermore, when the signal transmission paths have a larger path distance, adjacent different signal transmission paths tend to have a longer distance at which the adjacent different signal transmission paths run in parallel. In this case, influence of crosstalk noise increases between the parallel signal transmission paths.

Therefore, a signal transmission path electrically connecting the semiconductor chips 30 is preferably connected using a wire extending from one of the semiconductor chips 30 to the other of the semiconductor chips 30 for minimum distance connection.

For example, in the example illustrated in FIG. 6, of the plurality of electrodes 33 of the logic chip 30B, a plurality of first group electrodes GL1 provided close to a side surface 30s1, and, of the plurality of electrodes 33 of the memory chip 30A, a plurality of first group electrodes GM1 provided close to a side surface 30s2 are electrically connected with each other, via wires (signal wires) 22B extending from one of the semiconductor chips 30 to the other of the semiconductor chips 30.

In the following description, the plurality of wiring paths WP2 will be described in detail. The plurality of wiring paths WP2 connect the electrodes PL1, PL2, PL3, and PL4 and the electrodes PM1, PM2, PM3, and PM4, with each other. The electrodes PL1, PL2, PL3, and PL4 are sequentially arranged in a direction DL1 extending away from the side surface 30s1 of the logic chip 30B, and the electrodes PM1, PM2, PM3, and PM4 are sequentially arranged in a direction DL2 extending away from the side surface 30s2 of the memory chip 30A.

The plurality of wires 22B constituting the plurality of wiring paths WP2 each have one end at a position overlapping with the logic chip 30B in a thickness direction, and extend toward the memory chip 30A. Furthermore, each of the plurality of wires 22B has the other end portion at a position overlapping with the memory chip 30A. In other words, each of the plurality of wires 22B has one end at a position overlapping with the memory chip 30A in a thickness direction, extends toward the logic chip 30B, and has the other end at a position overlapping with the logic chip 30B in a thickness direction. Furthermore, in other words, each of the wires 22B is an inter-chip connection wire linearly connecting the memory chip 30A and the logic chip 30B with each other. Note that, as illustrated in FIG. 7, each of the plurality of wires 22B includes a bypass portion bypassing small around a contour of an electrode to pass between adjacent electrodes. The term "linearly connect" also includes a connection path having a small bypass portion around a contour of a conductor pattern in order to avoid contact with a small conductor pattern such as an electrode.

When the electrodes are connected with each other via the wire 22B extending from immediately under one of the semiconductor chips 30 to immediately under the other of the semiconductor chips 30, as in the wiring path WP2, a wiring path distance can be reduced in comparison with the wiring path WP1 illustrated in FIG. 6. Thus, in the wiring path WP2, a signal waveform is unlikely to be attenuated, in comparison with the wiring path WP1. Furthermore, in the wiring path WP2, influence of crosstalk noise between adjacent wiring paths can be reduced, in comparison with the wiring path WP1.

Furthermore, in the example illustrated in FIG. 6, no wiring path WP2 is formed in the wiring layers M5, M6, M7, and M8 positioned below the core layer 21c (on a side of the lower surface 20b) in which a plurality of through-hole wirings 24 are provided. In the example illustrated in FIG. 6, each of the plurality of wiring paths WP2 is formed in at least one or more of the wiring layers M1, M2, M3, or M4 positioned above the core layer 21c (on a side of the upper surface 20t). Connection only by using a wiring layer positioned above the core layer 21c, like the wiring path WP2, enables reduction of the wiring path distance, in comparison with a wiring path through a wiring layer below the core layer 21c, like the wiring path WP1.

Furthermore, from the viewpoint of improving reliability of signal transmission, it is preferable to increase the number of wiring paths capable of reducing the wiring path distance, like the wiring path WP2. Furthermore, arrangement of the wiring paths WP2 at high density can inhibit the increase of the number of wiring layers, even when the number of signal transmission paths increases.

In order to improve an arrangement density of a large number of wiring paths WP2, a portion at which the plurality of wiring paths WP2 three-dimensionally cross each other (hereinafter, referred to as three-dimensional crossing) is preferably reduced. When the plurality of wiring paths WP2 three-dimensionally cross each other, a plurality of via wirings and a plurality of wires are arranged thickly at a portion of the three-dimensional crossing. In this case, in order to avoid contact between the wiring paths WP2, an efficient wiring layout is interfered with, and the number of bypass wires or bypass via wirings is increased. When the portion at which the wiring paths WP2 three-dimensionally cross each other is reduced, the number of bypass wires or via wirings is reduced, and the arrangement density of the wiring paths WP2 can be improved.

Therefore, the plurality of first group electrodes GL1 and the plurality of first group electrodes GM1 which are connected to the plurality of wiring paths WP2 illustrated in FIG. 6 are arranged axisymmetrically relative to an intermediate point between the memory chip 30A and the logic chip 30B.

That is, the electrode PL1 provided in a column closest to the side surface 30s1 of the logic chip 30B, of the plurality of first group electrodes GL1, is connected with the electrode PM1 provided in a column closest to the side surface 30s2 of the memory chip 30A, of the plurality of first group electrodes GM1. Furthermore, the electrode PL2 provided in a column adjacent to the electrode PL1 is connected with the electrode PM2 provided in a column adjacent to the electrode PM1. Similarly, the electrode PL3 provided in a column adjacent to the electrode PL2 is connected with the electrode PM3 provided in a column adjacent to the electrode PM2, and the electrode PL4 provided in a column adjacent to the electrode PL3 is connected with the electrode PM4 provided in a column adjacent to the electrode PM3.

In other words, when the plurality of first group electrodes GL1 and GM1 have the first columns, the second columns, ... in order from the side surface 30s1 and the side surface 30s2 facing each other, the first group electrodes GL1 in the n-th column of the logic chip 30B and the first group electrodes GM1 in the n-th column of the memory chip 30A are electrically connected with each other, respectively. In the following description, such electrode arrangement method and connecting method are described as mirror arrangement.

As in the above description, when the plurality of first group electrodes GL1 and the plurality of first group electrodes GM1 are arranged in the mirror arrangement, the plurality of wiring paths WP2 are unlikely to three-dimensionally cross each other, in comparison with random connection between the plurality of first group electrodes GL1 and the plurality of first group electrodes GM1. Thus, employment of the mirror arrangement enables arrangement of the plurality of wiring paths WP2 at high density.

However, when the number of signal transmission paths increases, it is difficult to connect all of the signal transmission paths only by using the wiring paths WP2 arranged in the mirror arrangement. For example, as seen from the plurality of first group electrodes GL1 and the plurality of first group electrodes GM1 illustrated in FIG. 7, the wiring paths WP2 connected to the first group electrodes GL1 and GM1 respectively located at positions away from the side surfaces 30s1 and 30s2 are provided so as to pass between the first group electrodes GL1 and GM1 respectively located at positions relatively close to the side surfaces 30s1 and 30s2.

For example, of the plurality of first group electrodes GL1, the wiring paths WP2 connected to the electrodes PL4 in the fourth column are provided so as to pass between the plurality of electrodes PL3, the plurality of electrodes PL2, and the plurality of electrodes PL1, which are arranged closer to the side surface 30s1 relative to the electrodes PL4. Furthermore, of the plurality of first group electrodes GM1, the wiring paths WP2 connected to the electrodes PM4 in the fourth column are provided so as to pass between the plurality of electrodes PM3, the plurality of electrodes PM2, and the plurality of electrodes PM1, which are arranged closer to the side surface 30s2 relative to the electrode PM4.

Thus, when the number of wiring paths WP2 increases, a separation distance between electrodes needs to be increased, according to the increase of the number of wiring paths. As a result, the number of electrodes which can be arranged per unit area decreases, whereby the arrangement density of the plurality of wiring paths WP2 decreases. That is, there is a limit on the number of signal transmission paths to connect all signal transmission paths only using the wiring paths WP2 provided in the mirror arrangement.

Thus, when a required number of signal transmission paths exceeds a limit of the number of wiring paths WP2, part of the plurality of signal transmission paths needs to be connected using a wiring bypass bypassing a path linearly connecting the memory chip 30A and the logic chip 30B. In the examples illustrated in FIGS. 6 and 7, the plurality of wiring paths WP1 electrically connecting the plurality of second group electrodes GL2 and the plurality of second group electrodes GM2 to each other correspond to the wiring bypasses.

As illustrated in FIG. 6, each of the plurality of wiring paths WP1 of the interposer 20A includes a wire (signal wire) 22A, a wire (signal wire) 22C, and a wire (signal wire) 22D. The plurality of wires 22A constituting the plurality of wiring paths WP1 each have one end at a position overlapping with the logic chip 30B in a thickness direction and extend in a direction away from the memory chip 30A. Furthermore, the plurality of wires 22C constituting the plurality of wiring paths WP1 each have one end at a position overlapping with the memory chip 30A in a thickness direction and extend in a direction away from the logic chip 30B. Furthermore, the plurality of wires 22D constituting the plurality of wiring paths WP1 are each formed in the wiring layers M5, M6, M7, and M8, different from the wiring layers M1, M2, M3, and M4 in which the plurality of wires 22A are formed and the wiring layers M1, M2, M3, and M4 in which the plurality of wires 22C are formed. The plurality of wires 22D further electrically connect the plurality of wires 22A and the plurality of wires 22C with each other.

The wiring bypasses such as the plurality of wiring paths WP1 are arranged so as to bypass portions at which the plurality of wiring paths WP2 illustrated in FIG. 6 are arranged. Thus, increase of the number of wiring bypasses does not interfere with a layout of the plurality of wiring paths WP2. Accordingly, since the plurality of wiring paths WP1 are provided in addition to the plurality of wiring paths WP2, the number of signal transmission paths of the interposer 20A can be increased.

Note that, in a modification example of the present embodiment, the plurality of wires 22D constituting the plurality of wiring paths WP1 may be each formed in at least one or more of the wiring layers M1, M2, M3, or M4. However, this configuration increases a bypass distance for bypassing a portion at which a wiring path WP2 is arranged. Accordingly, from the viewpoint of reduction of the path distance of the wiring bypass, the plurality of wires 22D constituting the plurality of wiring paths WP1 are each preferably formed in the wiring layers M5, M6, M7, and M8, different from the wiring layers M1, M2, M3, and M4 in which the wires 22A, the wires 22B, and the wires 22C are formed, as in the present embodiment.

Figure 27:
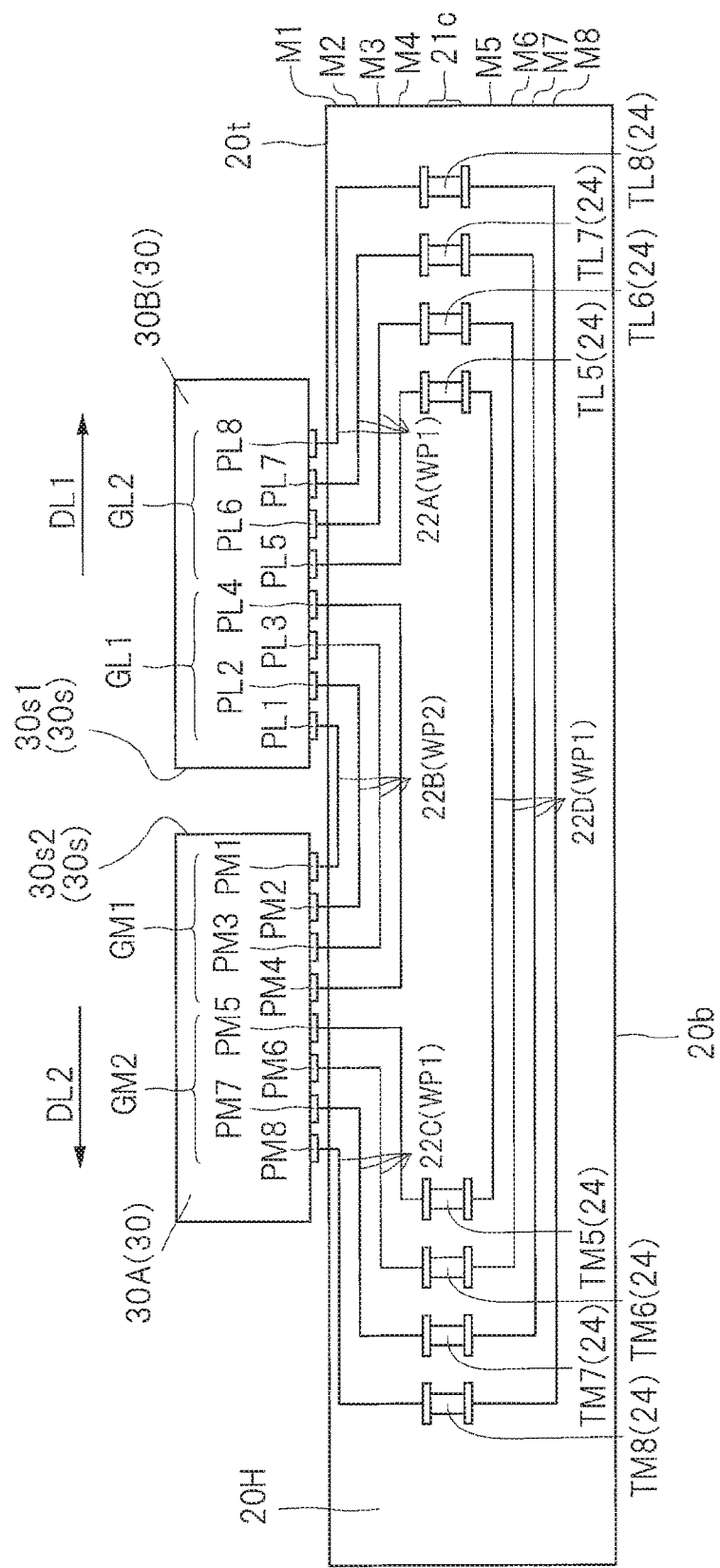
FIG. 27 is an explanatory diagram illustrating an examination example of FIG. 6.

Here, the present inventor examined a method of increasing the number of the plurality of wiring paths WP1 to further increase the number of signal transmission paths. FIG. 27 is an explanatory diagram illustrating an examination example of FIG. 6. An interposer 20H illustrated in FIG. 27 is different from the interposer 20A illustrated in FIG. 6 in that the plurality of wiring paths WP1 are connected in the mirror arrangement described above.

First, in order to improve the arrangement density of the plurality of wiring paths WP1 as the wiring bypasses, the present inventors examined the connecting method of connecting the plurality of second group electrodes GL2 and GM2 connected to the plurality of wiring paths WP1 in the mirror arrangement, as in the interposer 20H illustrated in FIG. 27. In the interposer 20H, all of the signal transmission paths are connected in the mirror arrangement, and thus, the arrangement densities of the wiring paths WP1 and the wiring paths WP2 can be improved.

However, as a result of the examination of the present inventors, it was found that, when the mirror arrangement is employed for the wiring paths WP1 as the wiring bypasses, there are following problems from the viewpoint of reliability in signal transmission. That is, in the mirror arrangement, connection is made in order from the electrodes provided at positions closer to the side surface 30s1 and the side surface 30s2, as illustrated in FIG. 27. Thus, the path distance is not constant between the plurality of wiring paths. For example, in the example illustrated in FIG. 27, the wiring path distance is considerably different between the wiring path WP1 connecting an electrode PL5 closest to the side surface 30s1 and an electrode PM5 closest to the side surface 30s2, and the wiring path WP1 connecting an electrode PL8 farthest from the side surface 30s1 and an electrode PM8 farthest from the side surface 30s2. When such mirror arrangement is employed, a difference in wiring path distance also occurs between the plurality of wiring paths WP2. However, each of the wiring paths WP2 originally has a small path distance, and therefore, the difference in path distance does not become so large.

However, the wiring path WP1 serving as the wiring bypass originally has a wiring path distance longer than that of the wiring path WP2, and therefore, the difference in wiring path distance tends to increase. Furthermore, when the wiring path WP1 includes the through-hole wiring 24 in the paths, as illustrated in FIG. 27, the wiring path WP1 has a bypass distance increasing according to an arrangement pitch between the through-hole wirings 24. As a result, the difference in wiring path distance tends to further increase.

Then, when the difference in wiring path distance increases between the plurality of signal transmission paths, a transmission delay error of each signal transmission path increases. In an EYE pattern (also referred to as EYE diagram) being an evaluation index of a high-speed transmission path for digital signal, when a transmission delay error of a signal transmission path increases, a width of an EYE aperture is reduced. When a wiring path distance is originally small, as in the wiring path WP2, a signal waveform is less attenuated, so that the signal waveform sharply rises, and an EYE aperture is originally large. As a result, even when the EYE aperture has a reduced width due to the propagation delay error, transmission reliability is less influenced. However, when a wiring path distance is originally large, as in the wiring path WP1, a signal waveform is more attenuated, so that the signal waveform gently rises. Therefore, an EYE aperture is originally small. Furthermore, when the EYE aperture has a reduced width due to a propagation delay error, transmission reliability is more influenced. In other words, when the EYE aperture has a reduced width due to the propagation delay error, reduction in transmission reliability may be caused.

Therefore, the present inventors examined a technique for reducing a difference in wiring path distance between the plurality of wiring paths WP1 having a relatively long wiring path distance, and the present inventors have found the configurations illustrated in FIGS. 6 to 8.

That is, the plurality of wiring paths WP1 of the interposer 20A according to the present embodiment have no mirror arrangement as described above. In the plurality of wiring paths WP1 of the interposer 20A, the plurality of second group electrodes GM2 and the plurality of second group electrodes GL2, connected with each other, are arranged in one direction DL1, in the same order.

Specifically, the plurality of second group electrodes GL2 of the logic chip 30B include electrodes (first electrodes) PL5, electrodes (second electrodes) PL6, electrodes PL7, and electrodes (third electrodes) PL8, arranged in the direction DL1 extending away from the side surface 30s1, in plan view. In the examples illustrated in FIGS. 6 and 7, the electrodes PL5 are arranged in the first column closest to the side surface 30s1. Furthermore, the electrodes PL8 are arranged in the fourth column farthest from the side surface 30s1.

Furthermore, the plurality of second group electrodes GM2 of the memory chip 30A include electrodes (fourth electrodes) PM5, electrodes (fifth electrodes) PM6, electrodes PM7, and electrodes (sixth electrodes) PM8, arranged in the direction DL1 extending toward the side surface 30s2, in plan view. In other words, the plurality of second group electrodes GM2 of the memory chip 30A include electrodes (sixth electrodes) PM8, electrodes PM7, electrodes (fifth electrodes) PM6, and electrodes (fourth electrodes) PM5, arranged in the direction DL2 extending away from the side surface 30s2, in plan view. In the examples illustrated in FIGS. 6 and 7, the electrodes PM5 are arranged in the fourth column farthest from the side surface 30s2. Furthermore, the electrodes PM8 are arranged in the first column closest to the side surface 30s2.

Then, the electrode PL5 of the logic chip 30B and the electrode PM5 of the memory chip 30A are electrically connected with each other via a wiring path WP1. Furthermore, the electrode PL6 of the logic chip 30B and the electrode PM6 of the memory chip 30A are electrically connected with each other via another wiring path WP1. Furthermore, the electrode PL7 of the logic chip 30B and the electrode PM7 of the memory chip 30A are electrically connected with each other via another wiring path WP1. Furthermore, the electrode PL8 of the logic chip 30B and the electrode PM8 of the memory chip 30A are electrically connected with each other via another wiring path WP1.

In other words, when the plurality of second group electrodes GL2 and GM2 have the first column, the second column, . . . , and the m-th column in order from the side surface 30s1 and the side surface 30s2 facing each other, the second group electrodes GL2 in the n-th column of the logic chip 30B and the second group electrodes GM2 in the (m-n)th column of the memory chip 30A are electrically connected, respectively. In such electrode arrangement, an arrangement order of the plurality of second group electrodes GM2 of the memory chip 30A, translated in parallel along the upper surface 20t of the interposer 20A, matches an arrangement order of the plurality of second group electrodes GL2 of the logic chip 30B. Accordingly, in the following description, an electrode arrangement method and a connecting method in which the plurality of second group electrodes GM2 and the plurality of second group electrodes GL2, connected with each other as described above, are arranged in one direction DL1, in the same order, are described as parallel translation arrangement.

When the parallel translation arrangement is adopted for the wiring paths WP1 serving as the wiring bypasses, as in the present embodiment, the plurality of wiring paths WP1 three-dimensionally cross each other on the paths, as illustrated in FIG. 6. The method of three-dimensionally crossing the plurality of wiring paths WP1 will be described later in detail. When the plurality of wiring paths WP1 three-dimensionally cross in this manner, a difference in path distance between the plurality of wiring paths WP1 can be reduced, as can be seen in comparison between the wiring paths WP1 illustrated in FIG. 6 and the wiring paths WP1 illustrated in FIG. 27.

For example, in FIG. 6, of the plurality of wires 22A, the wire 22A having the largest wire length is the wire 22A connected with the electrode PL8 and routed in the wiring layer M1 (uppermost wiring layer). Furthermore, of the plurality of wires 22C, the wire 22C having the smallest wire length is the wire 22C connected with the electrode PM8 and routed in the wiring layer M4 (lowermost wiring layer of wiring layers above the core layer 21c). Meanwhile, of the plurality of wires 22A illustrated in FIG. 6, the wire 22A having the smallest wire length is the wire 22A connected with the electrode PL5 and routed in the wiring layer M4. Furthermore, of the plurality of wires 22C, the wire 22C having the largest wire length is the wire 22C connected with the electrode PM4 and routed in the wiring layer M1.

In the present embodiment, the wire 22A having the largest wire length and the wire 22C having the smallest wire length are connected with each other to constitute one of the wiring paths WP1. Furthermore, in the present embodiment, the wire 22A having the smallest wire length and the wire 22C having the largest wire length are connected with each other to constitute another one of the wiring paths WP1. Furthermore, as illustrated in FIGS. 6 and 8, the wires 22D each have a similar length (within a range of error, which can be considered as an identical length, in terms of reliability of signal transmission). Thus, according to the present embodiment, the wires 22A, the wires 22C, and the wires 22D constituting the respective wiring paths WP1 can have an equal total length. The present inventors have examined application thereof to a semiconductor device including approximately 1,000 signal transmission paths and found that application of the parallel translation arrangement described above to the plurality of wiring paths WP1 can suppress a difference in path distance between the plurality of wiring paths WP1 to at least below 1 mm. Note that, according to the examination by the present inventors, for example, a mirror arrangement illustrated in FIG. 27 has a difference in path distance of approximately 15 mm between the plurality of wiring paths WP1.

As described above, according to the present embodiment, application of the parallel translation arrangement described above to the plurality of wiring paths WP1 serving as the wiring bypasses can equalize the lengths of the plurality of wiring paths WP1. Thus, transmission delay error can be reduced in each signal transmission path. As a result, the reliability of signal transmission can be improved in the wiring path WP1 having a longer path distance than that of the wiring path WP2. Furthermore, the plurality of wiring paths WP1 can be used as the signal transmission paths, in addition to the plurality of wiring paths WP2, and thus, even when the number of signal transmission paths is increased, increase of the number of wiring layers can be prevented.

Furthermore, as in the present embodiment, when the wiring paths WP1 each include the through-hole wirings 24 penetrating the core layer 21c, the through-hole wirings 24 have a preferable mode also in arrangement.

That is, as illustrated in FIGS. 6 to 8, the plurality of through-hole wirings 24 include through-hole wirings (first through-hole wirings) TL5, through-hole wirings (second through-hole wirings) TL6, through-hole wirings TL7, and through-hole wirings (third through-hole wirings) TL8, arranged in the direction DL1 extending away from the side surface 30s1 of the logic chip 30B. Furthermore, the plurality of through-hole wirings 24 include through-hole wirings (fourth through-hole wirings) TM5, through-hole wirings (fifth through-hole wirings) TM6, through-hole wirings TM7, and through-hole wirings (sixth through-hole wirings) TM8, arranged in the direction DL1 extending toward the side surface 30s2 of the memory chip 30A.

Then, the electrode PL5 of the logic chip 30B and the electrode PM5 of the memory chip 30A are electrically connected with each other via the through-hole wiring TL5 and the through-hole wiring TM5. Furthermore, the electrode PL6 of the logic chip 30B and the electrode PM6 of the memory chip 30A are electrically connected with each other via the through-hole wiring TL6 and the through-hole wiring TM6. Furthermore, the electrode PL7 of the logic chip 30B and the electrode PM7 of the memory chip 30A are electrically connected with each other via the through-hole wiring TL7 and the through-hole wiring TM7. Furthermore, the electrode PL8 of the logic chip 30B and the electrode PM8 of the memory chip 30A are electrically connected with each other via the through-hole wiring TL8 and the through-hole wiring TM8.

In other words, when the plurality of second group electrodes GL2 and the plurality of through-hole wirings 24 have the first column, the second column, . . . , and the m-th column in order from the side surface 30s1, the second group electrodes GL2 in the n-th column of the logic chip 30B and the through-hole wirings 24 in the n-th column are electrically connected, respectively. Furthermore, when the plurality of through-hole wirings 24 have the first column, the second column, . . . , and the m-th column in order from the side surface 30s2, the second group electrodes GM2 in the n-th column of the memory chip 30A and the through-hole wirings 24 in the n-th column are electrically connected, respectively. Then, the through-hole wiring 24 in the n-th column close to the logic chip 30B, and the through-hole wiring 24 in the (m-n)th column close to the memory chip 30A are electrically connected with each other.

Furthermore, in other words, in the present embodiment, the plurality of second group electrodes GL2 and GM2, and the plurality of through-hole wirings 24 are arranged in the same order in the direction DL1.

<Details of Three-Dimensional Crossing of Plurality of Wiring Paths>

Next, the method of three-dimensionally crossing the plurality of wiring paths WP1 will be described in detail. The term "three-dimensional crossing of wiring paths" in the present application can be defined in the following modes. First, it is assumed that an interposer includes a plurality of first wiring paths (signal transmission paths) respectively routed via a plurality of first wires in an arbitrary first wiring layer, and a plurality of second wiring paths (signal transmission paths) respectively routed via a plurality of second wires in a second wiring layer different from the first wiring layer. A plurality of first interlayer conductive paths connected to the plurality of first wiring paths are arranged in the second wiring layer. Furthermore, a plurality of second interlayer conductive paths connected to the plurality of second wiring paths are arranged in the first wiring layer.

Here, when part or all of the plurality of second interlayer conductive paths are arranged between the plurality of first wires, in the first wiring layer, each of the plurality of first wiring paths and each of the plurality of second wiring paths are three-dimensionally crossed, in the first wiring layer. Furthermore, when part or all of the plurality of first wires are arranged between the plurality of second interlayer conductive paths, in the first wiring layer, each of the plurality of first wiring paths and each of the plurality of second wiring paths are three-dimensionally crossed, in the first wiring layer. Furthermore, when part or all of the plurality of first interlayer conductive paths are arranged between the plurality of second wires, in the second wiring layer, each of the plurality of first wiring paths and each of the plurality of second wiring paths are three-dimensionally crossed, in the second wiring layer. Furthermore, when part or all of the plurality of second wires are arranged between the plurality of first interlayer conductive paths, in the second wiring layer, each of the plurality of first wiring paths and each of the plurality of second wiring paths are three-dimensionally crossed, in the second wiring layer.

Furthermore, the above-described term "routed" represents a connected state of an upper layer connecting-interlayer conductive path and a lower layer connecting-interlayer conductive path, via a wire, in one wiring layer of a plurality of stacked wiring layers. The upper layer connecting-interlayer conductive path is connected with the wiring layer immediately above the one wiring layer, and the lower layer connecting-interlayer conductive path is connected with the wiring layer immediately under the one wiring layer and arranged at a position different from that of the upper layer connecting-interlayer conductive path.

The definition of "three-dimensional crossing of wiring paths" described above can be also expressed as follows. That is, "three-dimensional crossing of wiring paths" represents "a state in which a wire constituting a wiring path is arranged between a plurality of via wirings constituting a plurality of other wiring paths routed in other wiring layers, in one wiring layer." Furthermore, "three-dimensional crossing of wiring paths" represents "a state in which, in one wiring layer, a via wiring constituting another wiring path routed in another wiring layer, is arranged between a plurality of wires constituting a plurality of wiring paths routed in the one wiring layer."

According to the definition described above, for example, when a plurality of wires provided in different wiring layers cross each other in plan view, the crossing thereof is not included in "three-dimensional crossing of wiring paths." In the following description, a specific example of three-dimensional crossing of wiring paths, and preferred modes of a portion of three-dimensional crossing will be described in detail with reference to the drawings.

Figure 10:
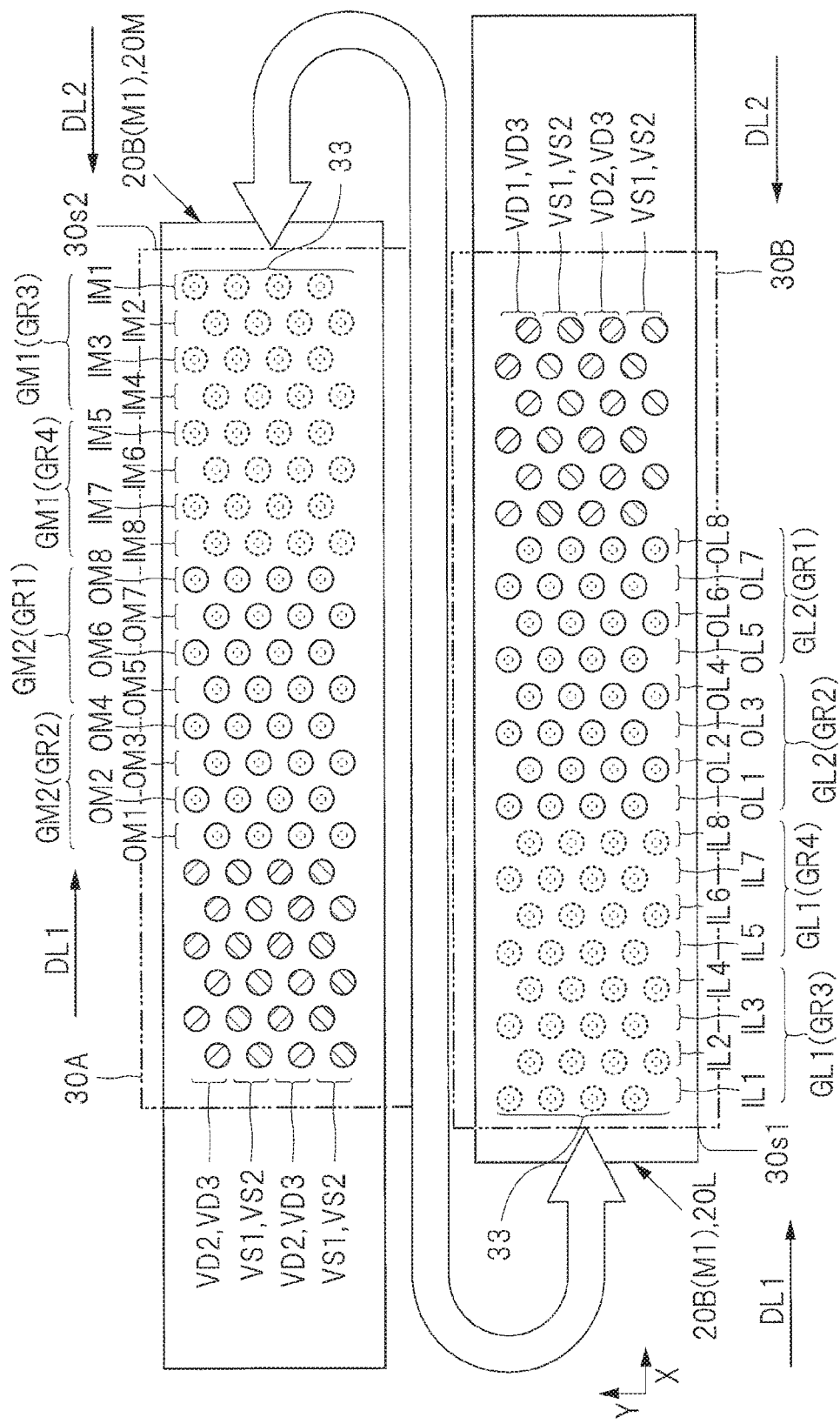
FIG. 10 is an explanatory diagram schematically illustrating an exemplary layout of signal transmission paths in the first wiring layer of an interposer illustrated in FIG. 9.

In the section <Details of Transmission Paths Electrically Connecting Semiconductor Chips> described above, for convenience of understanding the technical scope of the present invention, the embodiment of the four columns of the first group electrodes GL1, the second group electrodes GL2, the first group electrodes GM1, and the second group electrodes GM2 has been described, as illustrated in FIG. 6. In this section, for description of the "three-dimensional crossing of wiring paths," an interposer 20B will be used for description, in which the first group electrodes GL1, the second group electrodes GL2, the first group electrodes GM1, and the second group electrodes GM2 are divided into two groups, as illustrated in FIG. 10. However, the interposer 20B has a structure similar to that of the interposer 20A, excluding a difference between the interposer 20A (see FIG. 6) and the interposer 20B, which will be described below. Therefore, repeated description will be omitted, but the interposer 20B can be replaced with the interposer 20A, excluding the difference described below.

Figure 9:
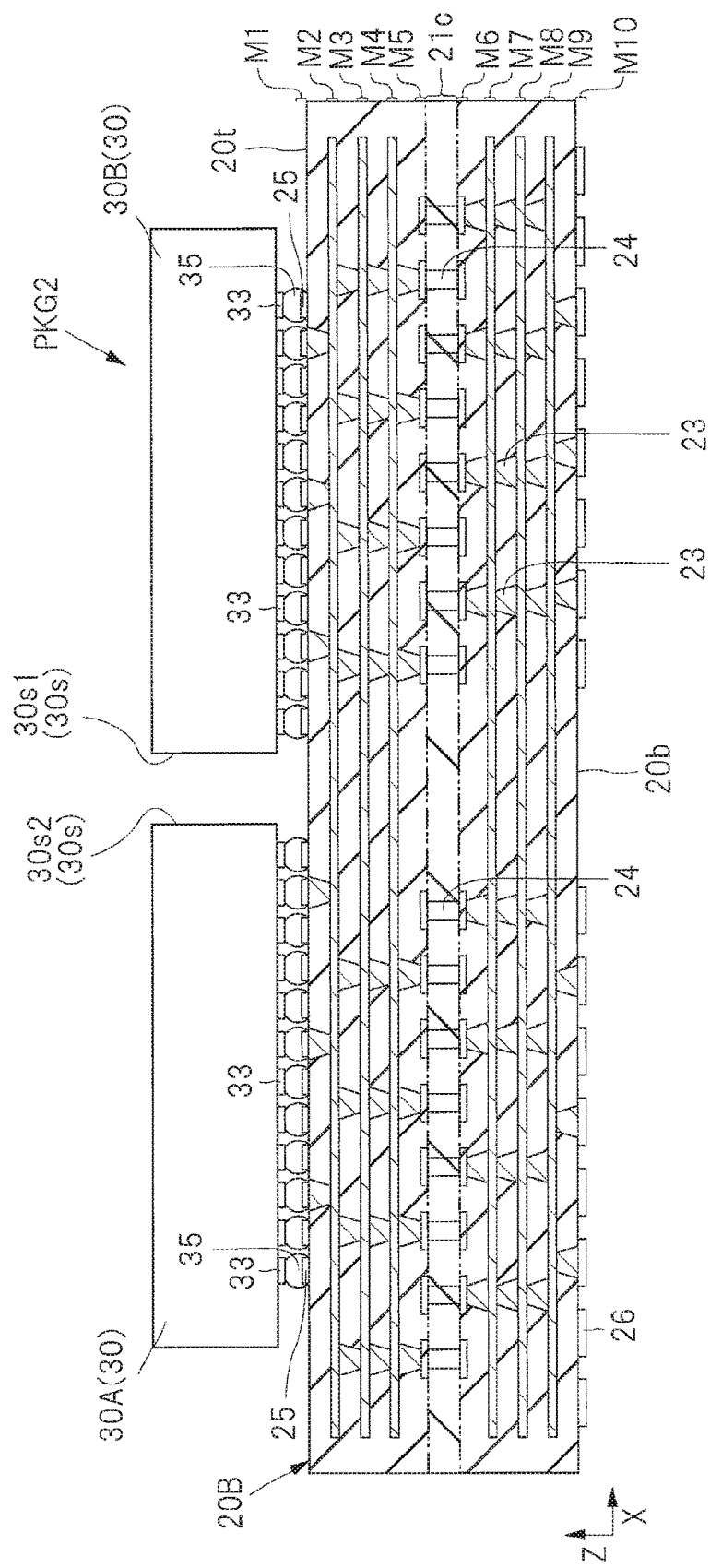
FIG. 9 is a schematic cross-sectional view of a main portion of a semiconductor device being a modification example of the semiconductor device illustrated in FIGS. 5 to 8.
Figure 11:
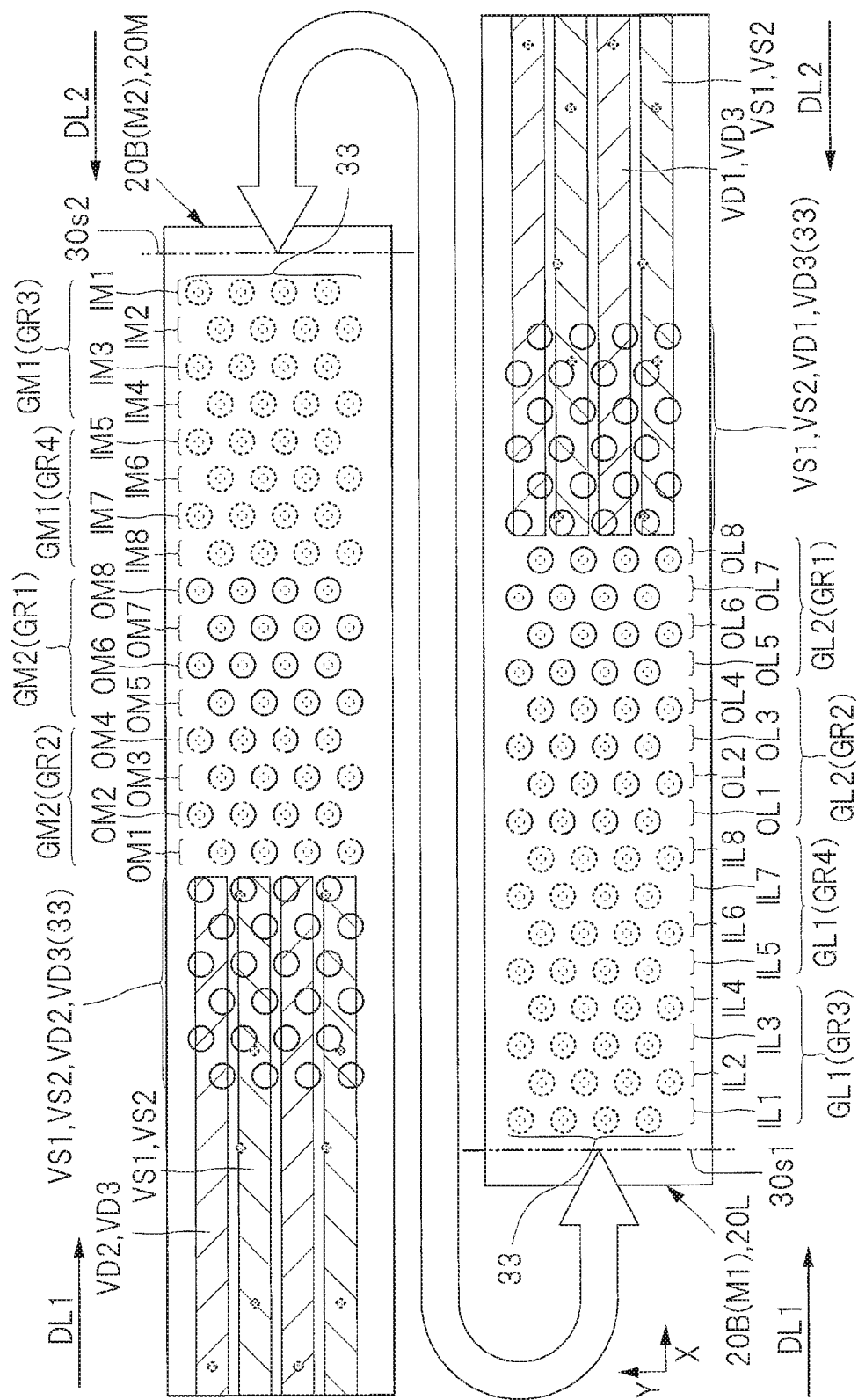
FIG. 11 is an explanatory diagram schematically illustrating an exemplary layout of signal transmission paths in the second wiring layer of the interposer illustrated in FIG. 9.
Figure 12:
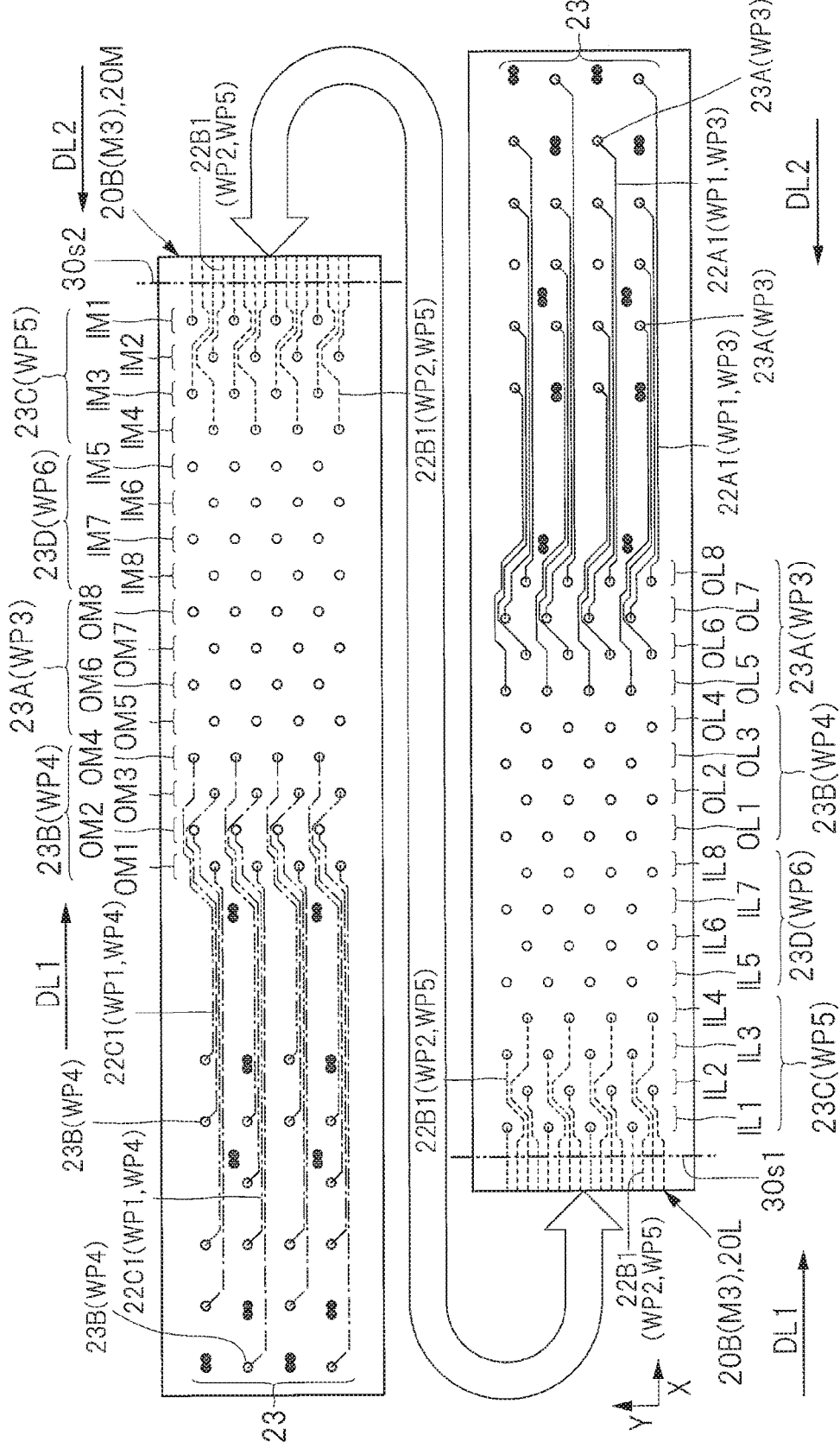
FIG. 12 is an explanatory diagram schematically illustrating an exemplary layout of signal transmission paths in the third wiring layer of the interposer illustrated in FIG. 9.
Figure 13:
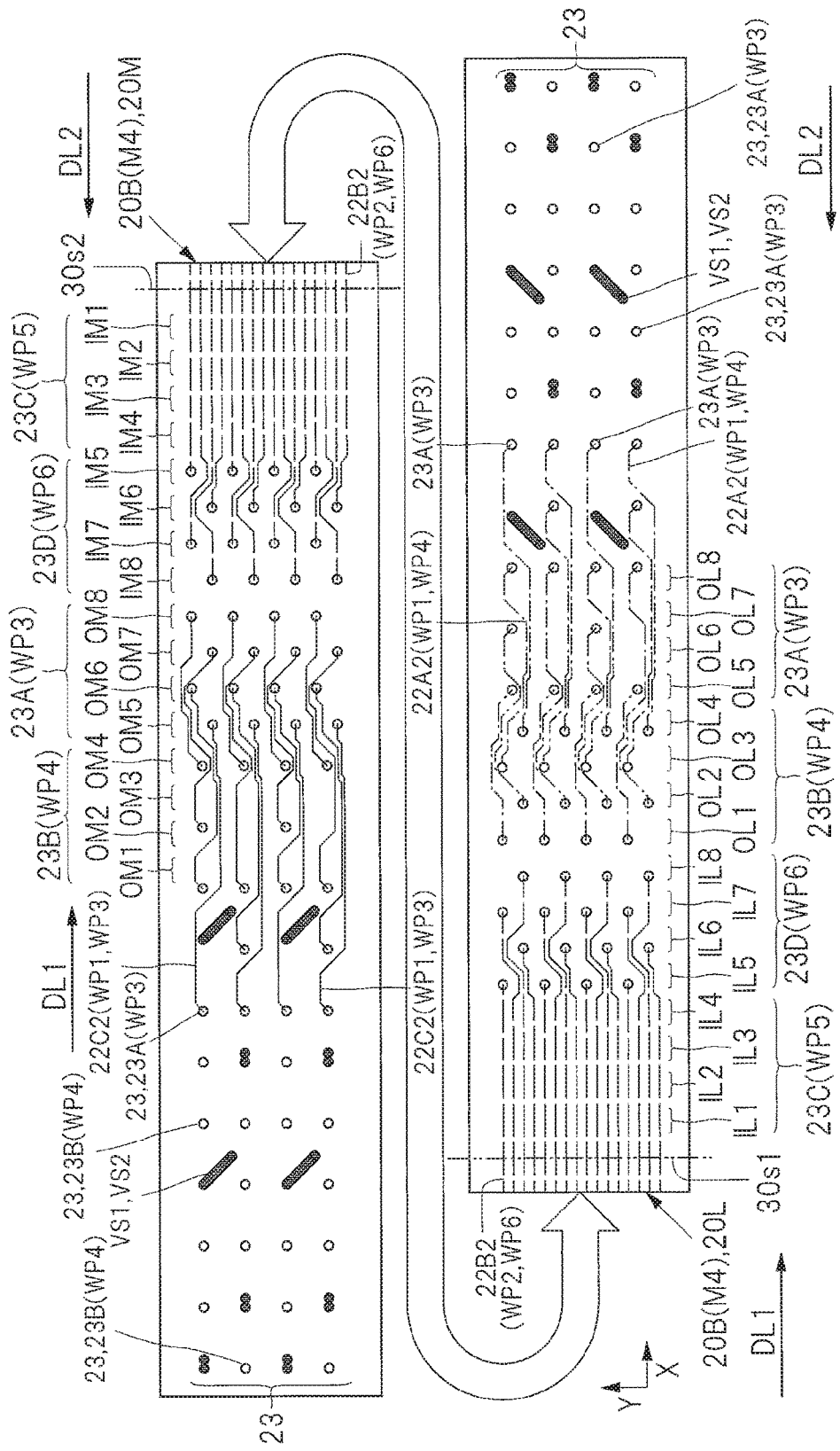
FIG. 13 is an explanatory diagram schematically illustrating an exemplary layout of signal transmission paths in the fourth wiring layer of the interposer illustrated in FIG. 9.
Figure 14:
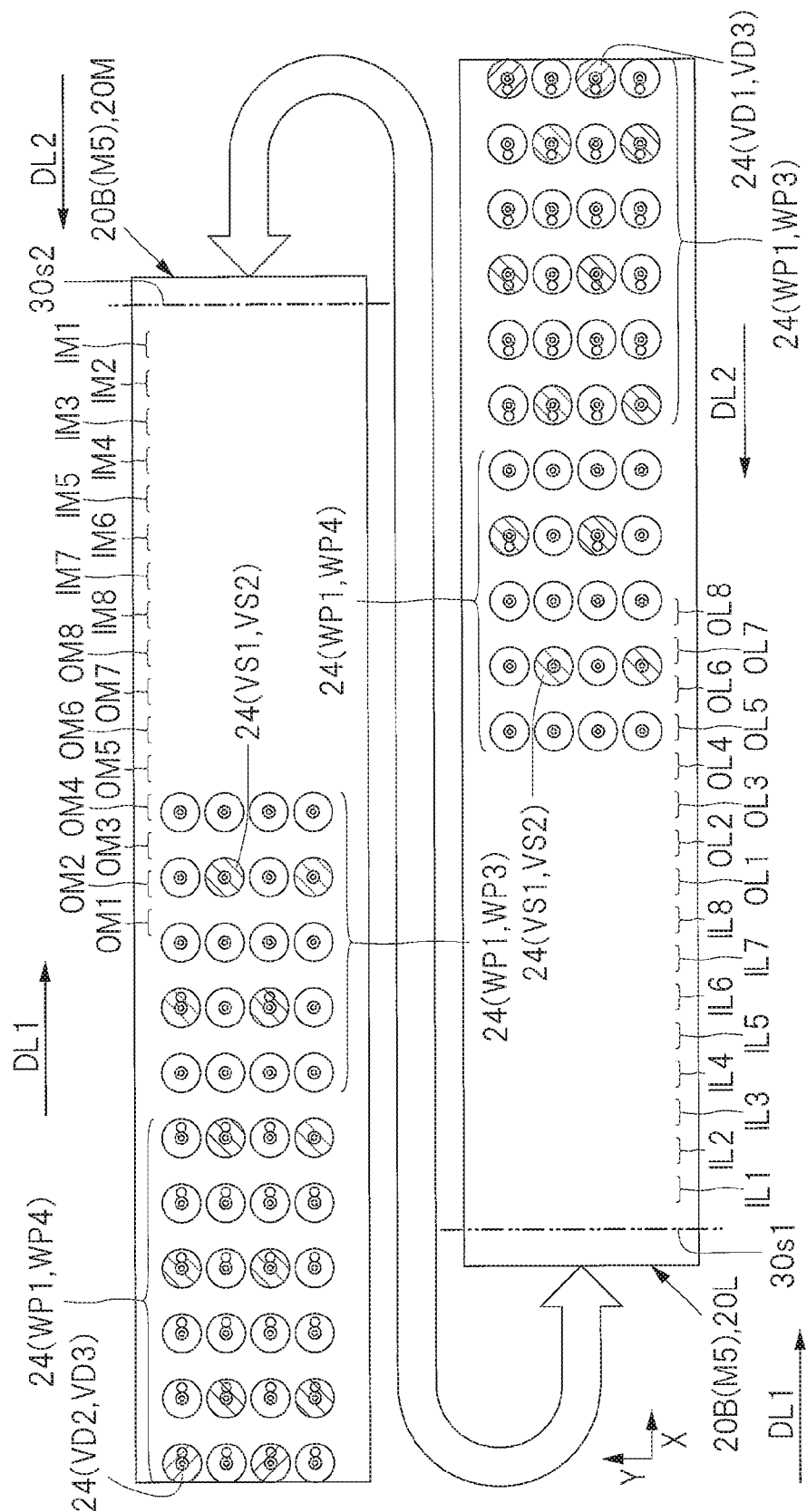
FIG. 14 is an explanatory diagram schematically illustrating an exemplary layout of signal transmission paths in the fifth wiring layer of the interposer illustrated in FIG. 9.
Figure 15:
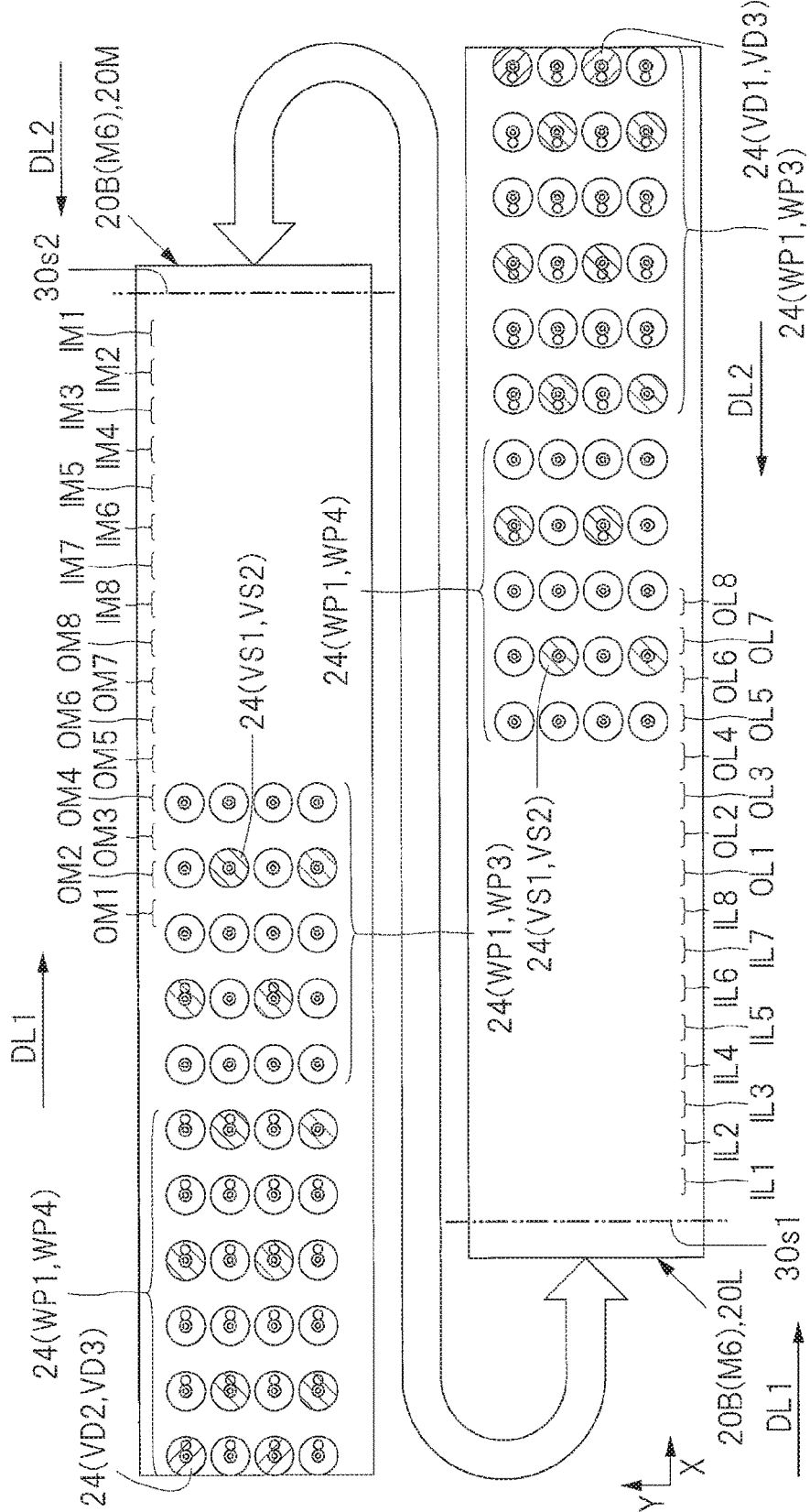
FIG. 15 is an explanatory diagram schematically illustrating an exemplary layout of signal transmission paths in the sixth wiring layer of the interposer illustrated in FIG. 9.
Figure 16:
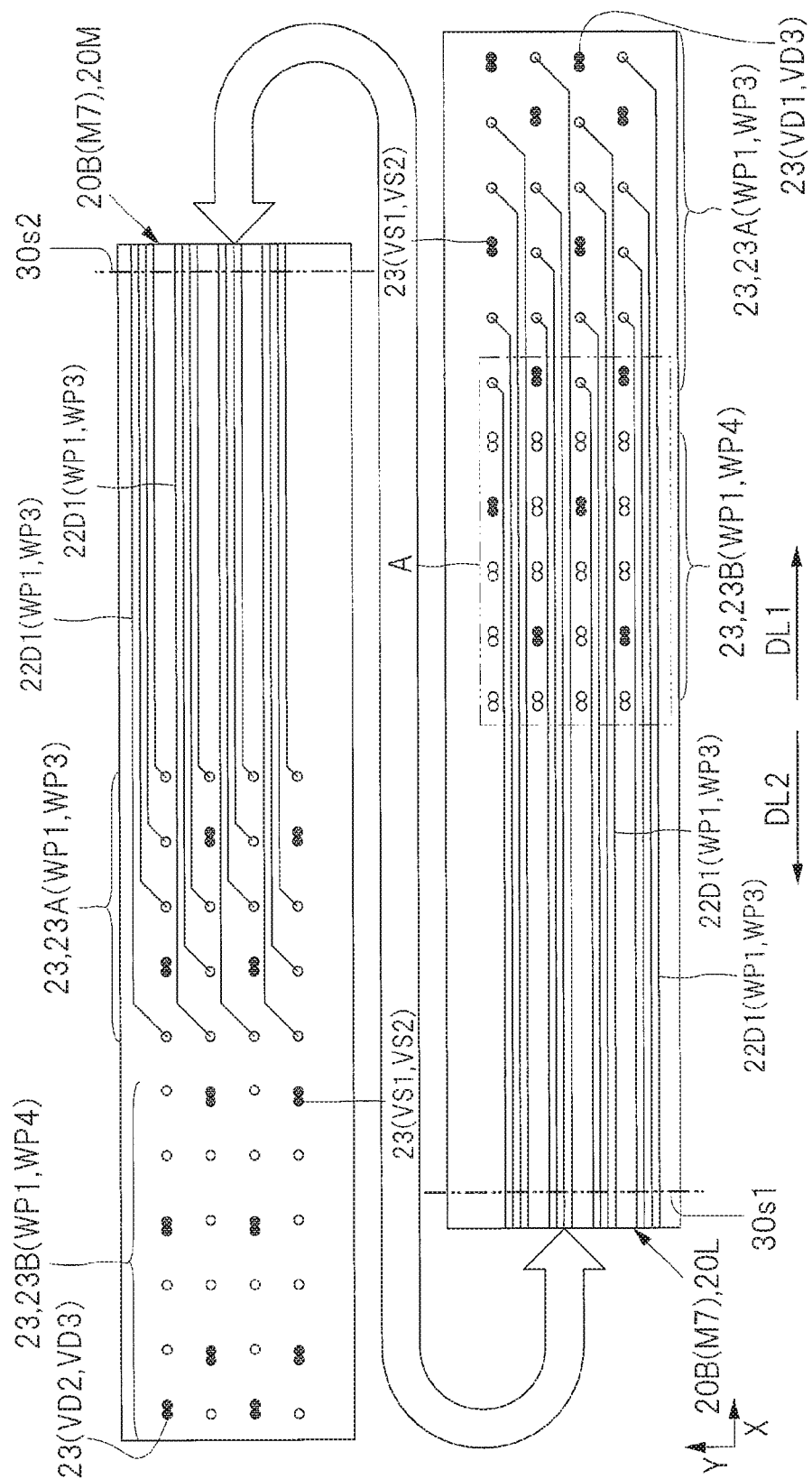
FIG. 16 is an explanatory diagram schematically illustrating an exemplary layout of signal transmission paths in the seventh wiring layer of the interposer illustrated in FIG. 9.
Figure 17:
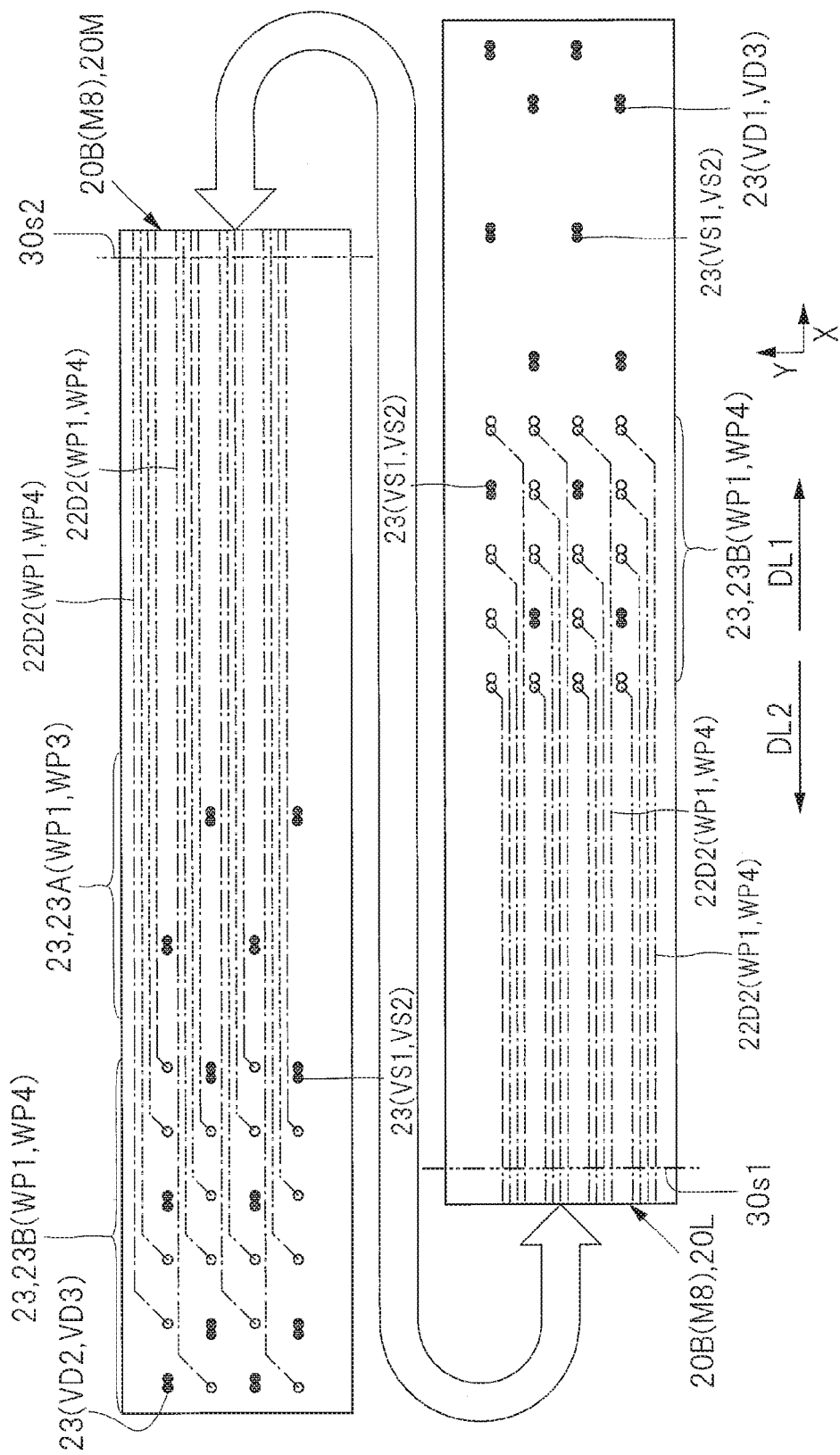
FIG. 17 is an explanatory diagram schematically illustrating an exemplary layout of signal transmission paths in the eighth wiring layer of the interposer illustrated in FIG. 9.

FIG. 9 is a schematic cross-sectional view of a main portion of a semiconductor device being a modification example of the semiconductor device illustrated in FIGS. 5 to 8. Also, FIGS. 10 to 17 are explanatory diagrams schematically illustrating exemplary layouts of signal transmission paths of an interposer illustrated in FIG. 9. More specifically, FIG. 10 illustrates the first wiring layer M1 positioned on a side of a chip mounting surface illustrated in FIG. 9, FIG. 11 illustrates the second wiring layer M2 positioned immediately under the first wiring layer, FIG. 12 illustrates the third wiring layer M3 immediately under the second wiring layer, and FIG. 13 illustrates the fourth wiring layer M4 immediately under the third wiring layer. Furthermore, FIG. 14 illustrates the fifth wiring layer M5 immediately under the fourth wiring layer, and FIG. 15 illustrates the sixth wiring layer M6 positioned on an opposite side of the fifth wiring layer. The interposer 20B illustrated in FIG. 9 has a core layer 21c provided between the wiring layer M5 and the wiring layer M6, and the wiring layer M5 and the wiring layer M6 are connected with each other via a plurality of through-hole wirings 24. Furthermore, FIG. 16 illustrates the seventh wiring layer M7 immediately under the sixth wiring layer, and FIG. 17 illustrates the eighth wiring layer M8 immediately under the seventh wiring layer.

Note that, since the signal transmission paths electrically connecting the semiconductor chips 30 are mainly formed in the wiring layer M1 to the wiring layer M8 illustrated in FIG. 9, plan views of wiring layers M9 and M10 illustrated in FIG. 9 are omitted. The wiring layer M9 illustrated in FIG. 9 mainly includes the power supply lines VD1, VD2, and VD3 supplying power supply potential, the reference potential lines VS1 and VS2 supplying reference potential, or the signal line SIG transmitting a signal between the logic chip 30B and the external device 40, of the plurality of wiring paths described with reference to FIG. 4. Furthermore, the wiring layer M10 illustrated in FIG. 9 includes the plurality of lower surface terminals 26 connected with the wiring substrate 10 illustrated in FIG. 5.

Furthermore, a semiconductor device PKG2 illustrated in FIG. 9 has the interposer 20B, and the interposer 20B is mounted over the wiring substrate 10, in the same manner as the interposer 20A illustrated in FIG. 5. However, as described above, since the signal transmission paths electrically connecting the semiconductor chips 30 are mainly formed in the wiring layer M1 to the wiring layer M8 illustrated in FIG. 9, illustration thereof is omitted in FIG. 9. The wiring substrate 10 includes the power supply lines VD1, VD2, and VD3 supplying power supply potential, the reference potential lines VS1 and VS2 supplying reference potential, or the signal line SIG transmitting a signal between the logic chip 30B and the external device 40, of the plurality of wiring paths described with reference to FIG. 4.

Furthermore, as illustrated in FIG. 9, the plurality of upper surface terminals 25 are formed in the first wiring layer M1 of the interposer 20B, and the plurality of electrodes 33 of the semiconductor chips 30 are arranged at positions facing the plurality of upper surface terminals 25, respectively. However, in FIGS. 10 and 11, the positions of the plurality of electrodes 33 are indicated by a solid line (plurality of first group electrodes GM1 and GL1 are indicated by a dotted line) to show a positional relation between the plurality of electrodes 33 and the plurality of wiring paths in plan view. Furthermore, in FIGS. 12 to 17, for viewability and in order to easily understand a positional relation with FIG. 10 or 11 in plan view, the electrodes are denoted by reference characters indicating the types of the electrodes as in FIGS. 10 and 11.

In addition, it is difficult to illustrate the whole upper surface of the interposer 20B illustrated in FIG. 9 and a detail of the wiring paths in one drawing. Therefore, in FIGS. 10 to 17, of the interposer 20B, a partial region 20M of the memory chip 30A in the periphery of its mounting region illustrated in FIG. 9 is illustrated on the upper side of each drawing, and a partial region 20L of the logic chip 30B in the periphery of its mounting region illustrated in FIG. 9 is illustrated on the lower side of each drawing. Accordingly, as schematically illustrated with a double-headed arrow in FIGS. 10 to 17, the side surface 30s1 of the logic chip 30B (see FIG. 10) and the side surface 30s2 of the memory chip 30A (see FIG. 10) face each other.

Furthermore, the wiring paths illustrated in FIGS. 10 to 17 include the power supply lines VD1, VD2, and VD3 supplying power supply potential, and the reference potential lines VS1 and VS2 supplying reference potential, of the plurality of wiring paths described with reference to FIG. 4. Therefore, in FIGS. 10 to 17, for distinction between the signal transmission path and a power supply path, a supply path for power supply potential and a supply path for reference potential have respective patterns. In FIGS. 10 and 11, the power supply lines VD1, VD2, and VD3 supplying power supply potential, and the reference potential lines VS1 and VS2 supplying reference potential are differently hatched. Furthermore, in FIG. 11, the electrodes 33 supplying power supply potential, and the electrodes 33 supplying reference potential are differently hatched. Furthermore, in FIGS. 12, 13, 16, and 17, the via wirings supplying power supply potential and the via wirings supplying reference potential are filled. Furthermore, in FIGS. 14 and 15, the through-hole wirings 24 supplying power supply potential, and the through-hole wirings supplying reference potential are differently hatched.

The interposer 20B illustrated in FIG. 10 has a larger number of columns of electrodes 33 than those of the interposer 20A illustrated in FIG. 7 (see FIG. 9). The logic chip 30B includes a plurality of first group electrodes GL1, and the plurality of first group electrodes GL1 include electrodes IL1, IL2, IL3, IL4, IL5, IL6, IL7, and IL8 sequentially arranged in a direction DL1 extending away from the side surface 30s1 of the logic chip 30B. Furthermore, the plurality of second group electrodes GL2 of the logic chip 30B include electrodes OL1, OL2, OL3, OL4, OL5, OL6, OL7, and OL8 sequentially arranged in the direction DL1 extending away from the side surface 30s1 of the logic chip 30B. Furthermore, the plurality of first group electrodes GM1 of the memory chip 30A include electrodes IM1, IM2, IM3, IM4, IM5, IM6, IM7, and IM8 sequentially arranged in a direction DL2 extending away from the side surface 30s2 of the memory chip 30A. Furthermore, the plurality of second group electrodes GM2 of the memory chip 30A include electrodes OM1, OM2, OM3, OM4, OM5, OM6, OM7, and OM8 sequentially arranged in the direction DL1 opposite to the direction DL2 extending away from the side surface 30s2 of the memory chip 30A.

Furthermore, in examples described with reference to the interposer 20B illustrated in FIGS. 9 to 17, for description of "three-dimensional crossing of wiring paths" described above, the wiring paths WP1 and the wiring paths WP2 illustrated in FIGS. 5 to 8 are divided into two groups, according to a wiring layer on which routing is performed.

That is, as illustrated in FIG. 12 or 13, the plurality of wiring paths WP1 include wiring paths (signal wiring path) WP3 routed via a plurality of wires (signal wires) 22A1 formed in the wiring layer M3 (see FIG. 12) in the region 20L, wiring paths (signal wiring path) WP4 routed via a plurality of wires (signal wires) 22A2 formed in the wiring layer M4 (see FIG. 13) in the region 20L.

Furthermore, as illustrated in FIG. 12 or 13, the plurality of wiring paths WP2 include wiring paths (signal wiring paths) WP5 routed via a plurality of wires (signal wires) 22B1 formed in the wiring layer M3 (see FIG. 12) in the region 20L, and wiring paths (signal wiring paths) WP6 routed via a plurality of wires (signal wires) 22B2 formed in the wiring layer M4 (see FIG. 13) in the region 20L.

In FIGS. 12 to 17, types of the wiring paths are distinguished by line shapes. That is, the wire 22A1 (see FIG. 12), a wire 22C2 (see FIG. 13), and a wire 22D1 (see FIG. 16) partially constituting the wiring path WP3 are each indicated by a solid line. Furthermore, a wire (signal wires) 22C1 (see FIG. 12), the wire 22A2 (see FIG. 13), and a wire 22D2 (signal wire) (see FIG. 17) partially constituting the wiring path WP4 are each indicated by a one-dot chain line. Furthermore, the wire 22B1 (see FIG. 12) partially constituting the wiring path WP5 is indicated by a dotted line. Furthermore, the wire 22B2 (see FIG. 13) partially constituting the wiring path WP6 is indicated by a dashed line having a dash longer than a dot of the dotted line indicating the wire 22B1.

Furthermore, the plurality of via wirings 23 illustrated in FIG. 9 are also divided according to a wiring path to which a corresponding via wiring 23 is connected, as described above. That is, as illustrated in FIGS. 12 to 17, the plurality of via wirings 23 (see FIG. 9) include a via wiring 23A partially constituting the wiring path WP3, a via wiring 23B partially constituting the wiring path WP4, a via wiring 23C partially constituting the wiring path WP5, and a via wiring 23D partially constituting the wiring path WP6.

Furthermore, the logic chip 30B and the memory chip 30A illustrated in FIG. 10 each have the plurality of electrodes 33 for signal transmission (see FIG. 9), and the electrodes 33 are divided as follows, according to a wiring path to which a corresponding electrode 33 is connected.

That is, the plurality of first group electrodes GL1 of the logic chip 30B, and the plurality of first group electrodes GM1 of the memory chip 30A respectively include electrode groups GR3 connected via the wiring paths WP5 illustrated in FIG. 12, and electrode groups GR4 connected via the wiring paths WP6 illustrated in FIGS. 12 and 13. The electrode group GR3 of the logic chip 30B includes the electrodes IL1, IL2, IL3, and IL4. Furthermore, the electrode group GR3 of the memory chip 30A includes the electrodes IM1, IM2, IM3, and IM4, which are respectively connected with the electrodes IL1, IL2, IL3, and IL4, via the wiring paths WP5.

Furthermore, the electrode group GR4 of the logic chip 30B includes the electrodes IL5, IL6, IL7, and IL8. Furthermore, the electrode group GR4 of the memory chip 30A includes the electrodes IM5, IM6, IM7, and IM8, which are respectively connected with the electrodes IL5, IL6, IL7, and IL8, via the wiring paths WP6.

Furthermore, the plurality of second group electrodes GL2 of the logic chip 30B, and the plurality of second group electrodes GM2 of the memory chip 30A include electrode groups GR1 connected via the wiring paths WP3 illustrated in FIGS. 12 to 16, and electrode groups GR2 connected via the wiring paths WP4 illustrated in FIGS. 12 to 17. The electrode group GR1 of the logic chip 30B includes the electrodes OL5, OL6, OL7, and OL8. Furthermore, the electrode group GR1 of the memory chip 30A includes the electrodes OM5, OM6, OM7, and OM8, which are respectively connected with the electrodes OL5, OL6, OL7, and OL8, via the wiring paths WP3. Furthermore, the electrode group GR2 of the logic chip 30B includes the electrodes OL1, OL2, OL3, and OL4. Furthermore, the electrode group GR2 of the memory chip 30A includes the electrodes OM1, OM2, OM3, and OM4, which are respectively connected with the electrodes OL1, OL2, OL3, and OL4, via the wiring paths WP4.

In the following description, a connecting method of the interposer 20B illustrated in FIGS. 9 to 17 will be described. First, the wiring paths WP5 (see FIG. 12) connecting the electrode groups GR3 provided at positions relatively close to the side surface 30s1 and the side surface 30s2, of the plurality of first group electrodes GL1 of the logic chip 30B and the plurality of first group electrodes GM1 of the memory chip 30A, illustrated in FIG. 10, are routed via the wires 22B1 formed in the wiring layer M3 illustrated in FIG. 12. Each of the wires 22B1 has one end (via wiring 23C) at a position overlapping with the logic chip 30B (see FIG. 10) in a thickness direction, and extends toward the memory chip 30A (see FIG. 10). Furthermore, the wire 22B1 has the other end (via wiring 23C) located at a position overlapping with the memory chip 30A in a thickness direction. The wiring layer M1 illustrated in FIG. 10 to the wiring layer M3 illustrated in FIG. 12 are connected via the via wirings 23C (see FIG. 12) stacked so as to overlap with each other in a thickness direction. Furthermore, no wiring path WP5 is formed in a wiring layer below the wiring layer M3 illustrated in FIG. 12. That is, the wiring paths WP5 electrically connecting the plurality of electrodes constituting the electrode groups GR3 are mainly routed in the wiring layer M3.

Furthermore, the wiring paths WP6 (see FIG. 13) connecting the electrode groups GR4 provided at positions apart from the side surface 30s1 and the side surface 30s2, relative to the electrode groups GR3, of the plurality of first group electrodes GL1 of the logic chip 30B and the plurality of first group electrodes GM1 of the memory chip 30A, illustrated in FIG. 10, are routed via wires 22B2 formed in the wiring layer M4 illustrated in FIG. 13. Each of the wires 22B2 has one end (via wiring 23D) at a position overlapping with the logic chip 30B (see FIG. 10) in a thickness direction, and extends toward the memory chip 30A (see FIG. 10). Furthermore, the wire 22B2 has the other end (via wiring 23D) located at a position overlapping with the memory chip 30A in a thickness direction. The wiring layer M1 illustrated in FIG. 10 to the wiring layer M4 illustrated in FIG. 13 are connected via the via wirings 23D (see FIGS. 12 and 13) stacked so as to overlap with each other in a thickness direction. Furthermore, no wiring path WP6 is formed in a wiring layer below the wiring layer M4 illustrated in FIG. 13. That is, the wiring paths WP6 electrically connecting the plurality of electrodes constituting the electrode groups GR4 are mainly routed in the wiring layer M4.

That is, in examples illustrated in FIGS. 10 to 17, the plurality of first group electrodes GL1 of the logic chip 30B and the plurality of first group electrodes GM1 of the memory chip 30A are respectively connected in mirror arrangement described above. Thus, in each of the wiring layer M1 illustrated in FIG. 10 to the wiring layer M4 illustrated in FIG. 13, the plurality of wiring paths WP5 and the plurality of wiring paths WP6 are not crossed.

Next, the wiring paths WP3 (see FIG. 12) connecting the electrode groups GR1, of the plurality of second group electrodes GL2 of the logic chip 30B and the plurality of second group electrodes GM2 of the memory chip 30A, illustrated in FIG. 10, are routed via the wires 22A1 formed in the wiring layer M3 illustrated in FIG. 12, the wires 22D1 formed in the wiring layer M7 illustrated in FIG. 16, and the wires (signal wires) 22C2 formed in the wiring layer M4 illustrated in FIG. 13. Each of the wires 22A1 has one end (via wiring 23A) at a position overlapping with the logic chip 30B (see FIG. 10) in a thickness direction, and extends in a direction away from the memory chip 30A (see FIG. 10). Furthermore, the wire 22C2 has one end at a position overlapping with the memory chip 30A in a thickness direction, and extends in a direction away from the logic chip 30B (see FIG. 10).

Furthermore, the wiring layer M1 illustrated in FIG. 10 is connected to the one ends of the wire 22A1 in the wiring layer M3 illustrated in FIG. 12 via the via wirings 23A (see FIG. 12) stacked so as to overlap with each other in a thickness direction. Furthermore, the other ends of the wire 22A1 illustrated in FIG. 12 are connected to the wiring layer M7 illustrated in FIG. 16 via the via wirings 23A (see FIGS. 12, 13, and 16) stacked so as to overlap with each other in a thickness direction, and the through-hole wirings 24 (see FIGS. 14 and 15). Furthermore, each of the via wirings 23A illustrated in FIG. 16 is one end of each of the wires 22D1.

Furthermore, each of the wires 22D1 formed in the wiring layer M7 illustrated in FIG. 16 extends from the one end (via wiring 23A) to the other end (via wiring 23A) to sequentially bridge the side surface 30s1 and the side surface 30s2. Thus, each of the wires 22D1 includes at least a portion overlapping with the logic chip 30B (see FIG. 10) in a thickness direction, a portion overlapping with the memory chip 30A (see FIG. 10) in a thickness direction, and a portion not overlapping with the logic chip 30B or the memory chip 30A in a thickness direction.

Furthermore, the wiring layer M1 illustrated in FIG. 10 is connected to the one ends of the wire 22C2 in the wiring layer M4 illustrated in FIG. 13 via the via wirings 23A stacked so as to overlap with each other in a thickness direction (see FIGS. 12 and 13). Furthermore, the one ends of the wire 22C2 illustrated in FIG. 13 are connected to the other ends of the wire 22D1 in the wiring layer M7 illustrated in FIG. 16 via the via wirings 23A (see FIGS. 13 and 16) stacked so as to overlap with each other in a thickness direction, and the through-hole wirings 24 (see FIGS. 14 and 15).

Furthermore, the wiring paths WP4 (see FIG. 12) connecting the electrode groups GR2, of the plurality of second group electrodes GL2 of the logic chip 30B and the plurality of second group electrodes GM2 of the memory chip 30A, illustrated in FIG. 10, are routed via the wires 22C1 formed in the wiring layer M3 illustrated in FIG. 12, the wires (signal wires) 22D2 formed in the wiring layer M8 illustrated in FIG. 17, and the wires 22A2 formed in the wiring layer M4 illustrated in FIG. 13. Each of the wires 22A2 has one end (via wiring 23A) at a position overlapping with the logic chip 30B (see FIG. 10) in a thickness direction, and extends in a direction away from the memory chip 30A (see FIG. 10). Furthermore, each of the wires 22C1 has one end at a position overlapping with the memory chip 30A in a thickness direction, and extends in a direction away from the logic chip 30B (see FIG. 10).

Furthermore, the wiring layer M1 illustrated in FIG. 10 is connected to the other ends of the wire 22A2 in the wiring layer M4 illustrated in FIG. 13 via the via wirings 23B (see FIG. 12) stacked so as to overlap with each other in a thickness direction. Furthermore, the other ends of the wire 22A2 illustrated in FIG. 13 are connected to the wiring layer M8 illustrated in FIG. 17 via the via wirings 23B (see FIGS. 12, 13, 16, and 17) stacked so as to overlap with each other in a thickness direction, and the through-hole wirings 24 (see FIGS. 14 and 15). Furthermore, each of the via wirings 23B illustrated in FIG. 17 is one end of each of the wires 22D2.

Furthermore, each of the wires 22D2 formed in the wiring layer M8 illustrated in FIG. 17 extends from the one end (via wiring 23B) to the other end (via wiring 23B) to sequentially bridge the side surface 30s1 and the side surface 30s2. Thus, each of the wires 22D2 includes at least a portion overlapping with the logic chip 30B (see FIG. 10) in a thickness direction, a portion overlapping with the memory chip 30A (see FIG. 10) in a thickness direction, and a portion not overlapping with the logic chip 30B or the memory chip 30A in a thickness direction.

Furthermore, the wiring layer M1 illustrated in FIG. 10 is connected to the one end of the wire 22C1 in the wiring layer M3 illustrated in FIG. 12 via the via wirings 23B (see FIG. 12) stacked so as to overlap with each other in a thickness direction. Furthermore, the one end of the wire 22C1 illustrated in FIG. 12 is connected to the other end of the wire 22D2 in the wiring layer M8 illustrated in FIG. 17 via the via wirings 23B (see FIGS. 12, 13, 16, and 17) stacked so as to overlap with each other in a thickness direction, and the through-hole wirings 24 (see FIGS. 14 and 15).

As described above, the wiring paths WP3 electrically connecting the plurality of electrodes constituting the electrode groups GR1 are mainly routed in the wiring layers M3, M7, and M4. Furthermore, the wiring paths WP4 electrically connecting the plurality of electrodes constituting the electrode groups GR2 are mainly routed in the wiring layers M4, M8, and M3. Furthermore, the electrode groups GR1 and the electrode groups GR2 are connected in parallel translation arrangement described above. Thus, at any position of the interposer 20B, the wiring path WP3 and the wiring path WP4 three-dimensionally cross each other. According to an example of the present embodiment, in an A portion of the wiring layer M7 indicated with a two-dot chain line surrounding in FIG. 16, the wiring paths WP3 and the wiring paths WP4 three-dimensionally cross each other.

Figure 18:
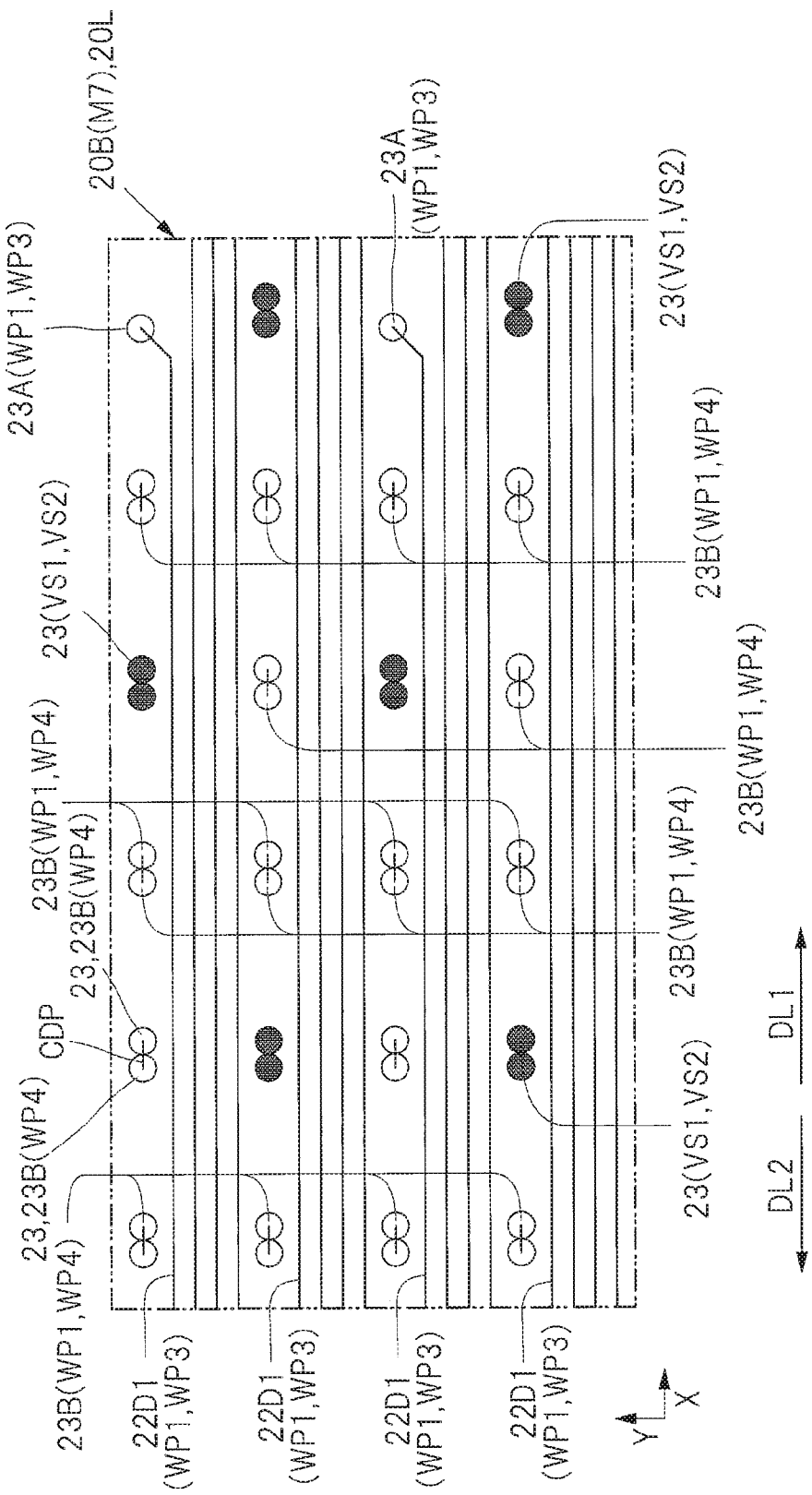
FIG. 18 is an enlarged plan view of an A portion of FIG. 16.

Specifically, as illustrated in FIG. 18 illustrating an enlarged plan view of the A portion of FIG. 16, in the wiring layer M7, the via wirings 23B being part of the wiring paths WP4 are arranged, between pluralities of wires 22D1 being part of the wiring paths WP3. Alternatively, the plurality of wires 22D1 being part of the wiring paths WP3 are arranged, between pluralities of via wirings 23B being part of the wiring paths WP4. The interposer 20B has a minimum number of portions at which the wiring paths three-dimensionally cross, and thus, there is no portion at which the wiring paths three-dimensionally cross other than the A portion illustrated in FIG. 16.

Then, in a portion at which different wiring paths three-dimensionally cross, arrangement density of the wiring paths is increased, in comparison with the other portions, and thus, contact between the wiring paths needs to be avoided. However, when a bypass distance of the wire 22D1 is increased to avoid contact between the wiring paths, it causes increase in signal transmission distance.

Then, in the present embodiment, as illustrated in FIG. 18, a portion where the plurality of wiring paths WP3 and the plurality of wiring paths WP4 three-dimensionally cross each other is configured in such a way that the pluralities of via wirings 23B are arranged side by side along extending directions of pluralities of wires 22D1. In an example illustrated in FIG. 18, the plurality of via wirings 23B are arranged in line between two of the wires 22D1 adjacently extending in the direction DL1. Furthermore, in the example illustrated in FIG. 18, since, when plurality of via wirings 23B are simply arranged in one line, lack of space is caused, the pluralities of wires 22D1 and pluralities of via wirings 23B arranged in line are alternately arranged.

As described above, when the pluralities of via wirings 23B are arranged along the extending directions of the pluralities of wires 22D1, each of the pluralities of the wires 22D1 can be arranged to linearly extend. As a result, increase in signal transmission path distance can be prevented, at a portion where the plurality of wiring paths WP3 and the plurality of wiring paths WP4 three-dimensionally cross.

Note that, in the present embodiment, description has been made of an exemplary embodiment of three-dimensional crossing of the wiring paths WP3 and the wiring paths WP4 in a part of the region 20L illustrated in FIG. 16. However, for example, the wiring paths WP3 and the wiring paths WP4 may three-dimensionally cross each other, in a part of the region 20M illustrated in FIG. 16.

However, for reduction in bypass distance in a portion where a plurality of wiring paths three-dimensionally cross each other, there is preferably room for an arrangement space for wiring. Accordingly, at least in the wiring layer M3 (see FIG. 12) and the wiring layer M4 (see FIG. 13) in which the wiring paths WP3 illustrated in FIGS. 12 and 13 are formed, the wiring paths WP3 and the wiring path WP4 are preferably prevented from three-dimensionally crossing each other. Furthermore, as in the present embodiment, the lower layers (close to the lower surface 20b illustrated in FIG. 9) below the core layer 21c (see FIG. 9) including the plurality of through-hole wirings 24 (see FIG. 9) have more room for a wiring space than the upper layers (close to the upper surface 20t illustrated in FIG. 9) above the core layer 21c. Accordingly, as in the present embodiment, three-dimensional crossing is especially preferably performed in the wiring layer M7 (see FIG. 16) which is below the core layer 21c.

Furthermore, in the present embodiment, as illustrated in FIGS. 12 and 13, the plurality of via wirings 23 are arranged in a zigzag shape (staggered shape), in a region overlapping with the memory chip 30A (see FIG. 10) and the logic chip 30B (see FIG. 10) in a thickness direction. Providing the via wirings 23 at positions overlapping with the plurality of electrodes 33 (see FIG. 10) arranged in a staggered shape enables reduction in wiring path distance to the wiring layer M3 (see FIG. 12) or the wiring layer M4 (see FIG. 13). Meanwhile, in a region not overlapping with the memory chip 30A and the logic chip 30B in a thickness direction, as illustrated in FIGS. 12, 13, 16, and 17, the plurality of via wirings 23 are arranged side by side along extending directions of the plurality of wires. This region not overlapping with the memory chip 30A and the logic chip 30B in a thickness direction is a region in which part of the wiring paths WP1 are arranged.

That is, in the present embodiment, in the region in which part of the wiring paths WP1 are provided, the plurality of via wirings 23 are arranged side by side along the extending directions of the plurality of wires. Specifically, the plurality of via wirings 23 are arranged side by side along the extending directions of the plurality of wires, in each region where part of the plurality of wires 22A1 and part of the plurality of wires 22C1, illustrated in FIG. 12, are provided, and part of the plurality of wires 22A2 and part of the plurality of wires 22C2, illustrated in FIG. 13, are provided, of the wiring paths WP1. Furthermore, in each region in which the whole of the plurality of wires 22D1 illustrated in FIG. 16, and the whole of the plurality of wires 22D2 illustrated in FIG. 17 are provided, the plurality of via wirings 23 are arranged side by side along the extending directions of the plurality of wires. Thus, the plurality of wires constituting the wiring path WP1 can be linearly extended, and thus, each of the plurality of wiring paths WP1 can have a reduced path distance.

Furthermore, in the above description of the via wirings 23A, 23B, 23C, and 23D, the via wirings 23A, 23B, 23C, 23D formed in the plurality of wiring layers are stacked so as to overlap with each other in a thickness direction. However, as schematically illustrated in FIG. 9, in a stacking method in which the via wirings 23 are stacked in such a way that a center axis of another via wiring 23 is arranged on a center axis of a via wiring 23 in a lower layer, a manufacturing process thereof becomes complicated. Therefore, as illustrated in FIG. 18, a method is provided in which a via wiring 23 connected to a lower layer and a via wiring 23 connected to an upper layer are adjacently arranged, and a conductor pattern CDP is provided between the adjacent via wirings 23 for connection. When the conductor pattern CDP has a length equal to that of a routed wire (e.g., wire 22A1 illustrated in FIG. 12) described above, influence on the length of the signal transmission path needs to be considered. However, when the conductor pattern CDP has a length large enough to connect the via wirings 23 formed adjacent to each other, as illustrated in FIG. 18, characteristic influence on signal transmission by the conductor pattern CDP is negligibly small.

However, as illustrated in FIG. 9, when the via wirings 23 are stacked at a position where the center axis of the via wiring 23 connected to an upper layer overlaps with the center axis of the via wiring 23 connected to a lower layer, an occupied area of the via wirings 23 can be reduced in each wiring layer. Accordingly, for improvement in arrangement density of signal transmission paths, as illustrated in FIG. 9, the center axis of another via wiring 23 is preferably arranged on the center axis of a via wiring 23 in a lower layer.

Furthermore, in the present embodiment, as illustrated in FIG. 18, the plurality of via wirings 23B partially constituting the signal transmission paths are arranged between the via wirings 23 partially constituting reference potential supply paths (reference potential lines VS1 and VS2 illustrated in FIG. 18). Specifically, the plurality of via wirings 23B and the plurality of via wirings 23 for supplying reference potential are alternately arranged along the extending directions of the wires 22D1. Furthermore, as seen in FIGS. 12 to 17, in each of the plurality of wiring layers, the via wiring 23A and the via wiring 23B, partially constituting the wiring path WP1, are arranged between the plurality of via wirings 23 supplying reference potential to at least either of the memory chip 30A (see FIG. 10) and the logic chip 30B (see FIG. 10). Specifically, the via wirings 23A and the via wirings 23B, partially constituting the wiring paths WP1, and the plurality of via wirings 23 for supplying reference potential are alternately arranged along the extending directions of the wires 22D1.

As described above, when the via wirings 23A and 23B for signal transmission paths are arranged between the via wirings 23 for supplying reference potential and the via wirings 23 for supplying reference potential are used as signal return paths, a distance between the signal transmission path and the return path is reduced. Thus, effect of noise on the signal transmission paths can be reduced. Furthermore, when the via wirings 23A and 23B for signal transmission paths are arranged between the via wirings 23 for supplying reference potential, a shielded wire is readily arranged adjacent to the signal transmission path.

Furthermore, as seen from comparison between FIGS. 14 and 15, and FIG. 10, part of the plurality of through-hole wirings 24 overlaps with part of the plurality of second group electrodes GL2 (see FIG. 10) and the plurality of second group electrodes GM2 (see FIG. 10), in plan view. As described above, in the present embodiment, the plurality of second group electrodes GL2 of the logic chip 30B and the plurality of second group electrodes GM2 of the memory chip 30A include the electrode groups GR1 connected via the wiring paths WP3 illustrated in FIGS. 12 to 16, and the electrode groups GR2 connected via the wiring paths WP4 illustrated in FIGS. 12 to 17.

Thus, as described above, even when part of the plurality of through-hole wirings 24 overlaps with part of the plurality of second group electrodes GL2 and the plurality of second group electrodes GM2, in plan view, contact between the plurality of wiring paths can be avoided.

Then, when part of the plurality of through-hole wirings 24 overlaps with part of the plurality of second group electrodes GL2 and the plurality of second group electrodes GM2, the upper surface of the interposer 20B can have a reduced area. That is, the size of the semiconductor device PKG1 can be reduced.

Furthermore, in the present embodiment, the longest wire of the wires constituting the wiring paths WP1 is the wire 22D1 illustrated in FIG. 16, and the wire 22D2 illustrated in FIG. 17. Thus, upon examination of equalization of the lengths of the wiring paths WP1, it is especially preferable to equalize the lengths of the plurality of wires 22D1 illustrated in FIG. 16 and the lengths of the plurality of wires 22D2 illustrated in FIG. 17.

Figure 19:
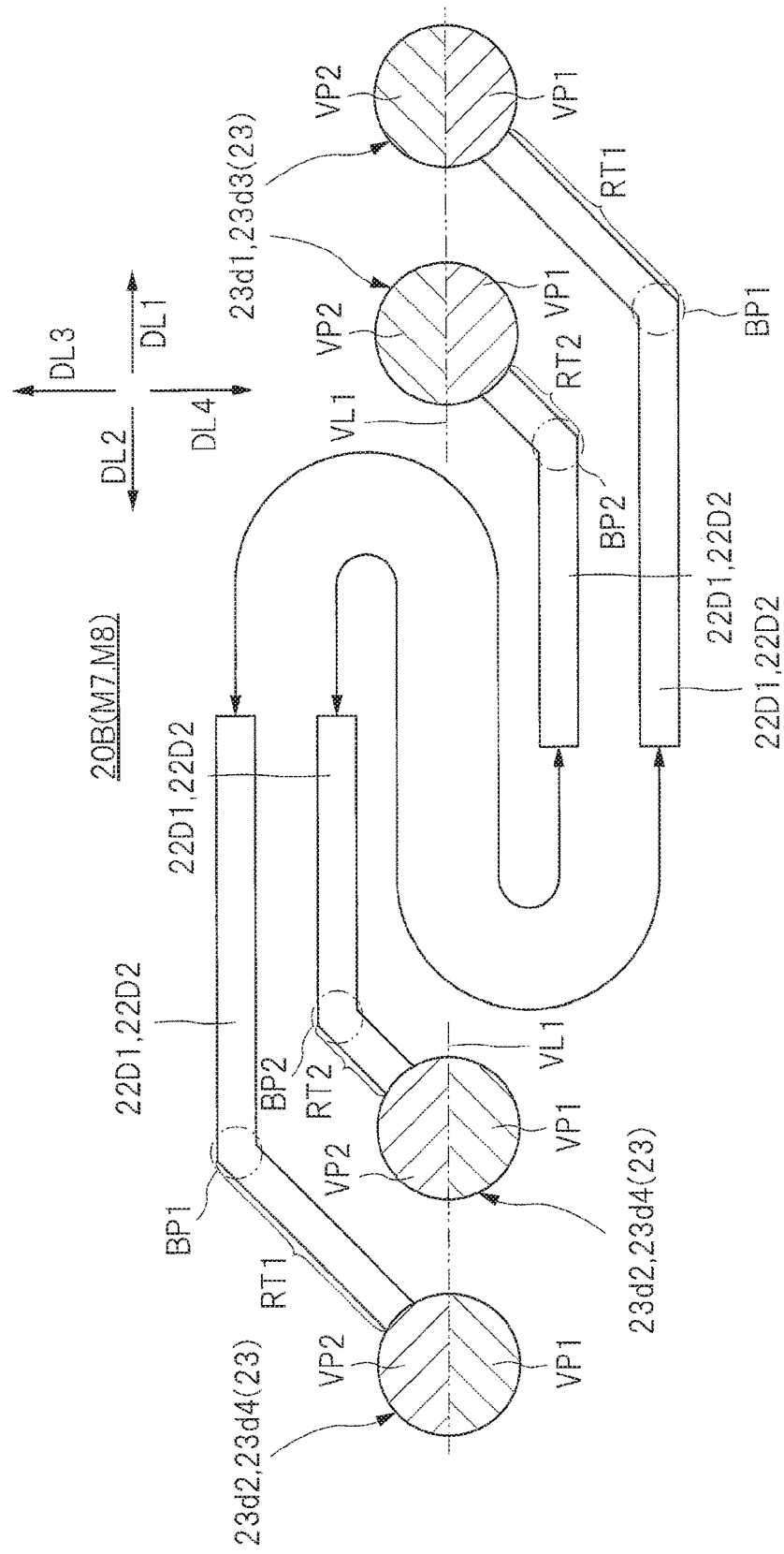
FIG. 19 is a schematic enlarged plan view of a layout of wires for signal transmission illustrated in FIGS. 16 and 17.

Then, in the present embodiment, as illustrated in FIGS. 16, 17, and 19, a direction in which each of the plurality of wires 22D1 and the plurality of wires 22D2 is connected to the via wiring 23 is devised to equalize the lengths of the plurality of wires 22D1 and the plurality of wires 22D2. FIG. 19 is a schematic enlarged plan view of a layout of the wires for signal transmission illustrated in FIGS. 16 and 17.

As illustrated in FIGS. 16 and 17, in the wiring layer M7 (see FIG. 16) and the wiring layer M8 (see FIG. 17), the plurality of via wirings 23 connected to the plurality of wires 22D1 and the plurality of wires 22D2 are arranged side by side in the direction DL1 (or direction DL2) being the extending direction of the wires. Thus, the whole of the plurality of wires 22D1 and the plurality of wires 22D2 are linearly configured, the plurality of wiring paths are brought into contact with each other. Accordingly, in order to avoid contact between the plurality of wiring paths, each of the plurality of wires 22D1 and the plurality of wires 22D2 needs to have a bent portion (i.e., bypass portion), at least at a portion immediately in front of a portion connected to the via wiring 23.

Here, when the direction for connection to the via wiring 23 is defined randomly, bypasses of the plurality of wires 22D1 and the plurality of wires 22D2 are complicated, and may have variation in length.

Then, in the present embodiment, as schematically illustrated in FIG. 19, a direction in which each of the plurality of wires 22D1 and the plurality of wires 22D2 is connected to the via wiring 23 is configured as described below. That is, the wiring layer M7 includes a plurality of via wirings (end via wirings) 23d1 to which the plurality of wires 22D1 are connected at one end, and a plurality of via wirings (end via wirings) 23d2 to which the plurality of wires 22D1 are connected at the other end. Furthermore, the wiring layer M8 includes a plurality of via wirings (end via wirings) 23d3 to which the plurality of wires 22D2 are connected at one end, and a plurality of via wirings (end via wiring) 23d4 to which the plurality of wires 22D2 are connected at the other end.

Furthermore, each of the plurality of via wirings 23d1, the plurality of via wirings 23d2, the plurality of via wirings 23d3, and the plurality of via wirings 23d4 has a portion VP1 and a portion VP2 facing each other across a boundary (imaginary line) VL1. Furthermore, the portions VP1 and the portions VP2 are sequentially arranged side by side in a direction DL3, of the direction DL3 orthogonal to the direction DL1 (or direction DL2) and a direction DL4 opposite to the direction DL3.

Furthermore, the plurality of wires 22D1 are connected at one end to the first portions VP1 of the plurality of via wirings 23d1, respectively. Furthermore, the plurality of wires 22D1 are connected at the other end to the second portions VP2 of the plurality of via wirings 23d2, respectively. Furthermore, the plurality of wires 22D2 are connected at one end to the portions VP1 of the plurality of via wirings 23d3, respectively. Furthermore, the plurality of wires 22D2 are connected at the other end to the portions VP2 of the plurality of via wirings 23d4, respectively.

As in the above description, a direction in which each of the plurality of wires 22D1 and the plurality of wires 22D2 is connected to the via wiring 23 is defined, so that the lengths of the plurality of wires 22D1 and the plurality of wires 22D2 can be equalized.

For example, in an example illustrated in FIG. 19, each of the plurality of wires 22D1 and the plurality of wires 22D2 has two bent portions BP1 and BP2. Then, a portion RT1 from the bent portion BP1 to the via wiring 23 has a length larger than that of a portion RT2 from the bent portion BP2 to the via wiring 23. However, the lengths of the plurality of the portions RT1 are equal to each other, and the lengths of the plurality of the portions RT2 are equal to each other. Furthermore, the plurality of wires 22D1 and the plurality of wires 22D2 have an equal length from the bent portion BP1 to the bent portion BP2. Accordingly, the plurality of wires 22D1 and the plurality of wires 22D2 have an equal length.

<Modification Examples>

Although modification examples have been described in the above embodiments, modification examples other than the above will be described below, in the present embodiment. Note that, in the modification examples illustrated in FIGS. 20 to 24, described below, for detailed description of arrangement of paths supplying power, the number of signal transmission paths is further reduced relative to that of the semiconductor device PKG1 illustrated in FIG. 6.

Figure 20:
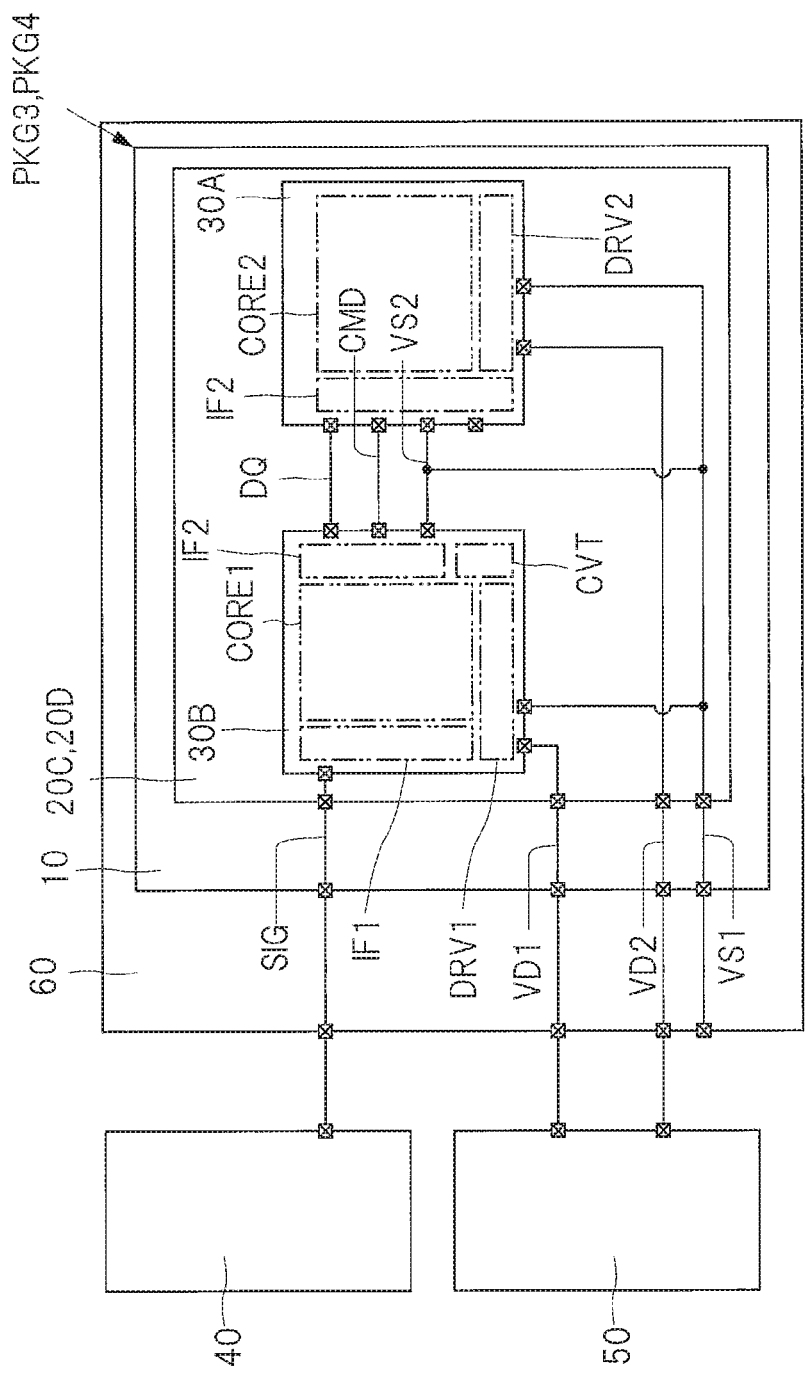
FIG. 20 is an explanatory diagram of an exemplary circuit configuration of a semiconductor device mounted on a mounting board, where the semiconductor device is a modification example of the semiconductor device illustrated in FIG. 4.
Figure 21:
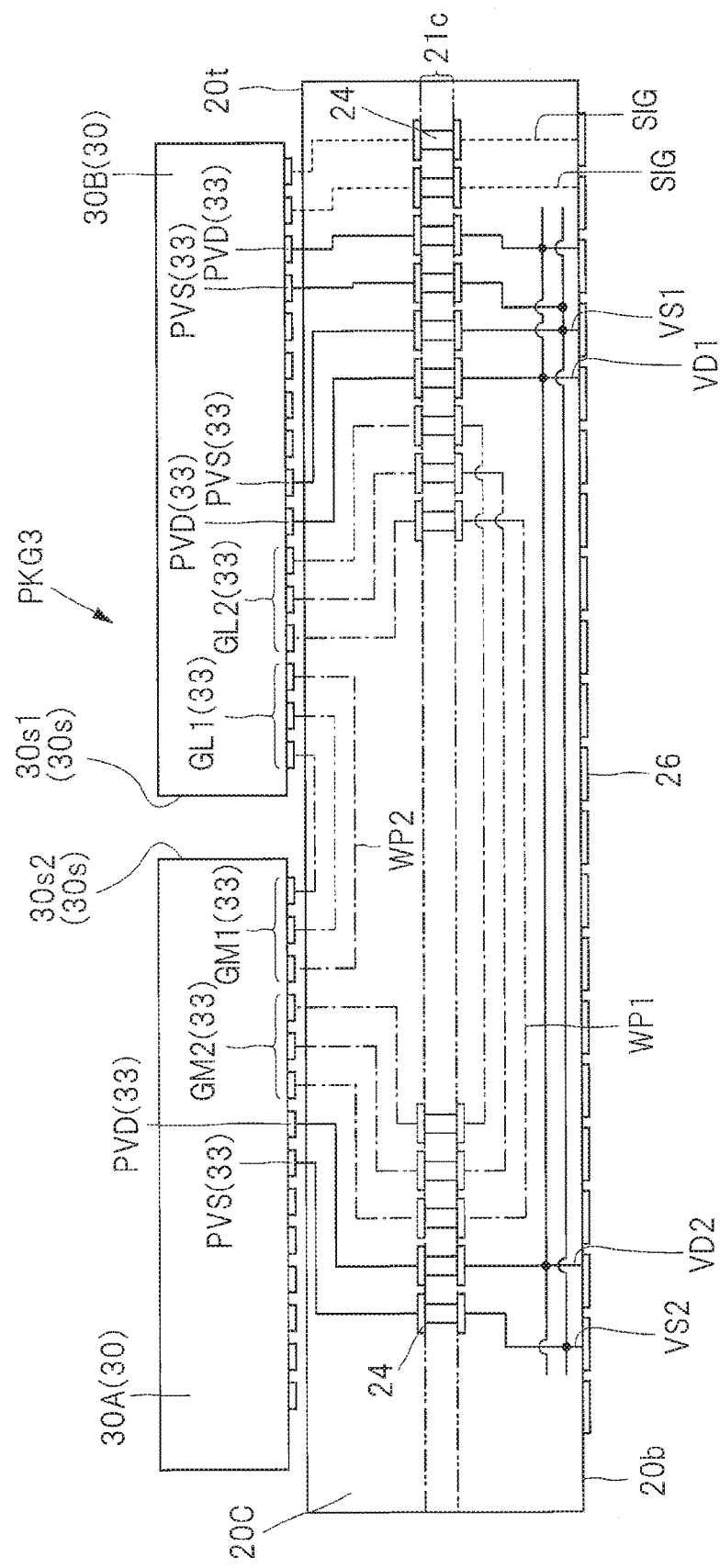
FIG. 21 is an explanatory diagram schematically illustrating an example of a connecting method of power supply wires and reference potential wires in the circuit configuration illustrated in FIG. 20.
Figure 22:
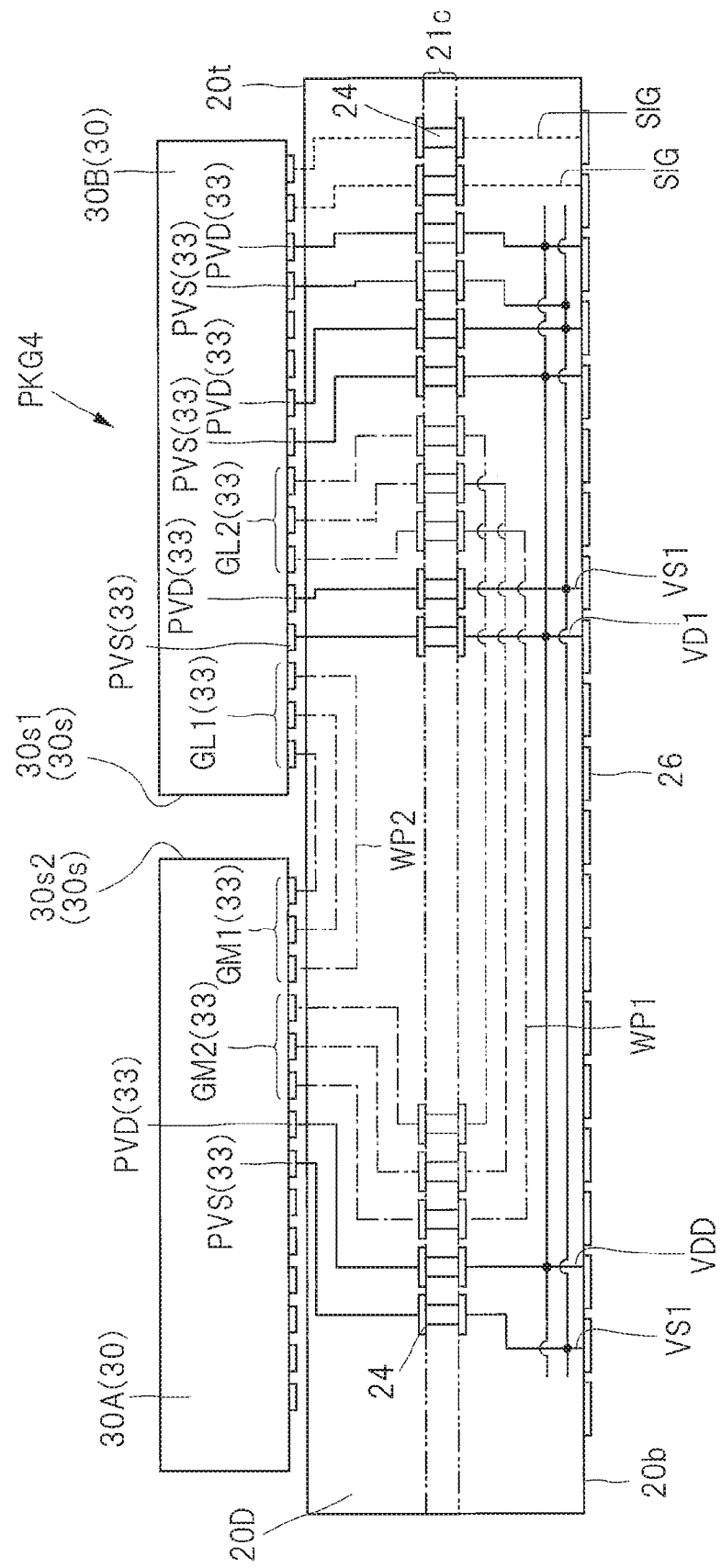
FIG. 22 is an explanatory diagram illustrating a modification example of FIG. 21.
Figure 23:
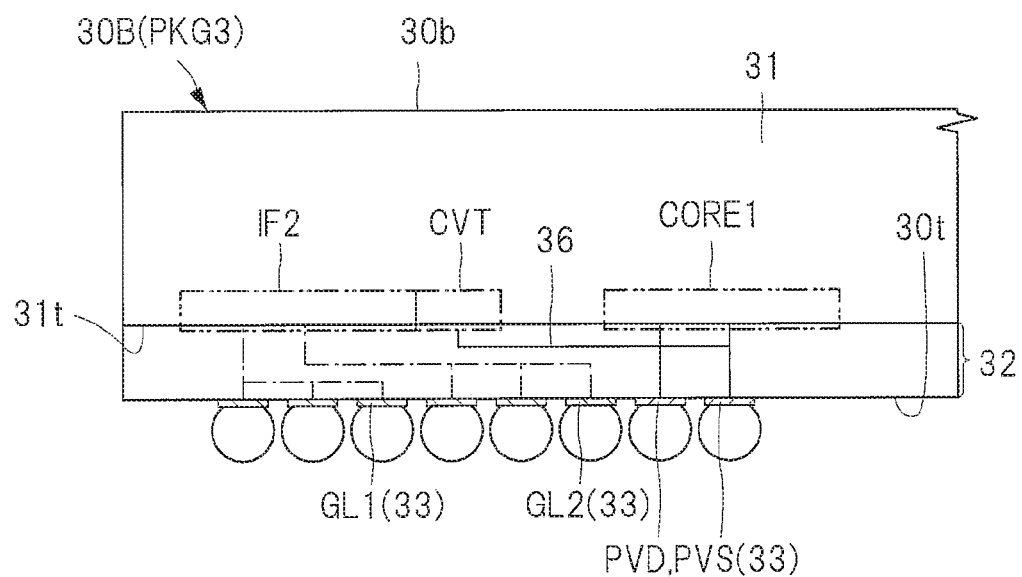
FIG. 23 is an enlarged cross-sectional view of a main portion, which illustrates an exemplary arrangement of electrodes of a logic chip illustrated in FIG. 21.

FIG. 20 is an explanatory diagram of an exemplary circuit configuration of a semiconductor device mounted on the mounting board, where the semiconductor device is a modification example of the semiconductor device illustrated in FIG. 4. Also, FIG. 21 is an explanatory diagram schematically illustrating an example of a connecting method of power supply wires and reference potential wires in the circuit configuration illustrated in FIG. 20. Also, FIG. 22 is an explanatory diagram illustrating a modification example of FIG. 21. Also, FIG. 23 is an enlarged cross-sectional view of a main portion, which illustrates an exemplary arrangement of electrodes of a logic chip illustrated in FIG. 21. Also, FIG. 24 is an enlarged cross-sectional view of a main portion, which illustrates an exemplary arrangement of the electrodes of the logic chip illustrated in FIG. 22.

Figure 24:
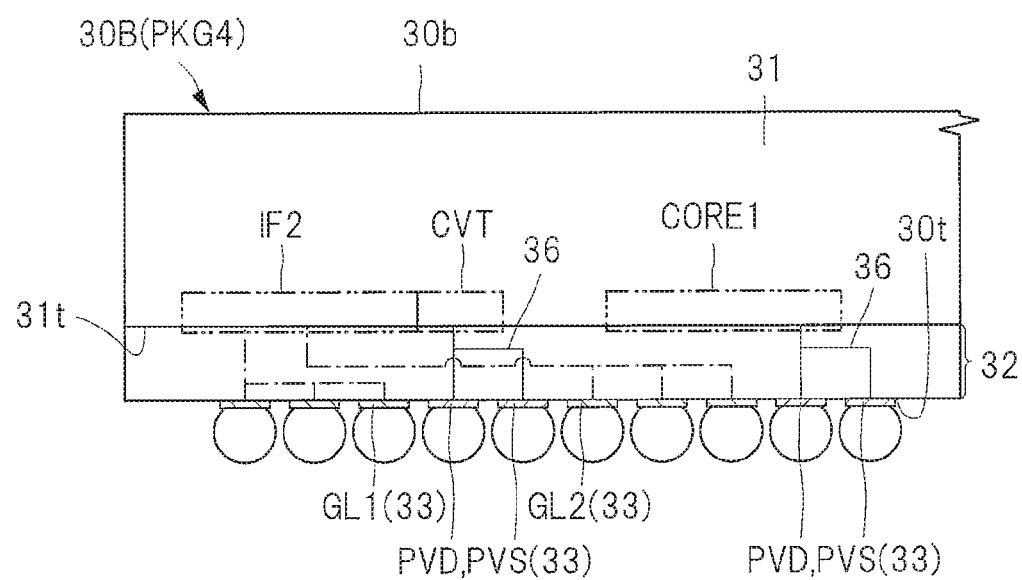
FIG. 24 is an enlarged cross-sectional view of a main portion, which illustrates an exemplary arrangement of the electrodes of the logic chip illustrated in FIG. 22.

Note that, although FIGS. 21 to 24 are cross-sectional views, but hatching is omitted for viewability. However, the electrodes 33 illustrated in FIGS. 23 and 24 are differently hatched between the electrodes 33 for signal transmission, and the electrodes 33 for power supply potential or reference potential. Furthermore, in FIGS. 21 to 24, for convenience in distinction between a signal transmission path and a path for power supply potential or reference potential, the signal transmission path is indicated by a one-dot chain line (however, excluding the through-hole wiring 24 illustrated in FIGS. 21 and 22). Furthermore, in FIGS. 21 and 22, an example of a layout of the signal line SIG transmitting a signal between a logic chip 30B and an external device 40 illustrated in FIG. 20 is indicated by a dotted line.

In the semiconductor device PKG1 illustrated in FIG. 4, the power supply line VD1, the power supply line VD2, and the power supply line VD3 are independently connected to the interposer 20A. However, in an interposer 20C of a semiconductor device PKG3 or an interposer 20D of a semiconductor device PKG4 illustrated in FIG. 20, from the power supply line VD1 to the logic chip 30B, power supply potential for operation of the logic chip 30B is supplied, and from the power supply line VD2 to the memory chip 30A, power supply potential for operation of the memory chip 30A is supplied. Furthermore, the logic chip 30B has a voltage conversion circuit CVT for conversion of signal voltage level. In the voltage conversion circuit CVT, signal input/output is performed between the memory chip 30A and the logic chip 30B, and voltage level is converted. Furthermore, for the interposer 20C of the semiconductor device PKG3 or the interposer 20D of the semiconductor device PKG4, illustrated in FIG. 20, reference potential such as ground potential is supplied from the reference potential line VS1, and the reference potential is further supplied to each of the memory chip 30A and the logic chip 30B.

In the semiconductor device PKG3 illustrated in FIG. 21, arrangement of the electrodes 33 provided in the logic chip 30B and the memory chip 30A is similar to that in the semiconductor device PKG1 illustrated in FIG. 6 or the semiconductor device PKG2 illustrated in FIG. 9. That is, the plurality of first group electrodes GL1 and the plurality of second group electrodes GL2 are collectively arranged close to the side surface 30s1 of the logic chip 30B, and a power electrode PVD for power supply potential, and a reference potential electrode PVS are provided, at positions apart from the side surface 30s1. Furthermore, the plurality of first group electrodes GM1 and the plurality of second group electrodes GM2 are collectively arranged close to the side surface 30s2 of the memory chip 30A, and a power electrode PVD for power supply potential, and a reference potential electrode PVS are provided, at positions apart from the side surface 30s2.

Meanwhile, in the semiconductor device PKG4 illustrated in FIG. 22, arrangement of electrodes 33 provided in the logic chip 30B is different from that of the semiconductor device PKG3 illustrated in FIG. 21. The plurality of electrodes 33 of the logic chip 30B of the semiconductor device PKG4 are arranged as described below. Between the plurality of second group electrodes GL2, and the plurality of first group electrodes GL1 of the logic chip 30B of the semiconductor device PKG4, a power electrode PVD and a reference potential electrode PVS are arranged. The power electrode PVD supplies power supply potential to the logic chip 30B, and the reference potential electrode PVS supplies a reference potential to the logic chip 30B.

As described above, the logic chip 30B includes the control circuit controlling operation of the main memory circuit of the memory chip 30A. Furthermore, the logic chip 30B includes the calculation circuit performing calculation processing for an input data signal. FIGS. 23 and 24 illustrate the main circuit including the calculation circuit, the control circuit, or the like, as the core circuit (main circuit) CORE1, byway of example. Furthermore, in the example illustrated in FIGS. 23 and 24, the logic chip 30B includes the voltage conversion circuit CVT mutually converting a signal voltage level between a voltage level used for an input/output buffer, and a voltage level used for an internal circuit or the like. Furthermore, the core circuit CORE1 and the voltage conversion circuit CVT of the logic chip 30B are connected with the electrodes 33 of the logic chip 30B via a plurality of wires 36 formed in the wiring layer 32 of the logic chip 30B.

Incidentally, the core circuit CORE1 of the logic chip 30B has large power consumption per unit area, in comparison with the core circuit CORE2 of the memory chip 30A illustrated in FIG. 4. Therefore, when an amount of power to be supplied is insufficient instantaneously, a phenomenon such as voltage drop occurs, and unstable circuit operation may be caused.

Furthermore, each of the plurality of wires 36 formed in the logic chip 30B has a cross-sectional area (cross-sectional area of wiring path) smaller than, for example, a cross-sectional area (cross-sectional area of wiring path) of the plurality of wires 22 of the interposer 20A illustrated in FIG. 5. Thus, when a transmission distance through the wire 36 is increased, voltage may be reduced.

Here, power supplied to the voltage conversion circuit CVT is focused on. In the example illustrated in FIG. 23, the core circuit CORE1 is interposed between the voltage conversion circuit CVT, and the power electrode PVD supplying power supply potential to the voltage conversion circuit CVT. Thus, when power consumption in the core circuit CORE1 sharply rises, voltage to be supplied to the voltage conversion circuit CVT may be insufficient.

In contrast, in the example illustrated in FIG. 24, the core circuit CORE1 is not interposed between the voltage conversion circuit CVT, and the power electrode PVD supplying power supply potential to the voltage conversion circuit CVT. Thus, reduction in voltage supplied to the voltage conversion circuit CVT is less likely to occur due to change in power demand in the core circuit CORE1.

Furthermore, in the example illustrated in FIG. 24, the power electrode PVD and the reference potential electrode PVS are provided between the plurality of first group electrodes GL1 and the plurality of second group electrodes GL2, and thus, a path distance is small from the power electrode PVD and the reference potential electrode PVS to the voltage conversion circuit CVT. Thus, according to the example illustrated in FIG. 24, voltage drop caused by the path distance to the voltage conversion circuit CVT can be prevented.

Furthermore, in the example illustrated in FIG. 24, the plurality of second group electrodes GL2 are provided between the plurality of power electrodes PVD and the plurality of reference potential electrodes PVS. Thus, the possibility of occurrence of instantaneous voltage drop can be reduced, in a path for supplying power to the core circuit CORE1.

The semiconductor device PKG4 illustrated in FIGS. 22 and 24 is preferably employed for stable circuit operation of the logic chip 30B, as described above. In contrast, in the semiconductor device PKG3 illustrated in FIGS. 21 and 23, the plurality of first group electrodes GL1 and the plurality of second group electrodes GL2 are arranged adjacently, and thus, the wiring path WP1 illustrated in FIG. 21 can have a reduced path distance.

Note that, as described above, the memory chip 30A has power consumption per unit area smaller than the power consumption of the logic chip 30B. Thus, in a path for supplying power to a circuit of the memory chip 30A, the possibility of occurrence of voltage drop is relatively small in comparison with the logic chip 30B. Therefore, in the example illustrated in FIG. 24, arrangement of the electrodes 33 provided in the memory chip 30A of the semiconductor device PKG4 is similar to that of the semiconductor device PKG3 illustrated in FIG. 21. That is, the plurality of second group electrodes GM2 and the plurality of first group electrodes GM1 provided in the memory chip 30A of the semiconductor device PKG4 are arranged adjacently. Therefore, increase in path distance of the wiring path WP1 illustrated in FIG. 22 can be inhibited.

However, in a path for supplying power to a circuit of the memory chip 30A, when there is the possibility of occurrence of voltage drop, the electrodes 33 may be arranged similarly to those in the logic chip 30B. That is, the power electrode PVD supplying power supply potential to the memory chip 30A, and the reference potential electrode PVS supplying reference potential to the memory chip 30A may be arranged between the plurality of second group electrodes GM2 and the plurality of first group electrodes GM1 provided in the memory chip 30A.

Figure 25:
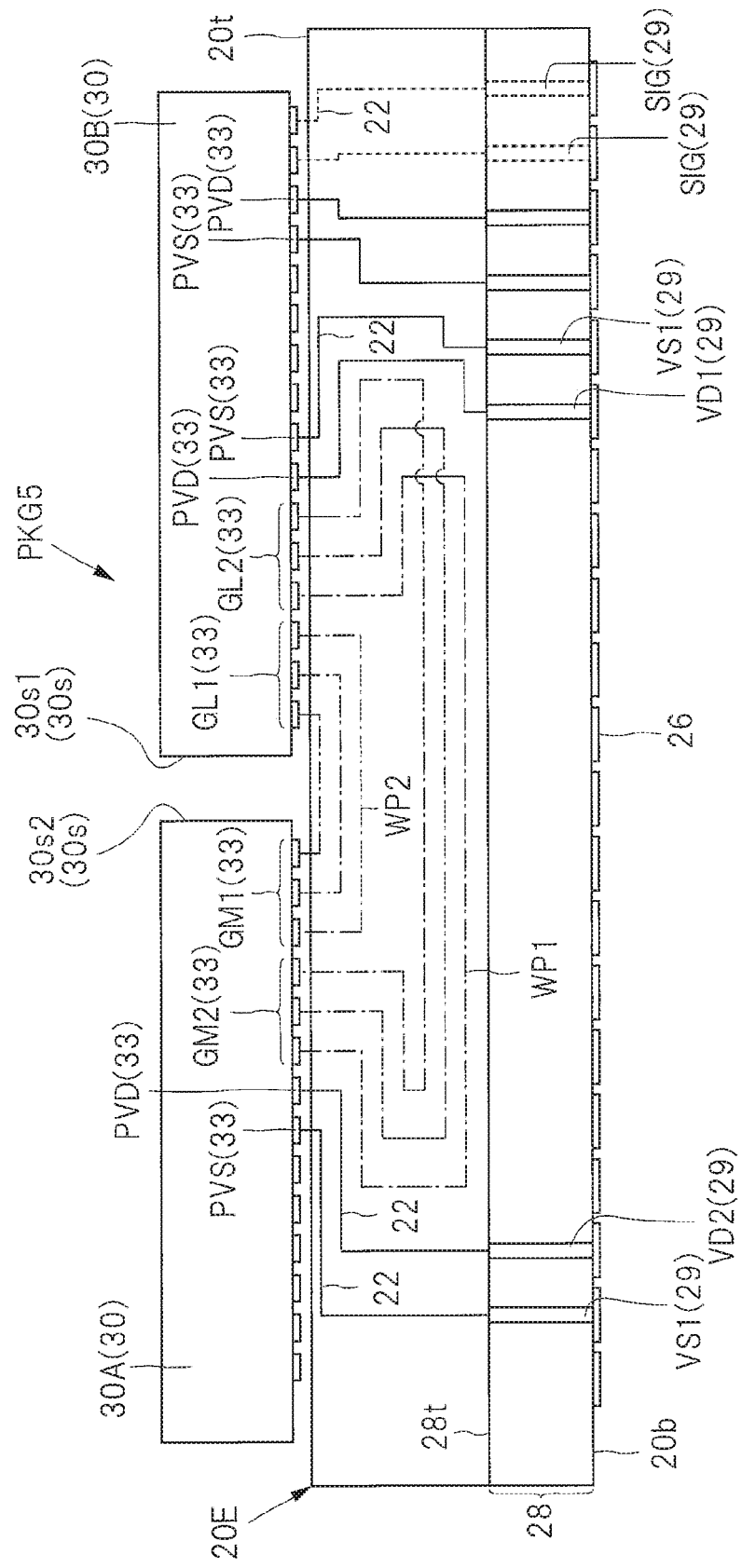
FIG. 25 is a cross-sectional view illustrating the modification example of FIG. 21.

Next, as a modification example of the embodiments described above, for example, an embodiment to which an interposer having a semiconductor substrate as a base material is applied, instead of the interposer 20C having the core layer 21c illustrated in FIG. 21, will be described. FIG. 25 is a cross-sectional view illustrating the modification example of FIG. 21.

An interposer 20E illustrated in FIG. 25 is different from the interposer 20C illustrated in FIG. 21, in that the interposer 20E has a silicon substrate (base material) 28 having a main surface 28t. Furthermore, the interposer 20E is different from the interposer 20C in that the interposer 20E does not have the core layer 21c and the plurality of through-hole wirings 24 illustrated in FIG. 21.

Furthermore, the interposer 20E includes a plurality of through-silicon vias 29 penetrating the silicon substrate 28 in a thickness direction (a direction from one surface to the other surface between the main surface 28t and the lower surface 20b). Each of the plurality of through-silicon vias 29 is a conductive path formed by plugging a through hole penetrating the silicon substrate 28 in a thickness direction with a conductor such as copper (Cu), for example. Each of the plurality of through-silicon vias 29 has one end connected to the lower surface terminal 26, and the other end connected to a wire 22 in a wiring layer. In the interposer 20E, the through-silicon vias 29 are positioned, in a path electrically connecting the semiconductor chip 30 and the wiring substrate 10 (see FIG. 20), such as a supply path for power supply potential or a supply path for reference potential, or the signal line SIG transmitting a signal between the logic chip 30B and the external device 40, illustrated in FIG. 20.

The interposer 20E includes a plurality of wiring layers mounted over the main surface 28t, and in the plurality of wiring layers, a plurality of wiring paths WP1 and WP2 are formed. This point is similar to that in the interposer 20C illustrated in FIG. 21. The plurality of wiring paths WP1 and wiring paths WP2 may be electrically separated from the wiring substrate 10 (see FIG. 20). Thus, the wiring path WP1 and the wiring path WP2 are separated from the plurality of through-silicon vias 29.

Furthermore, a wiring layer of the interposer 20E is manufactured in a similar manner to a process of forming a wiring layer electrically connected to semiconductor elements over a semiconductor chip, like the wiring layer 32 of the logic chip 30B illustrated in FIG. 5. Thus, wires having a smaller cross-sectional area than that of the plurality of wires of the interposer 20C illustrated in FIG. 21 can be formed at high density.

As described above, an interposer using the silicon substrate 28 as a base material is called silicon interposer. As described in the above embodiments, a difference in path distance between the wiring paths WP1 tends to increase, particularly when the through-hole wirings 24 are interposed in the wiring paths WP1.

However, even in a silicon interposer having a mixture of the plurality of wiring paths WP2 and the plurality of wiring paths WP1 described above, the plurality of wiring paths WP1 have a large path distance.

Accordingly, parallel translation arrangement described above can be adopted for the plurality of wiring paths WP1 to reduce a difference in path distance between the plurality of wiring paths WP1.

Furthermore, in FIG. 8, a description has been made of the example of the plurality of wires 22D formed in a wiring layer different from the wiring layers M1, M2, M3, and M4 in which the plurality of wires 22A, the plurality of wires 22B, and the plurality of wires 22C are formed, illustrated in FIG. 7. However, in a modification example, each of the plurality of wires 22D may be formed in a wiring layer the same as a wiring layer in which the plurality of wires 22B are formed.

In this case, the plurality of wires 22D need to avoid contact with the plurality of wires 22B, and accordingly, a bypass distance of each wire 22D is further increased. Accordingly, the parallel translation arrangement described above can be applied to reduce a difference in path distance between the wires 22D.

Furthermore, in the above embodiments, the semiconductor chip has been described as the semiconductor component mounted over the interposer. However, various modification examples can be applied to the mode of the semiconductor component, in addition to the semiconductor chip. For example, instead of the semiconductor chip 30 described above, a stacked semiconductor chip having a plurality of semiconductor chips stacked may be used. Furthermore, for example, instead of the semiconductor chip 30 described above, a semiconductor package having a semiconductor chip mounted over a base material such as a wiring substrate may be used.

<Manufacturing Method for Semiconductor Device>

Figure 26:
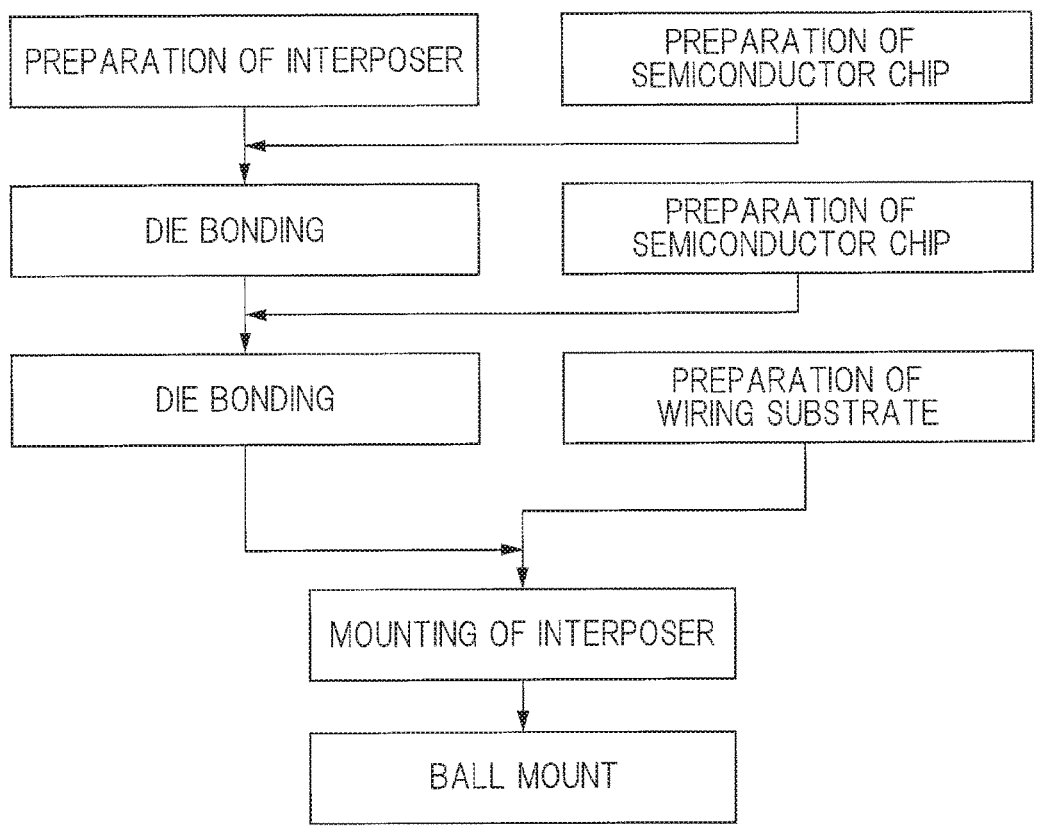
FIG. 26 is a flowchart illustrating an outline of a manufacturing process for the semiconductor devices described with reference to FIGS. 1 to 25.

Next, manufacturing processes for manufacturing the semiconductor devices PKG1, PKG2, PKG3, PKG4, and PKG5 which have been described with reference to FIGS. 1 to 25 will be described. However, the semiconductor devices PKG1, PKG2, PKG3, PKG4, and PKG5 described above are manufactured through similar manufacturing methods, excluding a process for stacking wiring layers in an interposer. Accordingly, in the following description, a manufacturing method for the semiconductor device PKG1 will be described, as a representative example. Furthermore, the following description will be made with reference to a flowchart illustrating a manufacturing process and FIGS. 1 to 25 when needed. FIG. 26 is a flowchart illustrating an outline of the manufacturing process for the semiconductor devices described with reference to FIGS. 1 to 25.

<Preparation for Interposer>

First, in an interposer preparation process, the interposer 20A illustrated in FIGS. 5 to 8, the interposer 20B illustrated in FIGS. 10 to 17, the interposer 20C illustrated in FIG. 21, the interposer 20D illustrated in FIG. 22, or the interposer 20E illustrated in FIG. 25 is prepared. In manufacturing methods for the interposers 20A, 20B, 20C, and 20D (hereinafter, representatively referred to as interposer 20A in description of the manufacturing process), after the plurality of through-hole wirings 24 are formed in the core layer 21c, the plurality of wiring layers are stacked over each of the upper surface 21t and the lower surface 21b of the core layer 21c. A stacking method of wiring layers is performed by repeating an insulation layer deposition step, a conductor embedding step, and a polishing step.

Meanwhile, in a manufacturing method for the interposer 20E, the silicon substrate 28 (see FIG. 25) as a semiconductor wafer is prepared, and a plurality of wiring layers are stacked over the silicon substrate 28. A stacking method of wiring layers is, for example, as in that of the interposer 20A, performed by repeating an insulation layer deposition step, a conductor embedding step, and a polishing step.

<Die Bonding>

Next, in a die bonding step, as illustrated in FIG. 3, the plurality of semiconductor chips 30 are mounted over the interposer 20A. In the present step, the plurality of semiconductor chips 30 are sequentially mounted such that the front surfaces 30t of the plurality of semiconductor chips 30 and the upper surface 20t of the interposer 20A face each other. Although a mounting order is not particularly limited, when the plurality of semiconductor chips 30 have a difference in thickness, a semiconductor chip 30 having a relatively small thickness is preferably mounted first.

For example, one memory chip 30A is used in the present embodiment, but a stacked body having a plurality of memory chips 30A stacked may be used as the memory chip 30A. In this case, the stacked body as the memory chip 30A tends to have a thickness larger than that of the logic chip 30B, and the logic chip 30B is preferably mounted first.

Furthermore, in the present step, as illustrated in FIG. 6, the plurality of electrodes 33 of the semiconductor chip 30 and the plurality of upper surface terminals 25 of the interposer 20A are electrically connected via the plurality of bump electrodes 35.

Note that, in FIGS. 3 and 5, the plurality of bump electrodes 35 are exposed, but an underfill resin (not illustrated) may be arranged between the semiconductor chip 30 and the interposer 20A to surround the plurality of bump electrodes 35. The underfill resin is an insulating resin and surrounds the plurality of bump electrodes 35 to protect the plurality of bump electrodes 35.

<Mounting of Interposer>

Next, in an interposer mounting step, as illustrated in FIG. 3, the wiring substrate 10 as the package substrate is prepared, and the interposer 20A over which the plurality of semiconductor chips 30 are mounted is mounted over the wiring substrate 10. In the present step, the lower surface 20b of the interposer 20A and the upper surface 10t of the wiring substrate 10 are arranged so as to face each other.

Furthermore, in the present step, as illustrated in FIG. 5, the plurality of lower surface terminals 26 of the interposer 20A and the plurality of bonding pads 16 of the wiring substrate 10 are electrically connected via the bump electrodes 27.

Note that, in FIGS. 3 and 5, the plurality of bump electrodes 27 are exposed, but an underfill resin (not illustrated) may be arranged between the interposer 20A and the wiring substrate 10 to surround the plurality of bump electrodes 27. The underfill resin is an insulating resin and surrounds the plurality of bump electrodes 27, thereby protecting the plurality of bump electrodes 27.

<Ball Mount>

Next, in a ball mount process, as illustrated in FIG. 3, the plurality of solder balls 11 serving as external terminals are bonded to the plurality of lands 12 formed on the lower surface 10b of the wiring substrate 10.

In the present step, after the lower surface 10b of the wiring substrate 10 is turned upward, the solder ball 11 is arranged on each of the plurality of lands 12 exposed from the lower surface 10b of the wiring substrate 10. Then, the plurality of solder balls 11 are heated to bond the plurality of solder balls 11 and the lands 12 to each other. In the present process, the plurality of solder balls 11 are electrically connected with the plurality of semiconductor chips 30 (the logic chip 30B and the memory chip 30A), via the wiring substrate 10. However, a technique described in the present embodiment is not exclusively applied to a so-called ball grid array (BGA) semiconductor device having the solder balls 11 bonded in an array. For example, a modification example of the present embodiment can be applied to a so-called land grid array (LGA) semiconductor device having the lands 12 exposed without forming the solder ball 11, or the lands 12 coated with a solder paste thinner than the solder balls 11, for shipment. For the LGA semiconductor device, the ball mount process can be omitted.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above manufacturing method for a semiconductor device, one example of the manufacturing processes of the semiconductor devices PKG1, PKG2, PKG3, PKG4, and PKG5 has been described, but there are various modification examples, in addition to the manufacturing method described in the example. For example, in the embodiment described above, the manufacturing method has been described in which the semiconductor components (semiconductor chips) are mounted over the interposer before the interposer is mounted over the wiring substrate. In addition to the manufacturing method described above, a manufacturing method may be employed in which the interposer is mounted over the wiring substrate before the plurality of semiconductor components are mounted over the interposer mounted on the wiring substrate. Alternatively, a manufacturing method may be employed in which part of the plurality of semiconductor components is mounted over the interposer before the interposer is mounted over the wiring substrate and the rest of the semiconductor components is mounted over the interposer over the wiring substrate. Alternatively, when a stacked body having a plurality of semiconductor chips stacked is used as the semiconductor components, the interposer may be mounted over the wiring substrate before the plurality of semiconductor chips are sequentially stacked over the interposer mounted on the wiring substrate.

In addition, for example, it is possible to apply the modification examples in combination within the scope of the technical idea that has been described in the above-described embodiment.

EXPLANATION OF REFERENCE CHARACTERS

10 Wiring substrate (package substrate)
10b Lower surface (surface, mouting surface)
10s Side surface
10t Upper surface (surface, chip mouting surface)
11 Solder ball (external terminal)
12 Land (external terminal, solder connection pad)
13 Wire
14 Insulation layer
14c Core layer (core material, core insulation layer, insulation layer)
15 Via wiring
16 Bonding pad (terminal, terminal on an interposer mounting surface side, electrode)
17 Insulation film (solder resist film)
20A, 20B, 20C, 20D, 20E, 20H Interposer (relay substrate)
20b Lower surface (surface, mounting surface)
20L, 20M Region
20s Side surface
20t Upper surface (surface, mounting surface)
21 Insulation layer
21b Lower surface
21c Core layer (core material, core insulation layer, insulation layer)
21t Upper surface
22 Wire
22A, 22A1, 22A2, 22B, 22B1, 22B2, 22C, 22C1, 22C2, 22D, 22D1, 22D2 Wire (signal wire)
23d1, 23d2, 23d3, 23d4 Via wiring (end via wiring)
23, 23A, 23B, 23C, 23D Via wiring
24 Through-hole wiring 25 Upper surface terminal (bonding pad, terminal, semiconductor component mounting surface terminal, component connection terminal)
26 Lower surface terminal (terminal, solder connection pad, land, wiring substrate connection terminal)
27 Bump electrode
28 Silicon substrate (base material)
28t Main surface
29 Through-silicon via
30 Semiconductor chip (semiconductor component)
30A Memory chip
30b Back surface (main surface, lower surface)
30B Logic chip
30s, 30s1, 30s2 Side surface
30t Front surface (main surface, upper surface)
31 Silicon substrate (base material)
31t Main surface
32 Wiring layer
33 Electrode (surface electrode, component electrode, pad)
34 Passivation film
35 Bump electrode
36 Wire
40 External device
50 Power supply
60 Mounting board
Au Gold
BP1, BP2 Bent portion
CDP Conductor pattern
CMD Control signal line (signal line)
CORE1, CORE2 Core circuit (main circuit)
CVT Voltage conversion circuit
DL1, DL2, DL3, DL4 Direction
DQ Data line (signal line)
DRV1, DRV2 Power circuit
GL1, GM1 First group electrode (signal electrode, group electrode)
GL2, GM2 Second group electrode (signal electrode, group electrode)
GR1, GR2, GR3, GR4 Electrode group
IF1 External interface circuit (input/output circuit, external input/output circuit)
IF2 Internal interface circuit (input/output circuit, internal input/output circuit)
IL1, IL2, IL3, IL4, IL5, IL6, IL7, IL8, IM1, IM2, IM3, IM4, IM5, IM6, IM7, IM8, OL1, OL2, OL3, OL4, OL5, OL6, OL7, OL8, OM1, OM2, OM3, OM4, OM5, OM6, OM7, OM8, PL1, PL2, PL3, PL4, PL5, PL6, PL7, PL8, PM1, PM2, PM3, PM4, PM5, PM6, PM7, PM8 Electrode
L1, L2, L3, L4, L5, L6, L7, L8, M1, M2, M3, M4, M5, M6, M7, M8, M9, M10 Wiring layer
PKG1, PKG2, PKG3, PKG4, PKG5 Semiconductor device
PVD Power electrode
PVS Reference potential electrode
RT1, RT2 Portion
SIG Signal line
TL5, TL6, TL7, TL8, TM5, TM6, TM7, TM8 Through-hole wiring
VD1, VD2, VD3, VDD Power supply line
VL1 Boundary (imaginary line)
VP1, VP2 Portion
VS1, VS2 Reference potential line
WP1, WP2, WP3, WP4, WP5, WP6 Wiring path (signal wiring path)

The invention claimed is:
1. A semiconductor device comprising:
an interposer including a first surface over which a plurality of semiconductor components are mounted, a second surface positioned on an opposite side of the first surface, and a plurality of component connection terminals provided in the first surface;
a first semiconductor component including a first main surface, a first side surface crossing the first main surface, and a plurality of first component electrodes provided in the first main surface, the first semiconductor component mounted over the first surface of the interposer, with the first main surface and the first surface of the interposer facing each other; and
a second semiconductor component including a second main surface, a second side surface crossing the second main surface, and a plurality of second component electrodes provided in the second main surface, the second semiconductor component mounted over the first surface of the interposer, with the second main surface and the first surface of the interposer facing each other and the second side surface and the first side surface of the first semiconductor component facing each other,
wherein the interposer includes:
in plan view, a plurality of first signal wires each having an end at a position overlapping with the first semiconductor component and extending in a direction apart from the second semiconductor component;
in plan view, a plurality of second signal wires each having an end at a position overlapping with the first semiconductor component and extending in a direction toward the second semiconductor component;
in plan view, a plurality of third signal wires each having an end at a position overlapping with the second semiconductor component and extending in a direction apart from the first semiconductor component;
a plurality of fourth signal wires electrically connecting the plurality of first signal wires and the plurality of second signal wires, respectively;
a plurality of first signal wiring paths electrically connecting the first semiconductor component and the second semiconductor component via the plurality of first signal wires, the plurality of third signal wires, and the plurality of fourth signal wires, respectively; and
a plurality of second signal wiring paths electrically connecting the first semiconductor component and the second semiconductor component, not via the plurality of first signal wires, the plurality of third signal wires, and the plurality of fourth signal wires, but via the plurality of second signal wires, respectively,
wherein the plurality of first component electrodes of the first semiconductor component include:
a plurality of signal first electrodes connected to the plurality of first signal wiring paths, respectively; and
a plurality of signal second electrodes connected to the plurality of second signal wiring paths, respectively,
wherein the plurality of second component electrodes of the second semiconductor component include:
a plurality of signal third electrodes connected to the plurality of signal first electrodes of the first semiconductor component via the plurality of first signal wiring paths, respectively; and a plurality of signal fourth electrodes connected to the plurality of signal second electrodes via the plurality of second signal wiring paths, respectively, wherein the plurality of signal first electrodes of the first semiconductor component include:
- a first electrode, a second electrode, and a third electrode arranged in a first direction apart from the first side surface in plan view, wherein the plurality of signal third electrodes of the second semiconductor component include:
- a fourth electrode, a fifth electrode, and a sixth electrode arranged in the first direction toward the second side surface in plan view, and wherein the first electrode of the first semiconductor component is electrically connected with the fourth electrode of the second semiconductor component, the second electrode of the first semiconductor component is electrically connected with the fifth electrode of the second semiconductor component, the third electrode of the first semiconductor component is electrically connected with the sixth electrode of the second semiconductor component.

2. The semiconductor device according to claim 1,
wherein each of the plurality of fourth signal wires is formed in a wiring layer different from a wiring layer in which each of the plurality of first signal wires, the plurality of second signal wires, and the plurality of third signal wires is formed.

3. The semiconductor device according to claim 2,
wherein the interposer includes:
- a core insulation layer including a third surface positioned between the first surface and the second surface, a fourth surface positioned on an opposite side of the third surface and provided between the third surface and the second surface, and a plurality of through-hole wirings penetrating from one to the other of the third surface and the fourth surface, wherein the plurality of through-hole wirings include:
- a first through-hole wiring, a second through-hole wiring, and a third through-hole wiring arranged in the first direction apart from the first side surface of the first semiconductor component; and
- a fourth through-hole wiring, a fifth through-hole wiring, and a sixth through-hole wiring arranged in the first direction toward the second side surface of the second semiconductor component, and wherein the first electrode of the first semiconductor component is electrically connected with the fourth electrode of the second semiconductor component, via the first through-hole wiring and the fourth through-hole wiring, the second electrode of the first semiconductor component is electrically connected with the fifth electrode of the second semiconductor component, via the second through-hole wiring and the fifth through-hole wiring, and the third electrode of the first semiconductor component is electrically connected with the sixth electrode of the second semiconductor component, via the third through-hole wiring and the sixth through-hole wiring.

4. The semiconductor device according to claim 3,
wherein the interposer includes:
- a plurality of first surface side wiring layers provided between the first surface and the core insulation layer; and
- a plurality of second surface side wiring layers provided between the second surface and the core insulation layer, wherein each of the plurality of first signal wires, the plurality of second signal wires, and the plurality of third signal wires is formed in any of the plurality of first surface side wiring layers, and wherein each of the plurality of fourth signal wires is formed in any of the plurality of second surface side wiring layers.

5. The semiconductor device according to claim 3,
wherein the plurality of second signal wiring paths are not connected to the plurality of through-hole wirings, respectively.

6. The semiconductor device according to claim 1,
wherein the plurality of signal second electrodes of the first semiconductor component include:
- a seventh electrode, an eighth electrode, and a ninth electrode arranged in the first direction apart from the first side surface in plan view, wherein the plurality of signal fourth electrodes of the second semiconductor component include:
- a tenth electrode, an eleventh electrode, and a twelfth electrode arranged in a second direction apart from the second side surface in plan view, and wherein the seventh electrode of the first semiconductor component is electrically connected to the tenth electrode of the second semiconductor component, the eighth electrode of the first semiconductor component is electrically connected to the eleventh electrode of the second semiconductor component, and the ninth electrode of the first semiconductor component is electrically connected to the twelfth electrode of the second semiconductor component.

7. The semiconductor device according to claim 1,
wherein the plurality of first signal wires include:
- a plurality of first wires arranged in a first wiring layer of the interposer; and
- a plurality of second wires arranged in a second wiring layer positioned closer to the second surface of the interposer than the first wiring layer, wherein the plurality of third signal wires include:
- a plurality of third wires arranged in the first wiring layer; and
- a plurality of fourth wires arranged in the second wiring layer, wherein the plurality of first signal wiring paths include:
- a plurality of first wiring paths electrically connecting the first semiconductor component and the second semiconductor component via the plurality of first wires and the plurality of fourth wires, respectively; and
- a plurality of second wiring paths electrically connecting the first semiconductor component and the second semiconductor component via the plurality of second wires and the plurality of third wires, respectively, wherein the first electrode of the first semiconductor component and the fourth electrode of the second semiconductor component are electrically connected via one of the plurality of first wiring paths and the plurality of second wiring paths, and wherein the third electrode of the first semiconductor component and the sixth electrode of the second semiconductor component are electrically connected via the other of the plurality of first wiring paths and the plurality of second wiring paths.

8. The semiconductor device according to claim 7,
wherein the plurality of fourth signal wires include:
- a plurality of fifth wires arranged in a fifth wiring layer positioned closer to the second surface of the interposer than the second wiring layer; and
- a plurality of sixth wires arranged in a sixth wiring layer positioned closer to the second surface of the interposer than the fifth wiring layer, and wherein one of the first wiring path and the second wiring path includes the plurality of fifth wires, and the other of the first wiring path and the second wiring path includes the plurality of sixth wires.

9. The semiconductor device according to claim 8,
wherein a plurality of via wirings respectively connected to the plurality of sixth wires of the sixth wiring layer are formed in the fifth wiring layer, and
wherein the plurality of via wirings are arranged between adjacent two wires of the plurality of fifth wires, along an extending direction of the two wires.

10. The semiconductor device according to claim 8,
wherein the fifth wiring layer includes:
- a plurality of first end via wirings to which the plurality of fifth wires are connected at one end; and
- a plurality of second end via wirings to which the plurality of fifth wires are connected at the other end, wherein the sixth wiring layer includes:
- a plurality of third end via wirings to which the plurality of sixth wires are connected at one end; and
- a plurality of fourth end via wirings to which the plurality of sixth wires are connected at the other end, wherein each of the plurality of first end via wirings, the plurality of second end via wirings, the plurality of third end via wirings, and the plurality of fourth end via wirings includes a first portion and a second portion facing each other across a first imaginary line,
wherein the first portion and the second portion are sequentially arranged in a third direction, of the third direction orthogonal to the first direction and a fourth direction opposite to the third direction,
wherein each of the plurality of fifth wires is connected at one end to the first portion of each of the plurality of first end via wirings,
wherein each of the plurality of fifth wires is connected at the other end to the second portion of each of the plurality of second end via wirings,
wherein each of the plurality of sixth wires is connected at one end to the first portion of each of the plurality of third end via wirings, and
wherein each of the plurality of sixth wires is connected at the other end to the second portion of each of the plurality of fourth end via wirings.

11. The semiconductor device according to claim 7,
wherein the interposer includes:
- a core insulation layer including a third surface positioned between the first surface and the second surface, a fourth surface positioned on an opposite side of the third surface and provided between the third surface and the second surface, and a plurality of through-hole wirings penetrating from one to the other of the third surface and the fourth surface, wherein the plurality of through-hole wirings include:
- a first through-hole wiring, a second through-hole wiring, and a third through-hole wiring arranged in the first direction apart from the first side surface of the first semiconductor component; and
- a fourth through-hole wiring, a fifth through-hole wiring, and a sixth through-hole wiring arranged in the first direction toward the second side surface of the second semiconductor component, and wherein the first electrode of the first semiconductor component is electrically connected with the fourth electrode of the second semiconductor component, via the first through-hole wiring and the fourth through-hole wiring, the second electrode of the first semiconductor component is electrically connected with the fifth electrode of the second semiconductor component, via the second through-hole wiring and the fifth through-hole wiring, and the third electrode of the first semiconductor component is electrically connected with the sixth electrode of the second semiconductor component, via the third through-hole wiring and the sixth through-hole wiring.

12. The semiconductor device according to claim 7,
wherein the plurality of second signal wires include:
- a plurality of seventh wires arranged in the first wiring layer; and
- a plurality of eighth wires arranged in the second wiring layer, wherein the plurality of second signal wiring paths include:
- a plurality of third wiring paths electrically connecting the first semiconductor component and the second semiconductor component via the plurality of seventh wires; and
- a plurality of fourth wiring paths electrically connecting the first semiconductor component and the second semiconductor component via the plurality of eighth wires, wherein the plurality of signal second electrodes of the first semiconductor component include:
- a seventh electrode, an eighth electrode, and a ninth electrode arranged in the first direction apart from the first side surface in plan view, wherein the plurality of signal fourth electrodes of the second semiconductor component include:
- a tenth electrode, an eleventh electrode, and a twelfth electrode arranged in the second direction apart from the second side surface in plan view, wherein the seventh electrode of the first semiconductor component is electrically connected to the tenth electrode of the second semiconductor component, via one of the plurality of third wiring paths and the plurality of fourth wiring paths,
wherein the eighth electrode of the first semiconductor component is electrically connected to the eleventh electrode of the second semiconductor component, via any of the plurality of third wiring paths and the plurality of fourth wiring paths, and
wherein the ninth electrode of the first semiconductor component is electrically connected to the twelfth electrode of the second semiconductor component, via the other of the plurality of third wiring paths and the plurality of fourth wiring paths.

13. The semiconductor device according to claim 7,
wherein the interposer includes:
- a core insulation layer including a third surface positioned between the first surface and the second surface, a fourth surface positioned on an opposite side of the third surface and provided between the third surface and the second surface, and a plurality of through-hole wirings penetrating from one to the other of the third surface and the fourth surface, and wherein part of the plurality of through-hole wirings overlap with part of the plurality of signal first electrodes and the plurality of signal third electrodes in plan view.

14. The semiconductor device according to claim 1,
wherein the interposer includes a plurality of wiring layers, and a plurality of via wirings electrically connecting the plurality of wiring layers, and
wherein, in plan view, the plurality of via wirings are arranged between adjacent two wires of the plurality of first signal wires, the plurality of third signal wires, and the plurality of fourth signal wires, along an extending direction of the two wires, in a region where the plurality of first signal wires, the plurality of third signal wires, and the plurality of fourth signal wires are provided.

15. The semiconductor device according to claim 2,
wherein the interposer includes a plurality of wiring layers, and a plurality of via wirings electrically connecting the plurality of wiring layers, and
wherein, in each of the plurality of wiring layers, a plurality of first via wirings constituting part of the first signal wiring path, of the plurality of via wirings, are arranged between a plurality of second via wirings supplying reference potential to the first semiconductor component or the second semiconductor component of the plurality of via wirings.

16. The semiconductor device according to claim 1,
wherein the second semiconductor component includes:
a memory circuit,
wherein the first semiconductor component includes:
a control circuit controlling operation of the memory circuit of the second semiconductor component; and
a calculation circuit, and
wherein a first power electrode supplying power supply potential to the first semiconductor component, and a first reference potential electrode supplying reference potential to the first semiconductor component are arranged between the plurality of signal first electrodes and the plurality of signal second electrodes of the first semiconductor component.

17. The semiconductor device according to claim 1, further comprising:
a wiring substrate including a third surface, a fourth surface positioned on an opposite side of the third surface, a plurality of interposer connection terminals provided in the third surface, and a plurality of external terminals provided in the fourth surface,
wherein the interposer is mounted over the third surface of the wiring substrate, with the second surface and the third surface of the wiring substrate facing each other.

18. A semiconductor device comprising:
an interposer including a first surface over which a plurality of semiconductor components are mounted, a second surface positioned on an opposite side of the first surface, and a plurality of component connection terminals provided in the first surface;
a first semiconductor component including a first main surface, a first side surface crossing the first main surface, and a plurality of first component electrodes provided in the first main surface, the first semiconductor component mounted over the first surface of the interposer, with the first main surface and the first surface of the interposer facing each other; and
a second semiconductor component including a second main surface, a second side surface crossing the second main surface, and a plurality of second component electrodes provided in the second main surface, the second semiconductor component mounted over the first surface of the interposer, with the second main surface and the first surface of the interposer facing each other, and the second side surface and the first side surface of the first semiconductor component facing each other,
wherein the interposer includes:
a core insulation layer including a third surface positioned between the first surface and the second surface, a fourth surface positioned on an opposite side of the third surface and provided between the third surface and the second surface, and a plurality of through-hole wirings penetrating from one to the other of the third surface and the fourth surface;
a plurality of first surface side wiring layers provided between the first surface and the core insulation layer;
a plurality of second surface side wiring layers provided between the second surface and the core insulation layer;
a plurality of first signal wiring paths electrically connecting the first semiconductor component and the second semiconductor component via the plurality of through-hole wirings; and
a plurality of second signal wiring paths electrically connecting the first semiconductor component and the second semiconductor component, not via the plurality of through-hole wirings,
wherein the plurality of first component electrodes of the first semiconductor component include:
a plurality of signal first electrodes connected to the plurality of first signal wiring paths, respectively; and
a plurality of signal second electrodes connected to the plurality of second signal wiring paths, respectively,
wherein the plurality of second component electrodes of the second semiconductor component include:
a plurality of signal third electrodes connected to the plurality of signal first electrodes of the first semiconductor component via the plurality of first signal wiring paths, respectively; and
a plurality of signal fourth electrodes connected to the plurality of signal second electrodes via the plurality of second signal wiring paths, respectively,
wherein the plurality of signal first electrodes of the first semiconductor component include:
a first electrode, a second electrode, and a third electrode arranged in a first direction apart from the first side surface in plan view,
wherein the plurality of signal third electrodes of the second semiconductor component include:
a fourth electrode, a fifth electrode, and a sixth electrode arranged in a second direction apart from the second side surface in plan view, and
wherein the first electrode of the first semiconductor component is electrically connected with the sixth electrode of the second semiconductor component, the second electrode of the first semiconductor component is electrically connected with the fifth electrode of the second semiconductor component, and the third electrode of the first semiconductor component is electrically connected with the fourth electrode of the second semiconductor component.

* * * * *